United States Patent
Choi et al.

(10) Patent No.: US 12,550,316 B2
(45) Date of Patent: Feb. 10, 2026

(54) SEMICONDUCTOR MEMORY DEVICE

(71) Applicant: SAMSUNG ELECTRONICS CO., LTD., Suwon-si (KR)

(72) Inventors: Woo Young Choi, Suwon-si (KR); Hui-Jung Kim, Suwon-si (KR); Ji Hoon Sung, Suwon-si (KR); Ga Eun Choi, Suwon-si (KR); Sang Kyu Sun, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 364 days.

(21) Appl. No.: 18/321,511

(22) Filed: May 22, 2023

(65) Prior Publication Data

US 2024/0064968 A1 Feb. 22, 2024

(30) Foreign Application Priority Data

Aug. 22, 2022 (KR) .................. 10-2022-0104636

(51) Int. Cl.
*G11C 16/04* (2006.01)
*H10B 12/00* (2023.01)

(52) U.S. Cl.
CPC .......... *H10B 12/482* (2023.02); *H10B 12/02* (2023.02); *H10B 12/315* (2023.02); *H10B 12/34* (2023.02); *H10B 12/485* (2023.02)

(58) Field of Classification Search
CPC .... H10B 12/482; H10B 12/485; H10B 12/34; H10B 12/315; H10B 12/02
See application file for complete search history.

(56) References Cited

U.S. PATENT DOCUMENTS

| | | | |
|---|---|---|---|
| 8,048,737 B2 | 11/2011 | Kim et al. | |
| 8,846,472 B2 | 9/2014 | Yi | |
| 9,520,348 B2 | 12/2016 | Choi et al. | |
| 10,453,796 B2 | 10/2019 | Song et al. | |
| 2006/0017118 A1 | 1/2006 | Park et al. | |
| 2010/0301405 A1* | 12/2010 | Oota | H10D 86/201 438/258 |
| 2012/0001272 A1* | 1/2012 | Jang | H10B 12/482 257/E27.06 |

(Continued)

FOREIGN PATENT DOCUMENTS

| | | |
|---|---|---|
| KR | 20060007735 A | 1/2006 |
| KR | 100549014 B1 | 2/2006 |

(Continued)

*Primary Examiner* — Pho M Luu
(74) *Attorney, Agent, or Firm* — Wolf, Greenfield & Sacks, P.C.

(57) ABSTRACT

Provided is a semiconductor memory device comprising an active region extending in a cell isolation layer, wherein the active region includes a first region and a second region; a bit line intersects the active region; a bit line contact between a substrate and the bit line, wherein the bit line contact is electrically connected to the first region; a bit line spacer that is on side surfaces of the bit line and the bit line contact; a node pad on a lateral side of the bit line spacer, wherein the node pad is electrically connected to the second region; a storage contact that is on the node pad and on a side surface of the bit line spacer, wherein the storage contact includes a first part having a first width and a second part having a second width different from the first width.

20 Claims, 43 Drawing Sheets

(56) References Cited

U.S. PATENT DOCUMENTS

| | | | |
|---|---|---|---|
| 2012/0248503 A1* | 10/2012 | Huo | H10D 30/711 |
| | | | 257/E21.409 |
| 2019/0013321 A1 | 1/2019 | Chang et al. | |
| 2019/0189621 A1 | 6/2019 | Chang et al. | |
| 2020/0083224 A1 | 3/2020 | Chang et al. | |
| 2021/0035613 A1 | 2/2021 | Park et al. | |
| 2021/0193668 A1 | 6/2021 | Feng et al. | |
| 2022/0045182 A1 | 2/2022 | Kim et al. | |

FOREIGN PATENT DOCUMENTS

| | | |
|---|---|---|
| KR | 10-2016-0068067 A | 6/2016 |
| TW | 201822343 A | 6/2018 |
| TW | 202147522 A | 12/2021 |
| TW | 202213371 A | 4/2022 |
| TW | 202213723 A | 4/2022 |
| TW | 202220143 A | 5/2022 |
| TW | 202230717 A | 8/2022 |

\* cited by examiner

SEMICONDUCTOR MEMORY DEVICE

CROSS-REFERENCE TO RELATED APPLICATION

This application claims priority to Korean Patent Application No. 10-2022-0104636 filed on Aug. 22, 2022, in the Korean Intellectual Property Office, and all the benefits accruing therefrom under 35 U.S.C. 119, the contents of which in its entirety are herein incorporated by reference.

BACKGROUND

The present disclosure relates to a semiconductor memory device.

As semiconductor devices become more highly integrated, individual circuit patterns may be more miniaturized in order to implement more semiconductor devices in the same area. For example, as the degree of integration of semiconductor devices increases, design rules for components of the semiconductor devices may be reduced.

As a critical dimension (CD) becomes smaller in a highly scaled-down semiconductor device, a variety of studies on new integration techniques are conducted.

SUMMARY

Aspects of the present disclosure are to provide a semiconductor memory device with improved electrical characteristics and reliability.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to some embodiments of the present disclosure, there is provided a semiconductor memory device comprising a substrate; an isolation layer in the substrate; an active region extending in the isolation layer in a first direction, wherein the active region includes a first region and a second region at opposite sides of the first region; a bit line that extends on the substrate in a second direction that intersects with the first direction, wherein the bit line intersects the active region; a bit line contact between the substrate and the bit line, wherein the bit line contact is electrically connected to the first region; bit line spacers comprising a bit line spacer that is on a side surface of the bit line and on a side surface of the bit line contact; a node pad on a lateral side of the bit line spacer on the substrate, wherein the node pad is electrically connected to the second region; and storage contacts comprising a storage contact that is on the node pad and on a side surface of the bit line spacer, wherein the storage contact includes a first part having a first width in a third direction that intersects with the first direction and the second direction and a second part below the first part, relative to a bottom surface of the substrate, and wherein the second part is electrically connected to the node pad and has a second width that is different from the first width in the third direction.

According to some embodiments of the present disclosure, there is provided a semiconductor memory device comprising a substrate; a plurality of active regions in an isolation layer, wherein the plurality of active regions extends in a first direction, and wherein the plurality of active regions each includes a first region and a second region at opposite sides of the first region; a bit line that extends on the substrate in a second direction that intersects with the first direction, wherein the bit line intersects the plurality of active regions; a node pad spaced apart from the bit line in a third direction on the substrate and electrically connected to the second region of the active region, wherein the third direction intersects with the first direction and the second direction; and a storage contact on the node pad and spaced apart from the bit line in the third direction, wherein the storage contact comprises: a first side surface extending in a fourth direction that intersects with the first direction, the second direction, and the third direction, wherein the second direction, the third direction, and the fourth direction perpendicularly intersect each other, and wherein the first direction intersects the third direction at an angle less than 90 degrees, an inclined surface below the first side surface, relative to a bottom surface of the substrate, wherein the inclined surface is bent or curved from the first side surface, and a second side surface below the inclined surface, relative to the bottom surface of the substrate, wherein the second side surface is bent or curved from the inclined surface, and wherein the first side surface and the second side surface do not overlap each other.

According to some embodiments of the present disclosure, there is provided a semiconductor memory device comprising a substrate which includes a plurality of active regions in an isolation layer and extending in a first direction, wherein the plurality of active regions each includes a first region and a second region at opposite sides of the first region; a bit line that extends on the substrate in a second direction that intersects with the first direction, wherein the bit line intersects the plurality of active regions; a bit line contact between the substrate and the bit line, wherein the bit line contact is electrically connected to the first region of the active regions; bit line spacers comprising a bit line spacer that is on a side surface of the bit line and a side surface of the bit line contact; a node pad on a lateral side of the bit line spacer on the substrate, wherein the node pad is electrically connected to the second region of the active region; storage contacts comprising a storage contact, wherein the storage contact is on the node pad and on a side surface of the bit line spacer, electrically connected to the node pad; and a fence pattern between the storage contacts in the second direction and between the bit line spacers in a third direction that intersects with the first direction and the second direction, wherein the storage contact comprises: a first side surface that extends in a fourth direction that intersects with the first direction, the second direction, and the third direction, wherein the second direction, the third direction, and the fourth direction perpendicularly intersect each other, and wherein the first direction intersects the third direction at an angle less than 90 degrees, an inclined surface below the first side surface, relative to a bottom surface of the substrate, wherein the inclined surface is bent or curved from the first side surface, and a second side surface below the inclined surface, relative to the bottom surface of the substrate, wherein the second side surface is bent or curved from the inclined surface, wherein the first side surface and the second side surface do not overlap each other, wherein each of the storage contact and the node pad includes a metal material, and wherein a bottom surface of the storage contact is linear and a bottom surface of the fence pattern is rounded in a cross-sectional view taken along the second direction.

It should be noted that the effects of the present disclosure are not limited to those described above, and other effects of the present disclosure will be apparent from the following description.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION

Hereinafter, example embodiments of the present disclosure will be described with reference to the accompanying drawings.

Figure 1:
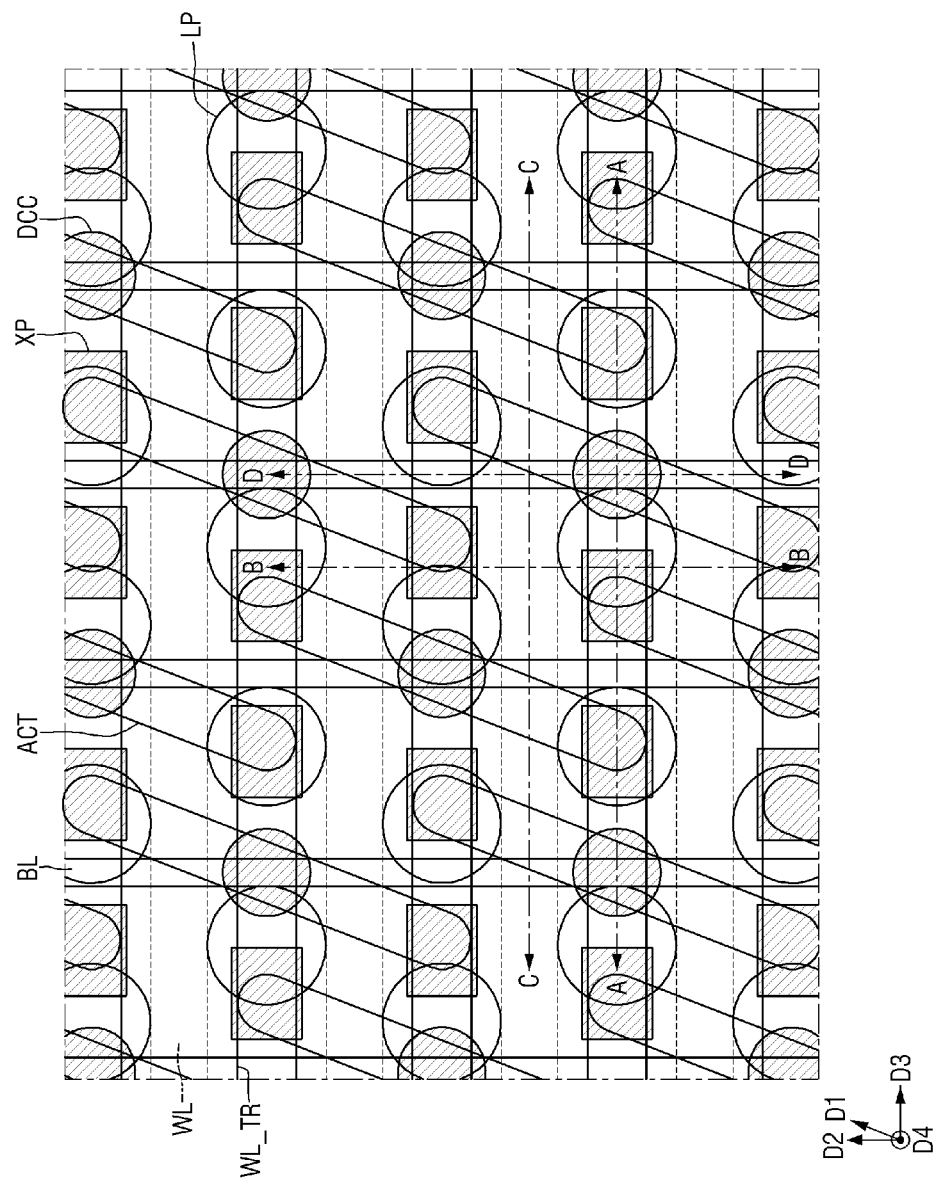
FIG. 1 is a schematic plan view of a semiconductor memory device according to some embodiments.
Figure 2:
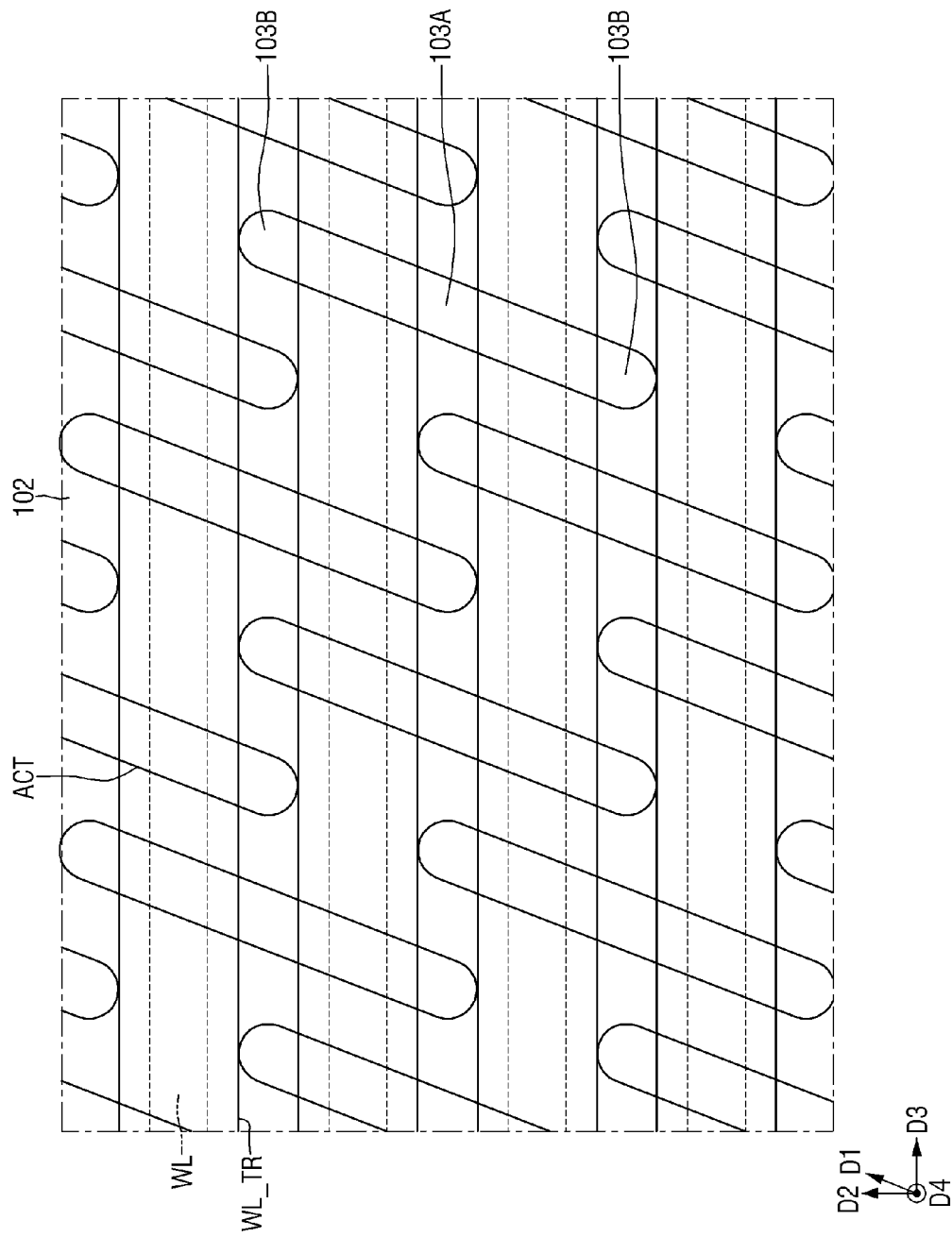
FIG. 2 is a plan view of only word lines and active regions of FIG. 1.
Figure 3:
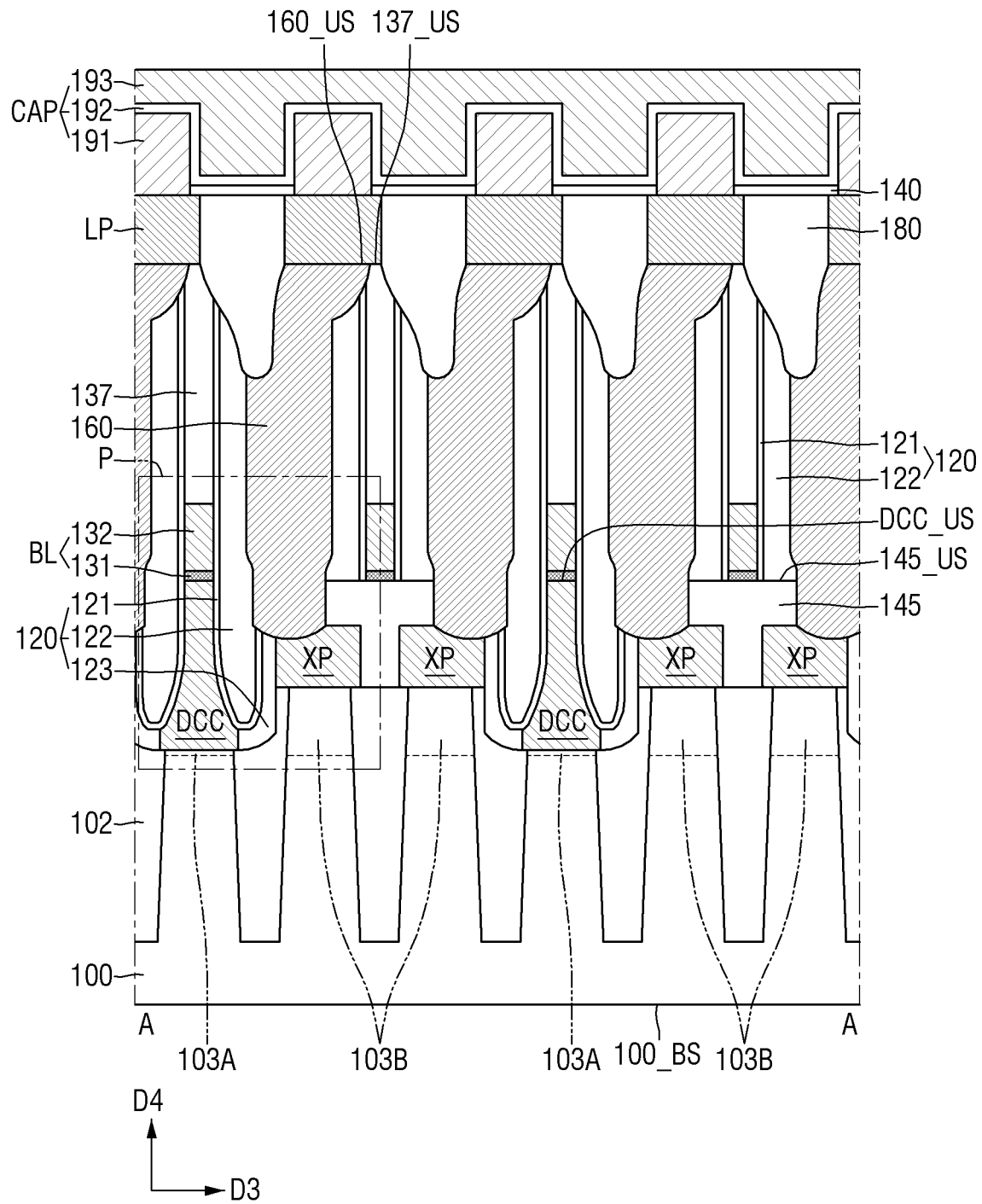
FIG. 3 is a cross-sectional view taken along line A-A of FIG. 1.
Figure 4:
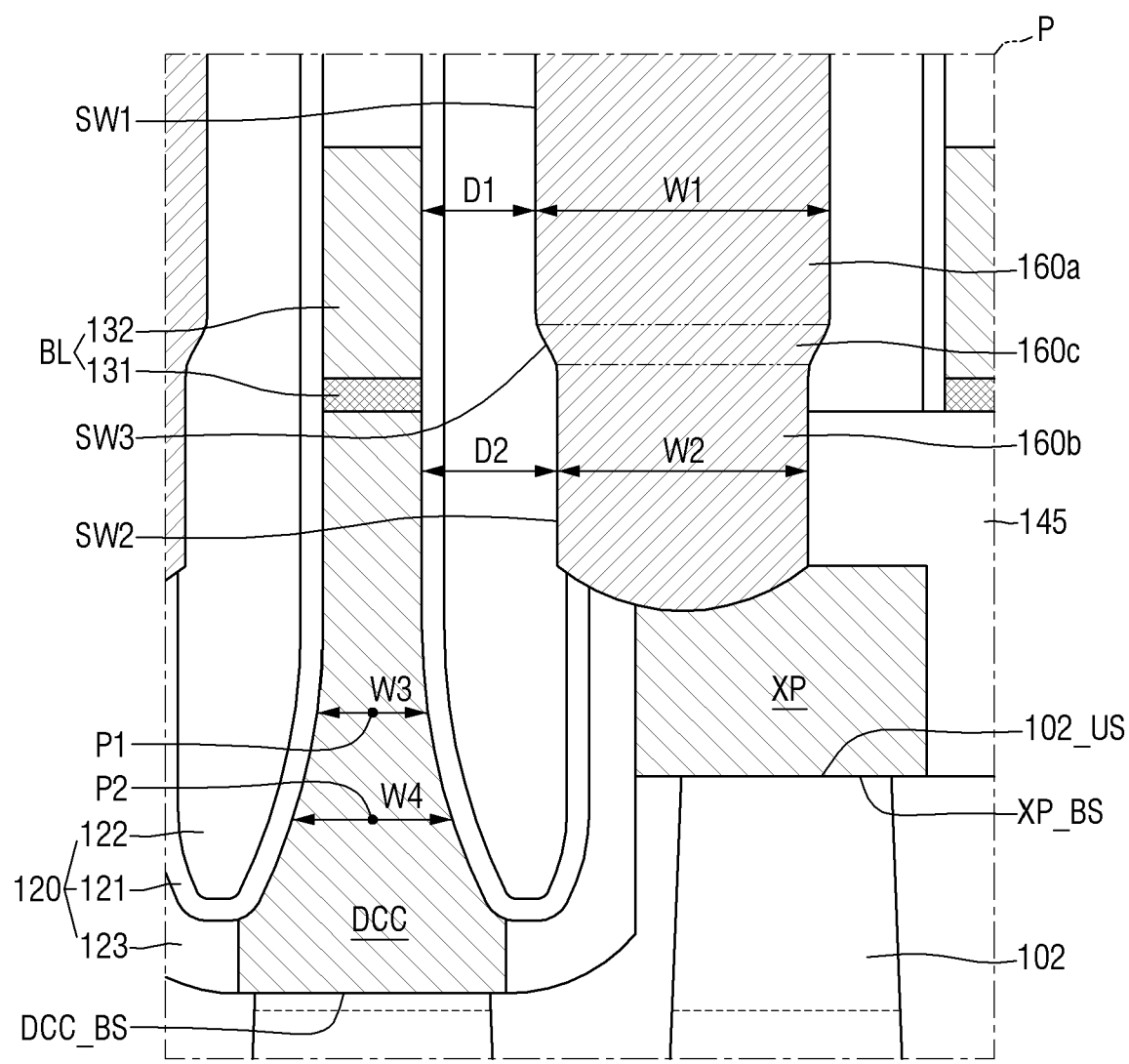
FIG. 4 is an enlarged view of portion P of FIG. 3.
Figure 5:
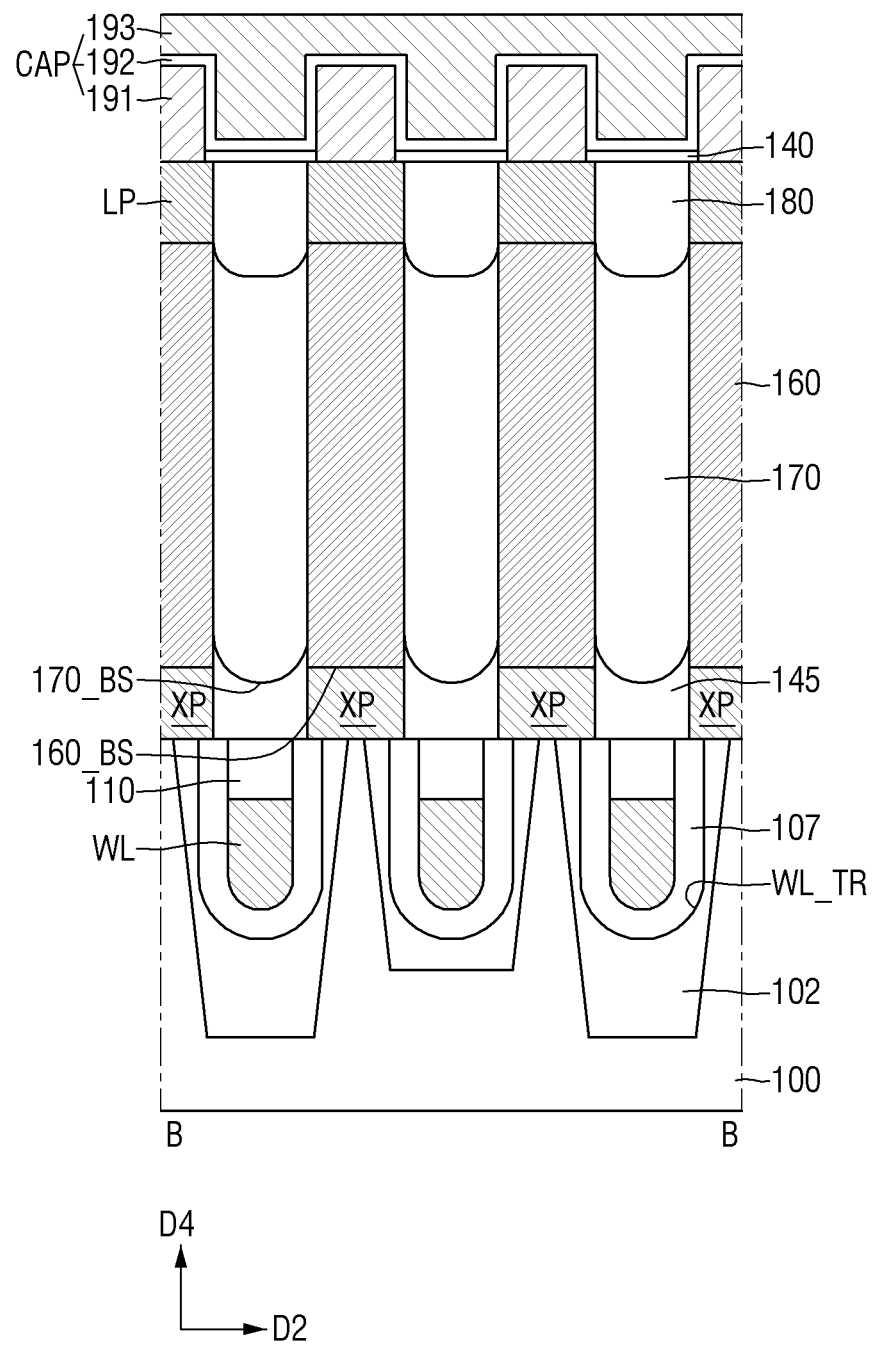
FIGS. 5 to 7 are cross-sectional views taken along lines B-B, C-C, and D-D of FIG. 1, respectively.
Figure 6:
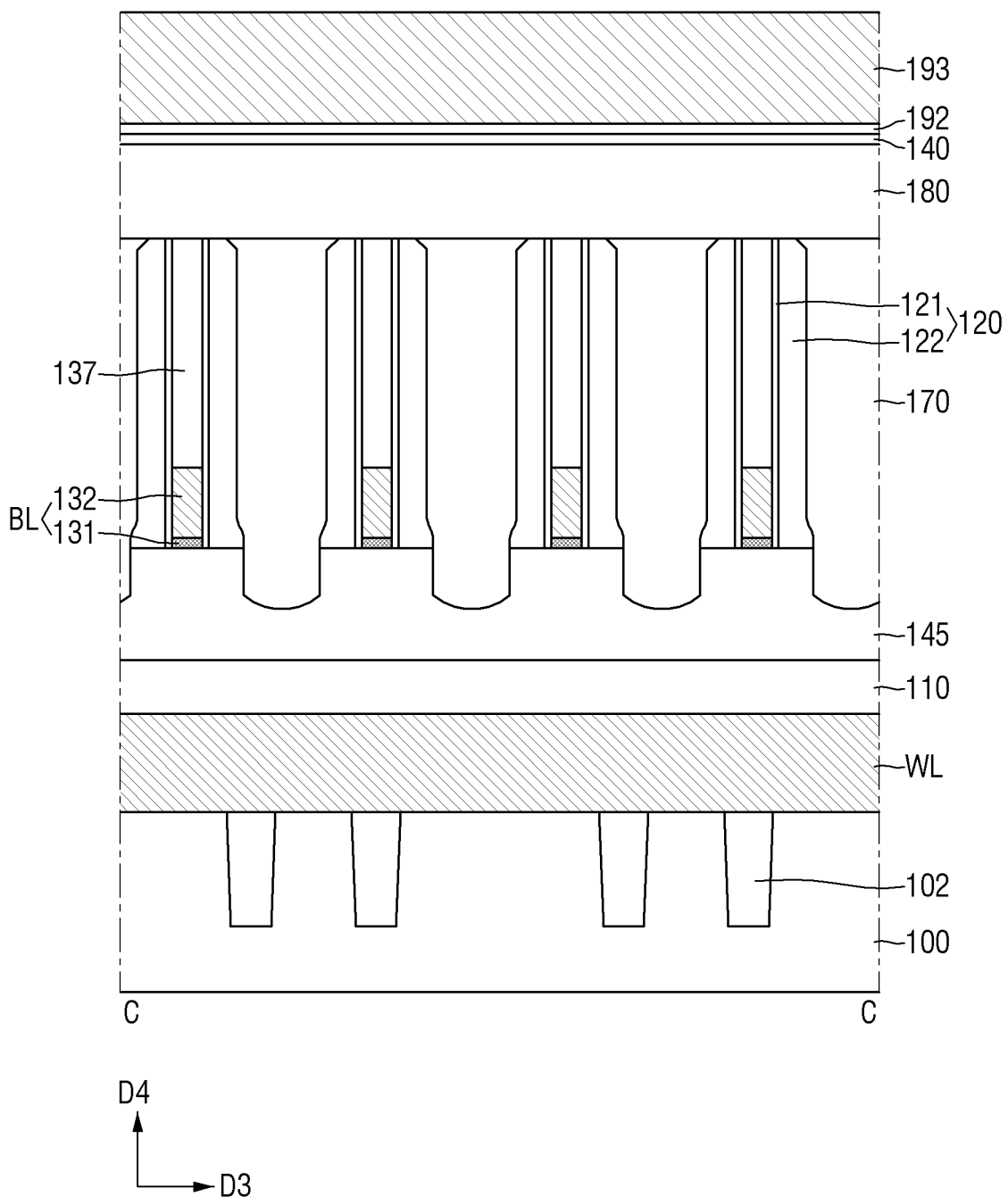
Figure 7:
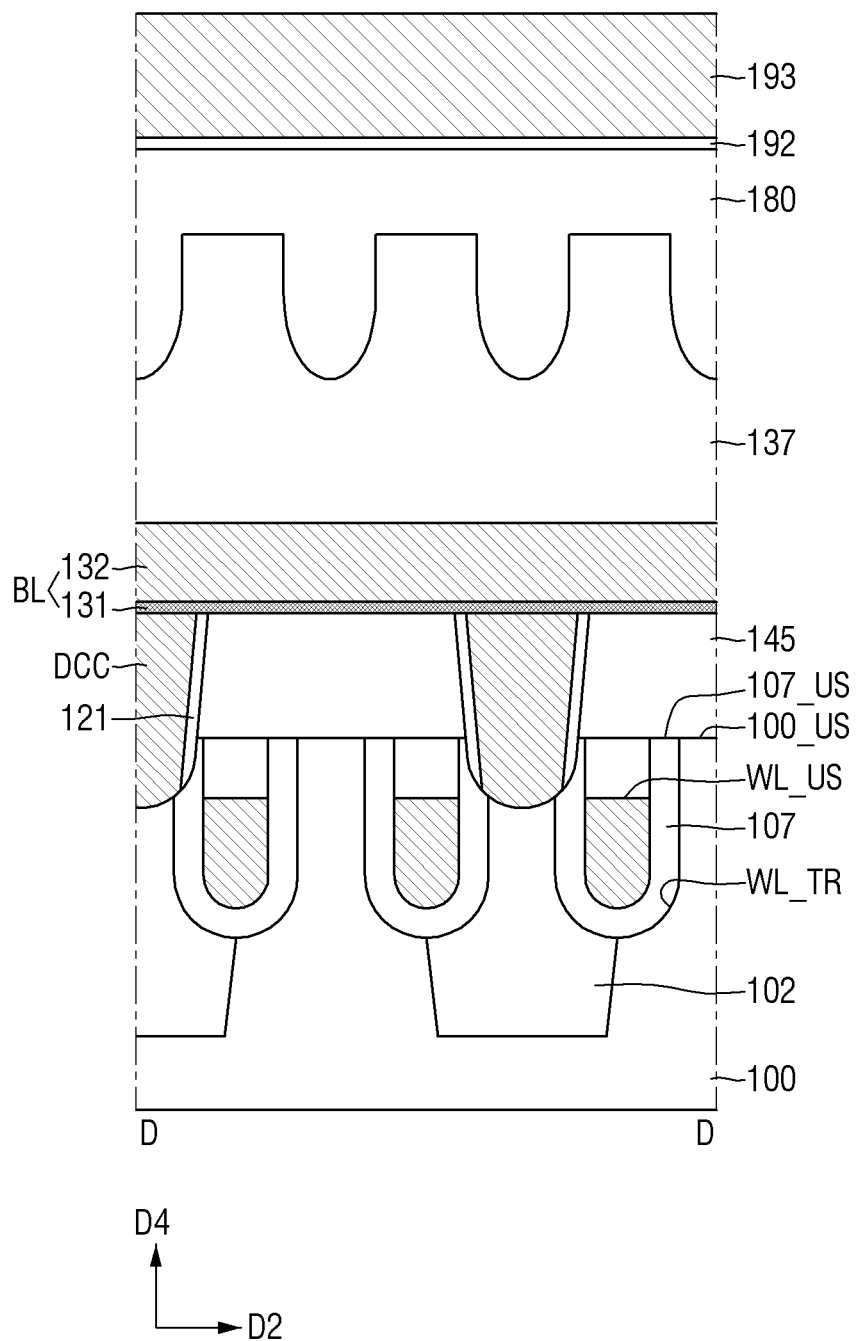

FIG. 1 is a schematic plan view of a semiconductor memory device according to some embodiments. FIG. 2 is a plan view of only word lines and active regions of FIG. 1. FIG. 3 is a cross-sectional view taken along line A-A of FIG. 1. FIG. 4 is an enlarged view of portion P of FIG. 3. FIGS. 5 to 7 are cross-sectional views taken along lines B-B, C-C, and D-D of FIG. 1, respectively.

In the drawings of the semiconductor device according to the embodiments, a dynamic random access memory (DRAM) is illustrated by way of example, but the embodiments of the present disclosure may not be limited thereto.

Referring to FIGS. 1 to 3, the semiconductor memory device according to the embodiments may include a plurality of cell active regions ACT. The cell active regions ACT may be defined by a cell isolation layer 102 formed in a substrate 100. As design rules of the semiconductor device are reduced, the cell active regions ACT may be disposed in the form of diagonal or oblique bars as illustrated in the drawings. For example, the cell active regions ACT may extend in a first direction D1 in the cell isolation layer 102.

Each of the cell active regions ACT may be a portion of the substrate 100 surrounded by the cell isolation layer 102.

The substrate 100 may include cell active regions ACT defined by the cell isolation layer 102. The cell active regions ACT may extend parallel to each other in the first direction D1. An end of each of the cell active regions ACT may be arranged adjacent to a center of another cell active region adjacent thereto. An end of each of the cell active regions ACT may be adjacent to a center of another cell active region ACT in a third direction D3.

A plurality of gate electrodes may extend in the third direction D3 across the cell active regions ACT. The gate electrodes may extend parallel to each other. The gate electrodes may be, for example, a plurality of word lines WL. The word lines WL may be equally spaced apart from each other in a second direction D2 (e.g., the second direction D2 is perpendicular to the third direction D3). A width of each word line WL or a space between the word lines WL adjacent to each other may be determined according to the design rules. The word line WL may be disposed within a word line trench WL_TR. The word line trench WL_TR may extend in the third direction D3. The word line trench WL_TR may cross the cell active regions ACT.

Each of the cell active regions ACT may be divided into three parts by two word lines WL extending in the third direction D3. For example, each of the cell active regions ACT may be divided into three parts by two word line trenches WL_TR extending in the third direction D3. Each of the cell active regions ACT may include a first region 103A and second regions 103B defined at opposite sides of the first region 103A. The first region 103A of each of the cell active regions ACT may be located in a middle part of the cell active region ACT, and the second regions 103B may be located at opposite ends of each of the cell active regions ACT, respectively. The word line WL may cross between the first region 103A of each of the cell active regions ACT and the second region 103B of each of the cell active regions ACT.

For example, the first region 103A of each of the cell active regions ACT may be a region electrically connected to a bit line BL, and the second region 103B of each of the cell active regions ACT may be a region electrically connected to a capacitor CAP. In other words, the first region 103A of each of the cell active regions ACT may be a common drain region, and the second region 103B of each of the cell active regions ACT may be a source region. Each of the word lines WL and the first region 103A and the second region 103B adjacent to the word line WL may form a transistor.

A plurality of bit lines BL may be disposed on the word lines WL to extend in a second direction D2 orthogonal to the third direction D3 (e.g., orthogonal to the word lines WL). The second direction D2 may intersect the first direction D1. The bit lines BL may be disposed on the substrate 100. Each of the bit lines BL may cross or intersect the cell active regions ACT that extend in the first direction D1. The plurality of bit lines BL may extend parallel to each other. The bit lines BL may be equally spaced apart from each other in the third direction D3. A width of each bit line BL or s space between the bit lines BL adjacent to each other may be determined according to the design rules.

The semiconductor memory device according to the embodiments may include various contact arrays formed on the cell active regions ACT. The various contact arrays may include, for example, bit line contacts DCC, node pads XP, landing pads LP, and the like.

Here, the bit line contacts DCC may electrically connect the cell active regions ACT to the bit lines BL. The node pads XP may electrically connect the cell active regions ACT to lower electrodes 191 of capacitors (e.g., the capacitor CAP). Due to the arrangement structure, contact areas between the node pads XP and the cell active regions ACT may be small. Therefore, the conductive landing pads LP may be introduced to increase the contact areas of the node pads XP with the cell active regions ACT and also to increase the contact areas of the node pads XP with the lower electrodes 191 of the capacitors.

The landing pads LP may be disposed between the node pads XP and the lower electrodes 191 of the capacitors. The increased contact areas by the introduction of the landing pads LP may reduce contact resistance between the cell active regions ACT and the lower electrodes 191 of the capacitors.

The bit line contacts DCC may be electrically connected to the first regions 103A of the cell active regions ACT. The node pad XP may be electrically connected to the second region 103B of the cell active region ACT. Since the node pads XP may be disposed at opposite ends of each cell active region ACT (e.g., at the second region 103B of the cell active region ACT), the landing pads LP may be disposed adjacent to opposite ends of each cell active region ACT (e.g., the second region 103B of the cell active region ACT) so as to partially overlap the node pads XP in the plan view. For example, the node pads XP may be formed to overlap a portion (e.g., the second region 103B of the cell active region ACT) of the cell active regions ACT and a portion of the cell isolation layer 102 disposed between adjacent word lines WL and between adjacent bit lines BL.

The word lines WL may be in the substrate 100. In some embodiments, the word lines WL may be buried in the substrate 100. The word lines WL may cross the cell active regions ACT located between the bit line contacts DCC or the node pads XP. As illustrated, two word lines WL may extend in the second direction D2 to cross or overlap one cell active region ACT. Since the cell active regions ACT extend in the first direction D1, the word lines WL may be at a diagonal angle (e.g., an angle of less or more than 90 degrees) to the cell active regions ACT. For example, the second direction D2 and the third direction D3 may perpendicularly intersect each other, and the first direction D1 may intersect the third direction D3 at an angle less than 90 degrees.

The bit line contacts DCC may be arranged in line along the second direction D2 and the third direction D3. The node pads XP may be disposed at opposite sides of each bit line contact DCC in the third direction D3. The node pads XP may be arranged along the second direction D2 and the third direction D3. The node pads XP may be arranged in line along the third direction D3. The node pads XP arranged in the second direction D2 may be disposed in a zigzag manner between the bit lines BL adjacent to each other in the third direction D3. The landing pads LP may be arranged in a zigzag manner in the second direction D2 in which the bit lines BL extend. In addition, the landing pads LP may overlap the same side of each bit line BL in the third direction D3 in which the word lines WL extend. For example, each landing pad LP of a first line in the third direction D3 may overlap a first side (left side) of a corresponding bit line BL, and each landing pad LP of a second line in the third direction D3 may overlap a second side (right side) of the corresponding bit line BL opposite to the first side of the corresponding bit line BL.

Referring to FIGS. 1 to 7, the semiconductor memory device according to the embodiments may include a plurality of word lines WL, a plurality of bit lines BL, a plurality of node pads XP, a plurality of bit line contacts DCC, and a capacitor CAP.

The substrate 100 may be a silicon substrate or silicon-on-insulator (SOI). Alternatively, the substrate 100 may include, but not be limited to, silicon germanium, silicon germanium on insulator (SGOI), indium antimonide, lead telluride, indium arsenide, indium phosphide, gallium arsenide, or gallium antimonide.

The cell isolation layer 102 may be formed in the substrate 100. The cell isolation layer 102 may have a shallow trench isolation (STI) structure having superior device isolation characteristics. The cell isolation layer 102 may define the cell active regions ACT in the substrate 100. The cell active regions ACT defined by the cell isolation layer 102 may each be in the shape of a long island having a short axis and a long axis as illustrated in FIG. 1. The cell active regions ACT may each be in the shape of a diagonal line at an angle of less than 90 degrees to the word lines WL formed in the cell isolation layer 102. In addition, the cell active regions ACT may each be in the shape of a diagonal line at an angle of less than 90 degrees to the bit lines BL formed on the cell isolation layer 105.

The cell isolation layer 102 may include, but not be limited to, for example, a silicon oxide layer, a silicon nitride layer, and/or a silicon oxynitride layer. Although the cell isolation layer 102 may be formed as a single insulating layer in FIGS. 3, 5, and 6, this is merely for ease of description, and embodiments may not be limited to this case. For example, the cell isolation layer 102 may be formed of a single insulating layer or a plurality of insulating layers depending on the width of the cell isolation layer 102.

The word lines WL may be disposed in the substrate 100 and the cell isolation layer 102. The word lines WL may be formed across the cell isolation layer 102 and the cell active regions ACT defined by the cell isolation layer 102. The word line WL may be disposed within a word line trench WL_TR formed in the cell isolation layer 102 and the cell active region ACT.

Although not shown, the word line trench WL_TR may be relatively deep in the cell isolation layer 102 and relatively shallow in the cell active regions ACT. A bottom surface of the word line WL may be curved (e.g., convex toward the substrate).

An upper surface of the word line WL_US may be lower than an upper surface of the substrate 100_US, i.e., an upper surface of the cell active region ACT. The upper surface of the word line WL_US may be lower than an upper surface of the cell isolation layer 102_US.

The word line WL may include, for example, metal, a metal alloy, a conductive metal nitride, a conductive metal carbonitride, a conductive metal carbide, a metal silicide, a doped semiconductor material, a conductive metal oxynitride, and/or a conductive metal oxide. The word line WL may include, for example, TiN, TaC, TaN, TiSiN, TaSiN, TaTiN, TiAlN, TaAlN, WN, Ru, TiAl, TiAlC—N, TiAlC, TiC, TaCN, W, Al, Cu, Co, Ti, Ta, Ni, Pt, Ni—Pt, Nb, NbN, NbC, Mo, MoN, MoC, WC, Rh, Pd, Ir, Ag, Au, Zn, V, RuTiN, TiSi, TaSi, NiSi, CoSi, IrOx, RuOx, and/or combinations of the same.

A cell gate insulating layer 107 may extend along sidewalls and a bottom surface of the word line trench WL_TR. The cell gate insulating layer 107 may extend along the profile of at least a part of the word line trench WL_TR. The word lines WL may be formed on the cell gate insulating layer 107. The cell gate insulating layer 107 may include, for example, silicon oxide, silicon nitride, silicon oxynitride, and/or a high dielectric constant (high-k) material having a higher dielectric constant than silicon oxide. The high-k material may include, for example, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and/or combinations of the same.

The cell gate insulating layer 107 may extend up to the upper surface of the substrate 100_US. An upper surface of the cell gate 107_US insulating layer may be coplanar with the upper surface of the cell isolation layer 102_US. However, the present disclosure may not be limited thereto.

A word line capping pattern 110 may be disposed on the word line WL. The word line capping pattern 110 may be in the shape of a line extending in the third direction D3 along the upper surface of the word line WL_US. The word line capping pattern 110 may entirely cover an upper surface of the word line WL_US. The word line capping pattern 110 may fill the other part of the word line trench WL_TR excluding the part in which the word line WL is formed. Although the cell gate insulating layer 107 is illustrated as extending along sidewalls of the word line capping pattern 110, embodiments of the present disclosure may not be limited to this case. The word line capping pattern 110 may include, for example, silicon nitride (SiN), silicon oxynitride (SiON), silicon oxide (SiO$_2$), silicon carbonitride (SiCN), silicon oxycarbonitride (SiOCN), and/or combinations of the same.

The bit line BL may be disposed on the substrate 100. The bit line BL may cross (overlap) the word line capping pattern 110 and the word line WL. The bit line BL may include a lower conductive line 131 and an upper conductive line 132 on the lower conductive line 131. The lower conductive line 131 and the upper conductive line 132 may each extend in the second direction D2.

The lower conductive line 131 may include, for example, titanium (Ti), titanium nitride (TiN), titanium silicon nitride (TiSiN), tantalum (Ta), tantalum nitride (TaN), tungsten nitride (WN), graphene, and/or metal silicide. The upper conductive line 132 may include, for example, tungsten (W), aluminum (Al), copper (Cu), ruthenium (Ru), rhodium (Rh), iridium (Ir), molybdenum (Mo), RuAl, NiAl, NbB$_2$, MoB$_2$, TaB$_2$, V$_2$AlC, and/or CrAlC. In one example, the upper conductive line 132 may include tungsten. In this case, the bit line BL may include a tungsten line. In another example, the upper conductive line 132 may include ruthenium (Ru). In this case, the bit line BL may include a ruthenium line.

The bit line capping layer 137 may be disposed on the bit line BL. The bit line capping layer 137 may extend along the upper surface of the bit line BL in the second direction D2. The bit line capping layer 137 may include, for example, a silicon nitride layer, silicon oxynitride, silicon carbonitride, and/or silicon oxycarbonitride. In the semiconductor memory device according to the embodiments, the bit line capping layer 137 may include, for example, a silicon nitride layer. The bit line capping layer 137 is illustrated as a single layer, but embodiments may not be limited to this case.

The bit line contact DCC may be disposed between the substrate 100 and the bit line BL. The bit line contact DCC may be disposed between the first region 103A of the cell active region ACT and the bit line BL. The bit line contact DCC may electrically connect the first region 103A of the cell active region ACT to the bit line BL.

Referring to FIG. 1, as seen in a plan view, the bit line contact DCC may have a circular shape or an elliptical shape. A plan area of the bit line contact DCC may be greater than an overlapping area of the first region 103A of the cell active region ACT and one bit line BL. The plan area of the bit line contact DCC may be greater than a plan area of the first region 103A of one cell active region ACT.

A width of the bit line contact DCC may gradually increase away from the bit line BL. That is, the bit line contact DCC may gradually increase in width from top to bottom, relative to the bottom surface of the substrate 100. For example, with respect to a bottom surface of the substrate 100_BS, the bit line contact DCC may have a third width W3 at a first point P1. With respect to the bottom surface of the substrate 100_BS, the bit line contact DCC may have a fourth width W4 at a second point P2 that is lower than the first point P1. Here, the third width W3 may be less than the fourth width W4.

The node pad XP may be disposed on the substrate 100. The node pad XP may be disposed on the second region 103B of the cell active region ACT. The node pad XP may be electrically connected to the second region 103B of the cell active region ACT. The node pad XP may have a shape of (or a shape similar to) a rectangle when viewed in a plan view. However, the shape of the node pad XP may not be limited to a rectangle.

The node pad XP may be disposed between the word lines WL spaced apart from each other in the second direction D2. The node pad XP may be disposed between the bit lines BL spaced apart from each other in the third direction D3.

A bottom surface of the node pad XP_BS may be in contact with the cell active region ACT and the cell isolation layer 102. The bottom surface of the node pad XP_BS may be in contact with the upper surface of the cell isolation layer 102_US.

With respect to the upper surface of the cell isolation layer 102_US, the upper surface of the node pad XP_US may be lower than an upper surface of the bit line contact DCC_US. With respect to the upper surface of the cell isolation layer 102_US, the upper surface of the node pad XP_US may be lower than a bottom surface of the bit line BL.

With respect to the bottom surface of the substrate 100_BS, the bottom surface of the node pad XP_BS may be disposed higher than the bottom surface of the bit line contact DCC_BS. The bottom surface of the bit line contact DCC_BS may be disposed below the bottom surface of the node pad XP_BS.

The node pad XP may include, for example, a semiconductor material doped with impurities, a conductive metal nitride, metal, and/or a metal alloy. The node pad XP may not include silicide.

A bit line spacer 120 may include a spacer liner 121, a first spacer 122, and a second spacer 123. The node pad XP may be on a lateral side of the bit line spacer 120 on the substrate 100.

The spacer liner 121 may extend along the bit line contact DCC, the bit line BL, and a side surface of the bit line capping layer 137. The spacer liner 121 may have a curved shape. The first spacer 122 may be disposed on the spacer liner 121. The first spacer 122 may fill the space at least partially formed by the curved spacer liner 121. The second spacer 123 may be disposed on (e.g., below) the spacer liner 121 and the first spacer 122. The second spacer 123 may be disposed on a lateral portion of the bit line contact DCC.

A pad separation pattern 145 may be disposed below the bit line BL. The bit line spacer 120 on the pad separation 145 that is disposed below the bit line BL may include the spacer liner 121 and the first spacer 122 sequentially disposed on sidewalls of the bit line BL and the bit line capping layer 137. The spacer liner 121 and the first spacer 122 may be disposed on the sidewalls of the bit line BL and the bit line capping layer 137 on the pad separation pattern 145.

The bit line contact DCC may be disposed below the bit line BL. The bit line spacer 120 on the bit line contact DCC that is disposed below the bit line BL may include the spacer liner 121, the first spacer 122, and the second spacer 123 that are sequentially disposed on sidewalls of the bit line contact DCC, the bit line BL, and the bit line capping layer 137. The spacer liner 121, the first spacer 122, and the second spacer 123 may extend along the side surface of the bit line contact DCC. The spacer liner 121, the first spacer 122, and the second spacer 123 may extend downward further than the bottom surface of the node pad XP_BS.

In one example embodiment, the spacer liner 121, the first spacer 122, and the second spacer 123 may include the same material, for example, silicon oxide. Alternatively, the spacer liner 121 may include a material having etch selectivity with respect to the first spacer 122. In this case, the spacer liner 121 may include a different material from the first spacer 122. For example, the spacer liner 121 may include silicon nitride and the first spacer 122 may include silicon oxide. However, the embodiments of materials for the spacer liner 121 and the first spacer 122 may not be limited to this case. The second spacer 123 may include a material having etch selectivity with respect to (e.g., a different material from) the first spacer 122, for example, silicon nitride.

The spacer liner 121 may include silicon oxide. Since the dielectric constant of silicon oxide is lower than that of silicon nitride, the ratio of silicon nitride in the bit line spacer 120 decreases, and as the ratio of silicon oxide increases, the insulating property of the bit line spacer 120 may increase. Since the spacer liner 121 includes silicon oxide, interference between the bit line BL and a storage contact 160 may be reduced. Accordingly, the reliability of the semiconductor memory device may be improved. The spacer line 121 is illustrated as a single layer. However, this is merely for ease of description, and embodiments may not be limited to this case.

The bit line spacer 120 may include a curved portion between the storage contacts 160 (e.g., a curved portion defined by the storage contacts 160). The bit line spacer 120 may extend along a side surface of the storage contact 160. The bit line spacer 120 may extend along a first side surface SW1, a second side surface SW2, and an inclined surface SW3 of the storage contact 160. (See FIG. 4). The side surface of the bit line spacer 120 may be in contact with the first side surface SW1, the second side surface SW2, and the inclined surface SW3 of the storage contact 160.

The bit line contact DCC may be on, overlap, or cover a portion of an upper surface of the cell active region ACT. The bit line contact DCC may be on, overlap, or cover the first region 103A of the cell active region ACT. The node pad XP may be on, overlap, or cover a portion of the upper surface of the cell active region ACT. The node pad XP may be on, overlap, or cover the second region 103B of the cell active region ACT. A plurality of node pads XP may be electrically connected to the second regions 103B of the adjacent cell active regions in the third direction D3. The node pad XP may be spaced apart from the bit line contact DCC in the third direction D3. The node pad XP may be spaced apart from the bit line BL in the third direction D3.

The pad separation pattern 145 may be disposed between adjacent node pads XP. The pad separation pattern 145 may be disposed on the substrate 100. The pad separation pattern 145 may separate the plurality of node pads XP from each other in the third direction D3. The pad separation pattern 145 may be on, overlap, or cover a portion of an upper surface of the node pad XP.

The pad separation pattern 145 may be disposed below the bit line BL. The pad separation pattern 145 may be in contact with the bit line spacer 120 and the storage contact 160. The pad separation pattern 145 may be in contact with the bottom surface of the bit line BL.

An upper surface of the pad separation pattern 145_US may be coplanar with the upper surface of the bit line contact DCC_US. With respect to the upper surface of the cell isolation layer 102_US, the upper surface of the pad separation pattern 145_US may be located at the same height as the upper surface of the bit line contact DCC_US. With respect to the upper surface of the cell isolation layer 102_US, the upper surface of the pad separation pattern 145_US may be located at the same height as the bottom surface of the bit line BL.

The pad separation pattern 145 may include, for example, silicon nitride, but not limited thereto, as an insulating material. The bottom surface of the pad separation pattern 145 may be located at the same height as the upper surface of the cell isolation layer 102_US, but embodiments may not be limited to this case. The bottom surface of the pad separation pattern 145_BS may be lower than the upper surface of the cell isolation layer 102_US.

The storage contact 160 may be disposed between adjacent fence patterns 170 in the second direction D2. The storage contact 160 may be disposed between the adjacent bit lines BL in the third direction D3. The storage contact 160 may be disposed between the adjacent bit line spacers 120 in the third direction D3. The storage contact 160 may be disposed on the node pad XP. The storage contact 160 (e.g., the second part 160b) may be electrically connected to the node pad XP. The storage contact 160 may be spaced apart from the bit line BL in the third direction D3.

In a cross-sectional view taken along the third direction D3, the bottom surface of the storage contact 160 may have a curved shape. For example, referring to FIGS. 3 and 4, the bottom surface of the storage contact 160 may have a rounded shape (e.g., convex shape toward the substrate 100 in a cross-sectional view taken along the second direction D2).

In a cross-sectional view taken along the second direction D2, the bottom surface of the storage contact 160 may have a planar or linear shape. For example, referring to FIG. 5, the bottom surface of the storage contact 160 may have a linear or flat shape. That is, a bottom surface of the storage contact 160_BS may extend linearly or uniformly in the second direction D2.

A width of the storage contact 160 may not be uniform. Specifically, in a cross-sectional view taken along the third direction D3, the width of the storage contact 160 may not be uniform. The width of the storage contact 160 may not be uniform between the adjacent bit lines BL. The width of the storage contact 160 may not be uniform between the bit line spacers 120. For example, referring to FIG. 3, the width in the third direction D3 of the storage contact 160 may not be uniform between the bit lines BL and the bit line spacers 120. The storage contact 160 may have upper and lower portions with different widths in the third direction D3.

On the other hand, in a cross-sectional view taken along the second direction D2, the width of the storage contact 160 may be uniform. The width of the storage contact 160 may be uniform between the fence patterns 170. The side surface of the storage contact 160 extending along the fence pattern 170 may not be curved and may extend linearly in a fourth direction D4. The fourth direction D4 may intersect the first direction D1, the second direction D2, and the third direction De. The second direction D2, the third direction D3, and the fourth direction D4 may perpendicularly intersect each other, and the first direction D1 may intersect the third direction D3 at an angle less than 90 degrees. For example, referring to FIG. 5, the storage contact 160 may have a uniform width in the second direction D2 between the fence patterns 170.

Specifically, referring to FIGS. 3 and 4, the storage contact 160 may include a first part 160a, a second part 160b, and an inclined part 160c. The first part 160a may be disposed higher on the second part 160b and the inclined part 160c relative to a bottom surface of the substrate 100. The first part 160a may have a first width W1. The first part 160a may extend in the fourth direction D4 at the uniform first width W1. The storage contact 160 (e.g., the second part 160b) may be electrically connected to the node pad XP.

The second part 160b may be disposed below the first part 160a and the inclined part 160c. The second part 160b may have a second width W2. The second part 160b may extend in the fourth direction D4 at the uniform second width W2.

The first width W1 and the second width W2 may be different from each other. The first width W1 may be greater than the second width W2 (in the third direction D3). That is, the width in the third direction D3 of the storage contact 160 may be relatively small at the lower portion in contact with the node pad XP and may be relatively large at the upper portion that extends in the fourth direction D4 away from the node pad XP.

The inclined part 160c may be disposed between (defined by) the first part 160a and the second part 160b. The inclined part 160c may connect the first part 160a to the second part 160b that has a width (e.g., the second width W2) different from that of the first part 160a (e.g., the first width W1). The inclined part 160c may be of a non-uniform width in the third direction D3 and disposed between the first part 160a and the second part 160b. The inclined part 160c may decrease in width toward the second part 160b. The inclined part 160c may increase in width toward the first part 160a. That is, the inclined part 160c may be of an inverted trapezoidal shape.

Side surfaces of the storage contact 160 may not extend linearly. The side surfaces of the storage contact 160 may not extend in a straight line. That is, the side surfaces of the storage contact 160 may include a curved portion.

The storage contact 160 may include the first side surface SW1, the second side surface SW2, and the inclined surface SW3. The first side surface SW1 may be a side surface of the first part 160a. The first side surface SW1 may extend in the fourth direction D4 on the second side surface SW2 and the inclined surface SW3. The first side surface SW1 may be spaced closer apart from the bit line BL than the second side surface SW2 may be in the third direction D3. The first side surface SW1 may protrude further toward the bit line BL than the second side surface SW2 in the third direction D3.

The second side surface SW2 may be a side surface of the second part 160b. The second side surface SW2 may extend in the fourth direction D4 below the first side surface SW1 and the inclined surface SW3. The second side surface SW2 may be spaced farther apart from the bit line BL than is the first side surface SW1. The second side surface SW2 may be spaced farther apart from the bit line BL than the first side surface SW1 may be in the third direction D3.

The inclined surface SW3 may be a side surface of the inclined part 160c. The inclined surface SW3 may be disposed between the first side surface SW1 and the second side surface SW2. The inclined surface SW3 may connect the first side surface SW1 to the second side surface SW2. The inclined surface SW3 may be inclined with respect to the fourth direction D4.

The inclined surface SW3 may be bent or curved from the first side surface SW1. The inclined surface SW3 may be bent or curved from the second side surface SW2. That is, the inclined surface SW3 may not extend in the fourth direction D4 in which the first side surface SW1 and the side surface SW2 extend. The inclined surface SW3 may be inclined with respect to the first side surface SW1 and the second side surface SW2.

The first side surface SW1 and the second side surface SW2 may be bent or curved from the inclined surface SW3. The first side surface SW1 and the second side surface SW2 may be bent or curved from the inclined surface SW3 in different directions. The first side surface SW1 may be bent or curved from the inclined surface SW3 in a manner to be closer to a facing bit line BL. The second side surface SW2 may be bent or curved from the inclined surface SW3 in a manner to be away from a facing bit line BL. The first side surface SW1 may not overlap the second side surface SW2. That is, since the first side surface SW1 and the second side surface SW2 are bent or curved from the inclined surface SW3 in different directions, they may not overlap each other.

A distance between the bit line BL and the first side surface SW1 in the third direction D3 may be a first distance D1. A distance between the bit line BL and the second side surface SW2 in the third direction D3 may be a second distance D2. Here, the second distance D2 may be greater than the first distance D1. That is, since the second side surface SW2 may be spaced farther away from the bit line BL than the first side surface SW1 may be, the second distance D2 may be greater than the first distance D1.

The storage contact 160 may include a metal material. For example, the storage contact 160 may include TiN or the like. However, embodiments may not be limited to this case. For example, the storage contact 160 may include, for example, a semiconductor material doped with impurities, a conductive metal nitride, metal, and/or a metal alloy. The storage contact 160 may not include silicide.

Referring back to FIGS. 1 to 7, the fence pattern 170 may be disposed between the storage contacts 160 in the second direction D2. The fence patterns 170 may be spaced apart from each other in the second direction D2 with the storage contact 160 interposed therebetween. The fence pattern 170 may separate a plurality of storage contacts 160 from each other.

In a cross-sectional view taken along the second direction D2, the fence pattern 170 may have a uniform width. In a cross-sectional view taken along the second direction D2, the fence pattern 170 may extend linearly (uniformly). For example, referring to FIG. 5, a side surface of the fence pattern 170 disposed between the storage contacts 160 may extend linearly (uniformly) in the fourth direction D4.

The fence pattern 170 may be disposed between the bit line spacers 120 in the third direction D3. The fence patterns 170 may be spaced apart from each other in the third direction D3 with the bit line spacer 120 interposed therebetween.

In a cross-sectional view taken along the third direction D3, the fence pattern 170 may not have a uniform width. In a cross-sectional view taken along the third direction D3, the side surface of the fence pattern 170 may be bent. For example, referring to FIG. 6, the side surface of the fence pattern 170 disposed between the bit line spacers 120 may be bent.

The fence pattern 170 may overlap the word line WL. The fence pattern 170 may include an insulating material. For example, the fence pattern 170 maya silicon oxide layer, a silicon nitride layer, a silicon oxynitride layer, a silicon oxycarbonitride layer, and/or a silicon carbonitride layer.

The landing pad LP may be disposed on the storage contact 160. When viewed in a plan view of FIG. 1, the landing pads LP may be in the shape of islands that are spaced apart from each other. Six landing pads LP surrounding one landing pad LP may form a hexagonal shape. The landing pads LP may be arranged to form a honeycomb shape. However, the embodiments of the arrangement of the landing pads LP may not be limited thereto.

The landing pads LP may simultaneously make contact with the bit line capping layer 137 and the storage contact 160. The landing pads LP may include, for example, metal such as tungsten (W), aluminum (Al), copper (Cu), cobalt (Co), or molybdenum (Mo), but are not limited thereto.

A landing pad separation pattern 180 may be disposed between the landing pads LP. The landing pad separation pattern 180 may be disposed on the fence pattern 170. A portion of the landing pad separation pattern 180 may be interposed between the storage contact 160 and the bit line spacer 120 that are adjacent to each other. Thus, a lower end of the landing pad separation pattern 180 may be lower than an upper end of the bit line spacer 120.

The landing pad separation pattern 180 may include an insulating material to electrically isolate a plurality of landing pads LP from each other. For example, the landing pad separation pattern 180 may include, but may not be limited to, a silicon oxide layer, a silicon nitride layer, a silicon oxynitride layer, a silicon oxycarbonitride layer, and/or a silicon carbonitride layer.

An etch stop layer 140 may be disposed on the landing pad LP and the landing pad separation pattern 180. The etch stop layer 140 may include a silicon nitride layer, a silicon carbonitride layer, a silicon boron nitride layer (SiBN), a silicon oxynitride layer, and/or a silicon oxycarbide layer.

The capacitor CAP may be disposed on the landing pad LP. The capacitor CAP may be electrically connected to the landing pad LP. The capacitor CAP may be electrically connected to the storage contact 160 through the landing pad LP. The capacitor CAP may be disposed on the etch stop layer 140. The capacitor CAP may include the lower electrodes 191, a capacitor dielectric layer 192, and an upper electrode 193.

The lower electrodes 191 may be disposed on the storage pads 160. Each of the lower electrodes 191 may have a pillar shape, but embodiments may not be limited to this case. Each of the lower electrodes 191 may have a cylinder shape. The capacitor dielectric layer 192 is disposed on the lower electrodes 191. The capacitor dielectric layer 192 may be formed along a profile of the lower electrode 191. The upper electrode 193 may be disposed on the capacitor dielectric layer 192. The upper electrode 193 may cover outer sidewalls of the lower electrodes 191.

The lower electrodes 191 and the upper electrode 193 may each include, but may not be limited to, a doped semiconductor material, a conductive metal nitride (such as titanium nitride, tantalum nitride, niobium nitride, tungsten nitride, or the like), metal (such as ruthenium, iridium, titanium, tantalum, or the like), or a conductive metal oxide (such as iridium oxide, niobium oxide, or the like).

For example, the capacitor dielectric layer 192 may include, but may not be limited to, silicon oxide, silicon nitride, silicon oxynitride, a high-k material, and combinations of the same. The high-k material may be a dielectric material having a higher dielectric constant than silicon oxide. The semiconductor memory device according to some embodiments, the capacitor dielectric layer 192 may have a stacked film structure in which zirconium oxide, aluminum oxide, and zirconium oxide are sequentially stacked. In the semiconductor memory device according to some embodiments, the first capacitor dielectric layer 192 may include a dielectric layer containing hafnium (Hf). In the semiconductor memory device according to some embodiments, the first capacitor dielectric layer 192 may have a stacked layer structure of a ferroelectric material layer and a paraelectric material layer.

According to some other embodiments, the capacitor CAP may include a magnetic tunnel junction pattern. In this case, the semiconductor memory device according to some embodiments may be a magnetic random access memory (MRAM). Alternatively, the capacitor CAP may include a phase change material or a variable resistance material. In this case, the semiconductor memory device according to some embodiments may be a phase-change random access memory (PRAM) or a resistive RAM (ReRAM).

Figure 8:
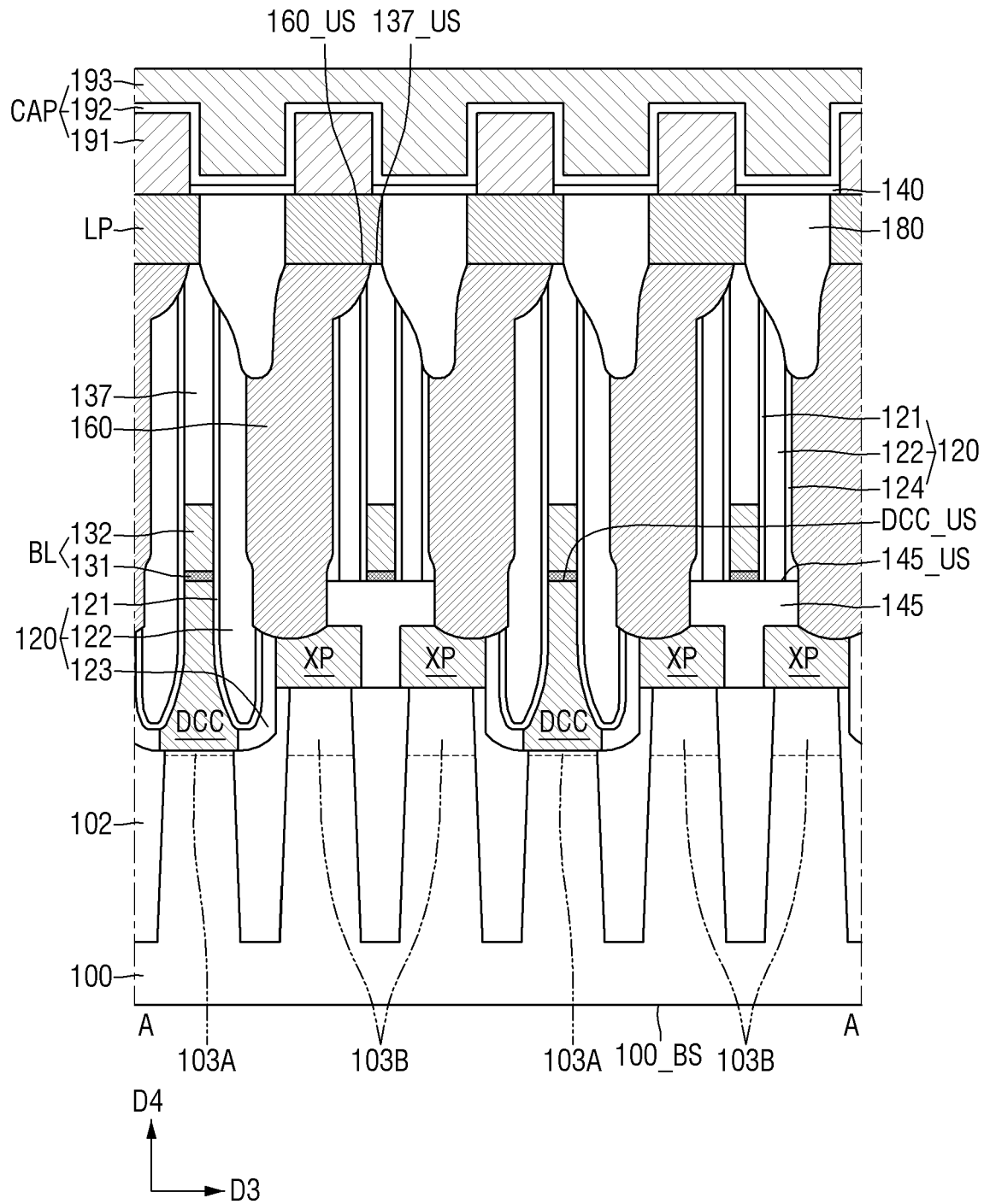
FIG. 8 is a cross-sectional view of a semiconductor memory device according to some embodiments.

FIG. 8 is a view for describing a semiconductor memory device according to some embodiments. For ease of description, differences from the embodiments of FIGS. 1 to 7 will be mainly described.

Referring to FIG. 8, a bit line spacer 120 may further include a third spacer 124.

The third spacer 124 may be disposed on a pad separation pattern 145. The third spacer 124 may be disposed on side surfaces of a spacer liner 121 and a first spacer 122 on the pad separation pattern 145. The third spacer 124 may include, for example, silicon nitride. That is, the bit line spacer 120 on the pad separation pattern 145 may have a triple-layer structure. The third spacer 124 may extend along a side surface of the storage contact 160.

Figure 9:
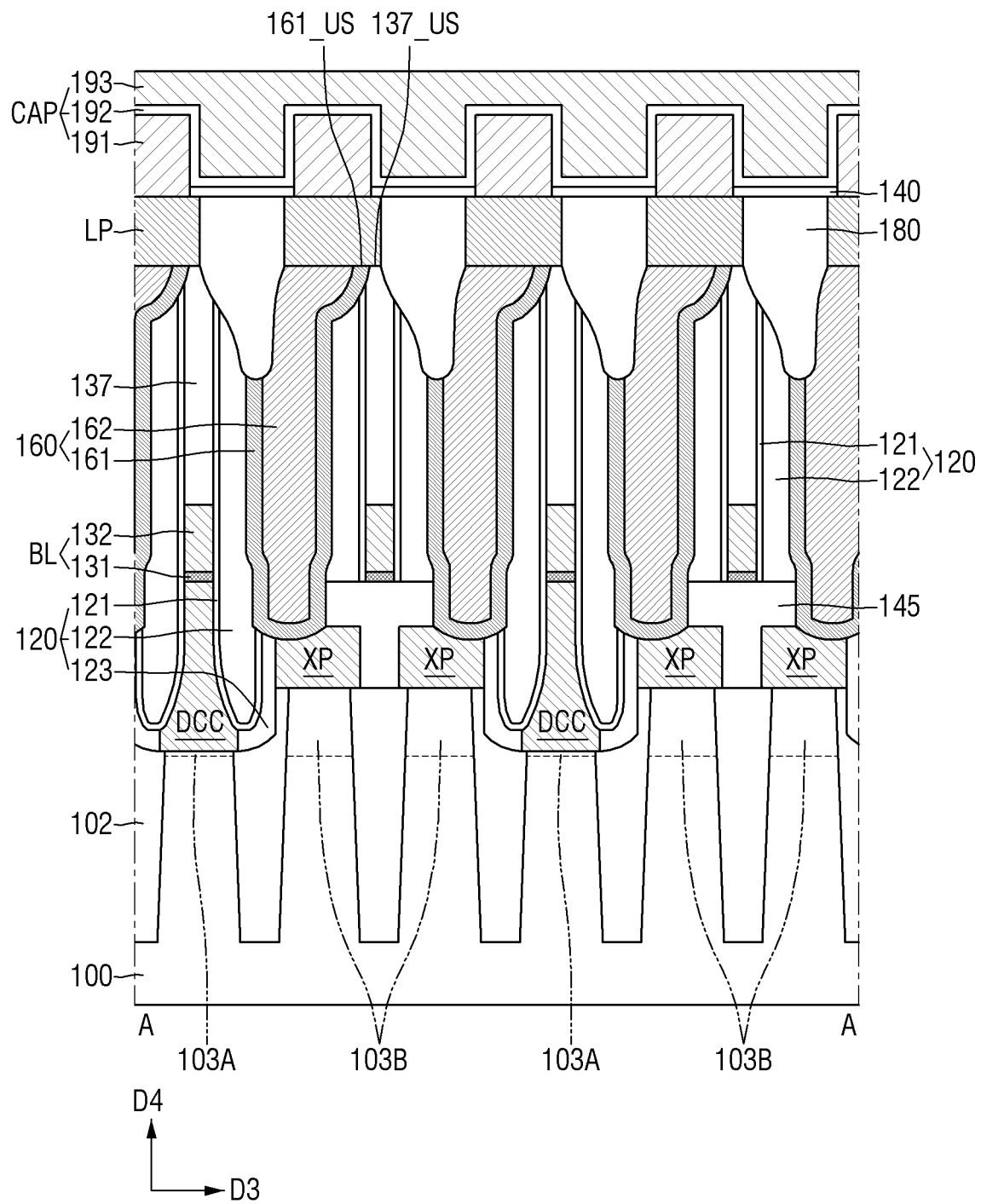
FIGS. 9 and 10 are cross-sectional views of a semiconductor memory device according to some embodiments.
Figure 10:
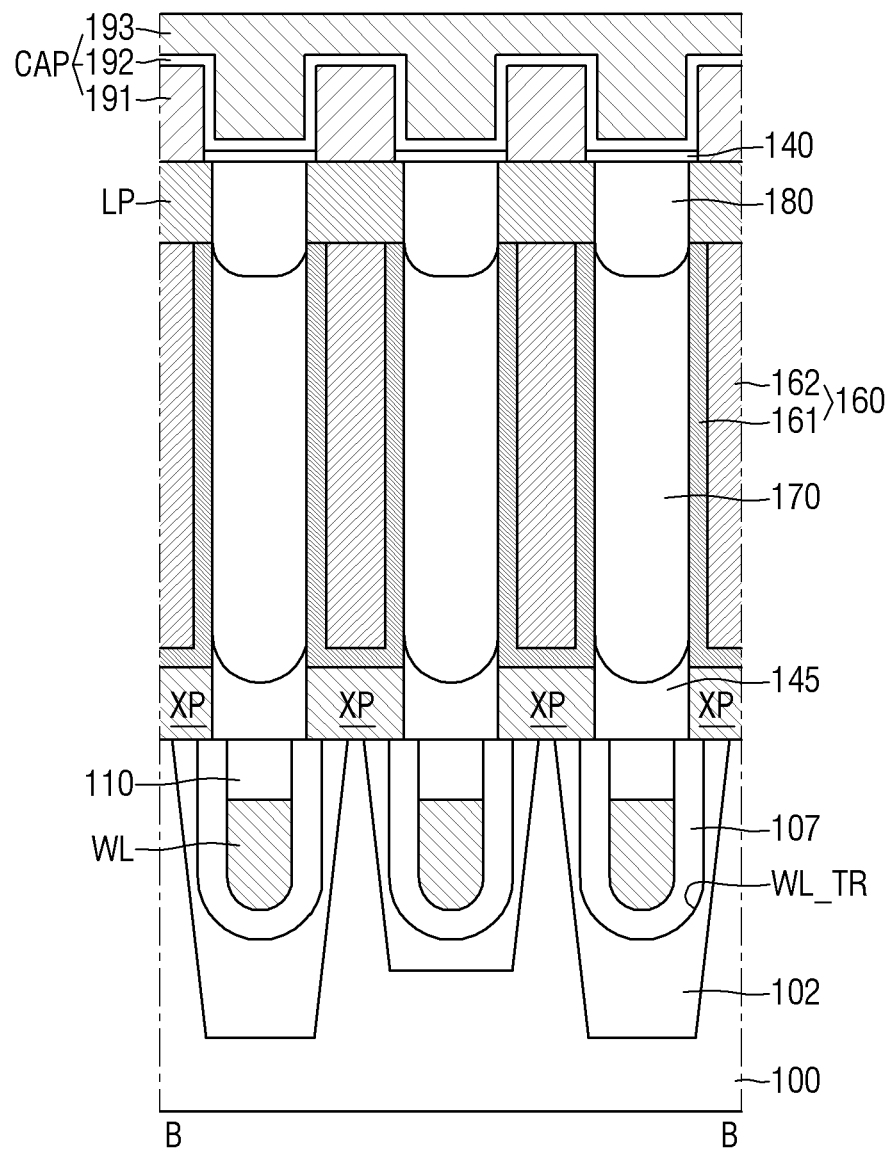

FIGS. 9 and 10 are views for describing a semiconductor memory device according to some embodiments. For ease of description, differences from the embodiments of FIGS. 1 to 7 will be mainly described.

Referring to FIGS. 9 and 10, a storage contact 160 may have a dual-layer structure. The storage contact 160 may include a contact barrier layer 161 and a contact filling layer 162.

Figure 33:
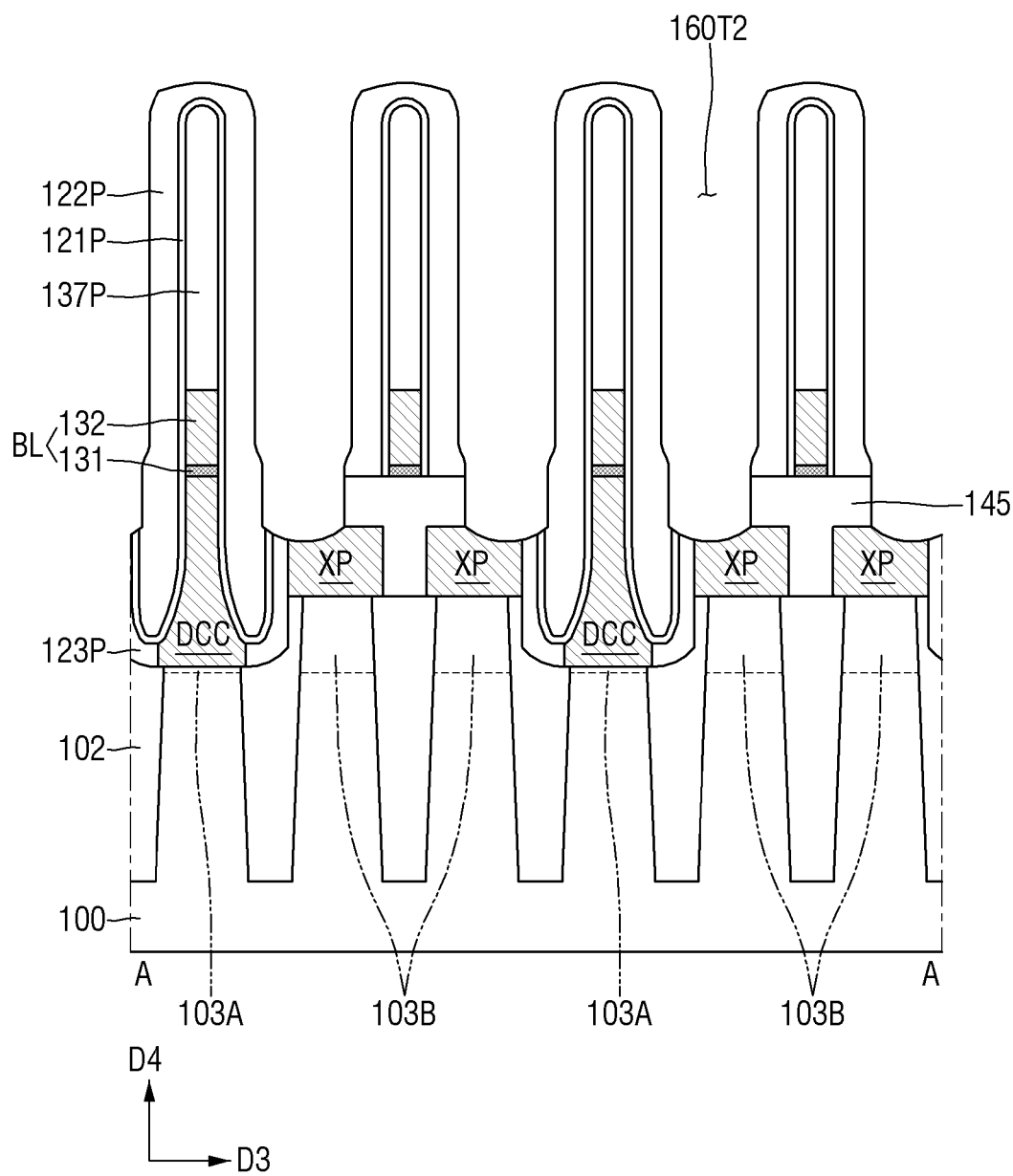

The contact barrier layer 161 may extend along sidewalls and a bottom surface of a storage contact trench 160T2 (e.g., FIG. 33). The contact filling layer 162 may be disposed on the contact barrier layer 161. The contact filling layer 162 may extend along a profile of the contact barrier layer 161.

The contact barrier layer 161 may include, for example, titanium (Ti), titanium nitride (TiN), titanium silicon nitride (TiSiN), tantalum (Ta), tantalum nitride (TaN), and/or tungsten nitride (WN). The contact filling layer 162 may include, for example, metal such as tungsten (W), aluminum (Al), copper (Cu), cobalt (Co), or molybdenum (Mo). However, the embodiments of materials for the contact barrier layer 161 and the contact filling layer 152 may not be limited thereto.

An upper surface of the contact barrier layer 161 may be coplanar with an upper surface of the bit line capping layer 137. An upper surface of the contact filling layer 162 may be coplanar with the upper surface of the contact barrier layer 161.

The contact barrier layer 161 may be bent or curved. For example, referring to FIG. 9, in a cross-sectional view taken along the third direction D3, the side surfaces of the contact barrier layer 161 may have bent or curved portions.

Figure 11:
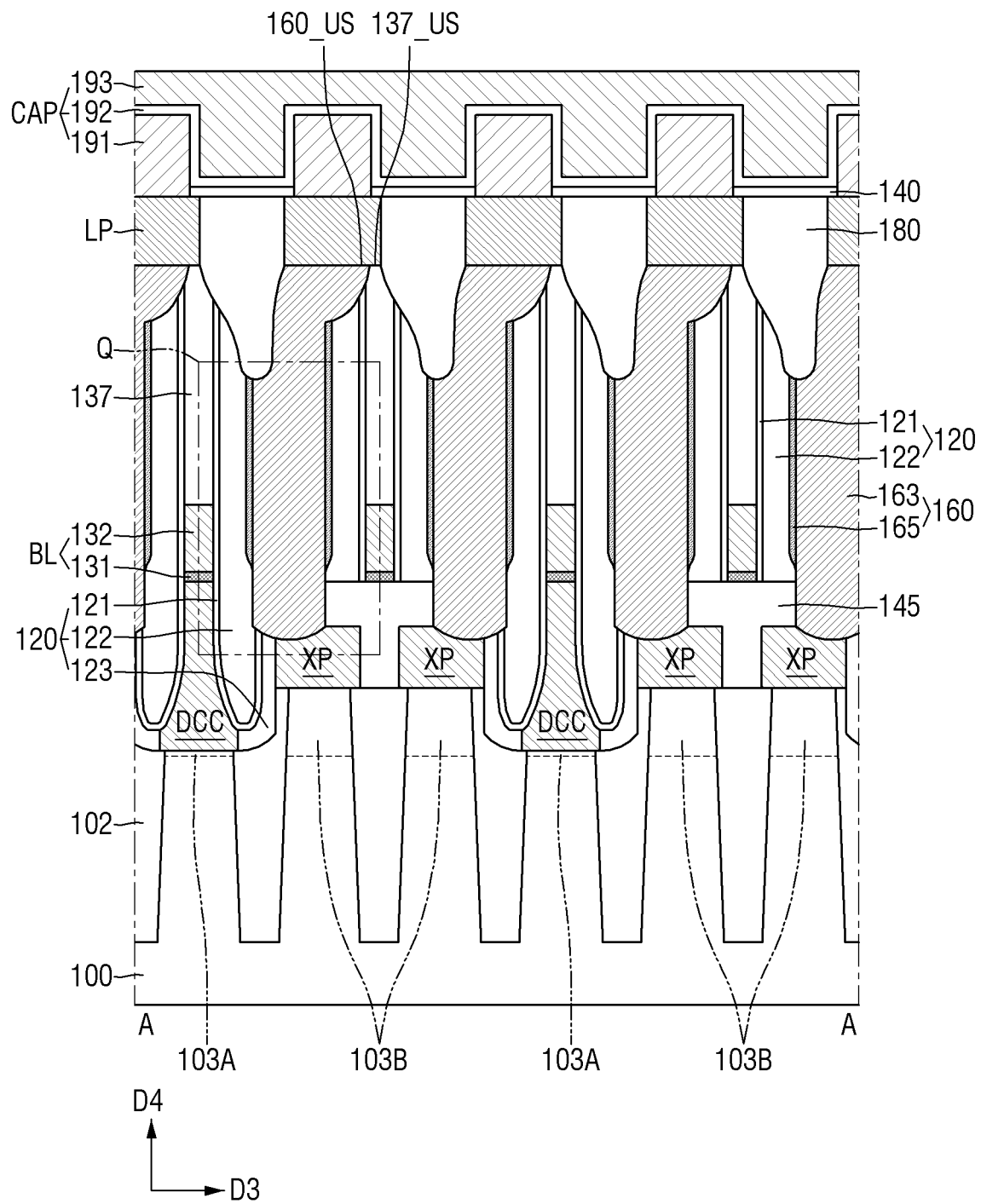
FIG. 11 is a cross-sectional view of a semiconductor memory device according to some embodiments.
Figure 12:
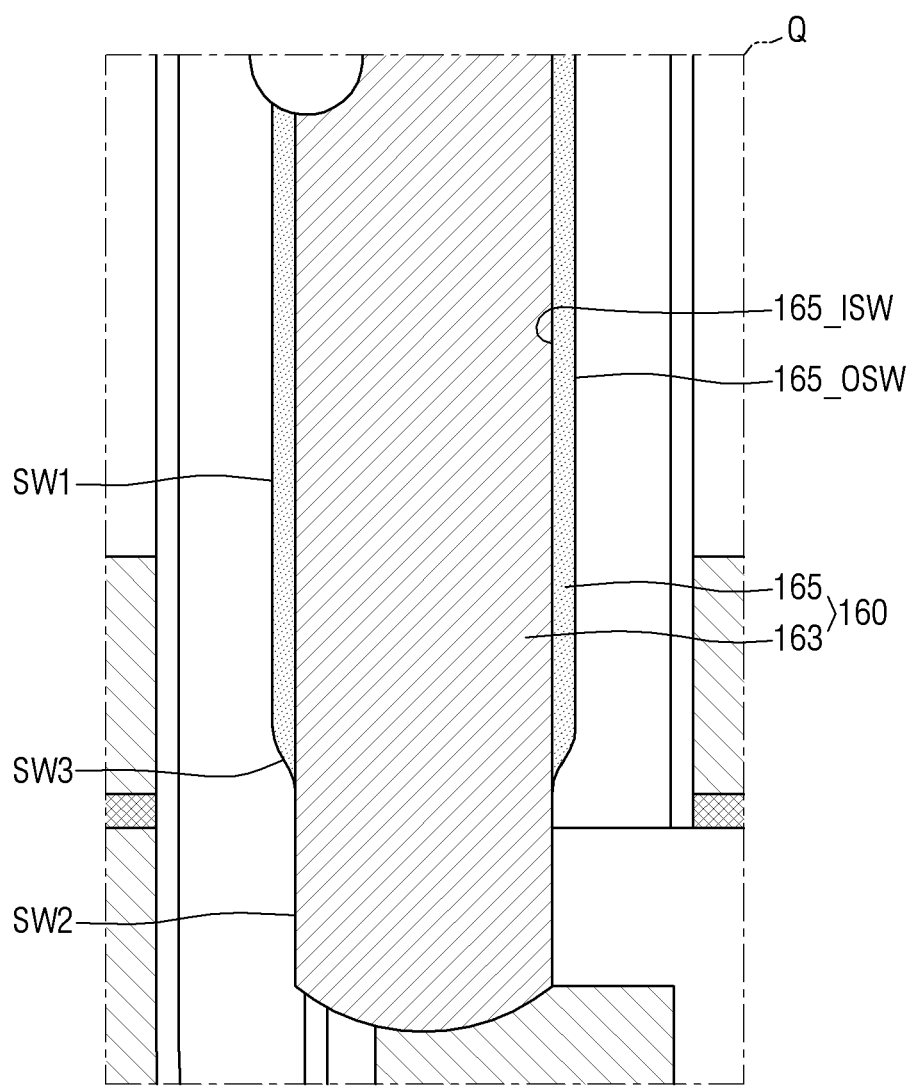
FIGS. 12 and 13 are enlarged views of portion Q of FIG. 11 according to some embodiments.
Figure 13:
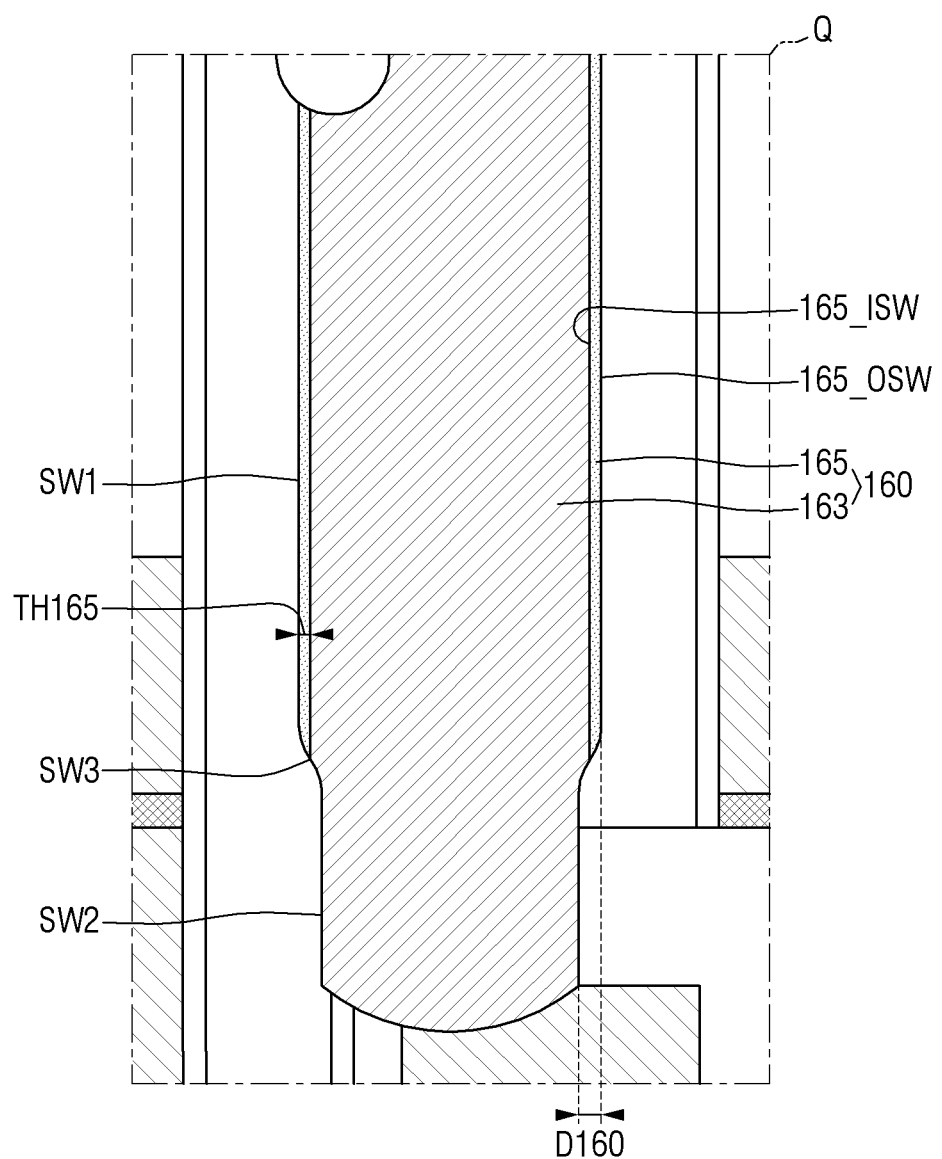

FIG. 11 is a view for describing a semiconductor memory device according to some embodiments. FIGS. 12 and 13 are enlarged views of portion Q of FIG. 11. For ease of description, differences from the embodiments of FIGS. 1 to 10 will be mainly described.

Referring to FIGS. 11 to 13, a semiconductor memory device according to some embodiments may include a passivation layer 165.

Specifically, a storage contact 160 may include a contact layer 163 and the passivation layer 165. The storage contact 160 may be on a side surface of the bit line spacer 120. For example, the passivation layer 165 may extend along the side surface of the bit line spacer 120. The contact layer 163 may be formed on the passivation layer 165.

The passivation layer 165 may extend along an inclined surface SW3 and a first side surface SW1 of the storage contact 160. An outer side surface 165_OSW of the passivation layer 165 may coincide with the first surface SW1 of the storage contact 160.

The passivation layer 165 may not extend along a second side surface SW2 of the storage contact 160. The passivation layer 165 may extend from an upper portion of the second surface SW2.

The passivation layer 165 may extend to fill a portion of the first side surface SW1 that protrudes from the second side surface SW2 in the third direction D3. That is, the passivation layer 165 may be filled in a space between the first side surface SW1 and the second side surface SW2 in the third direction D3.

For example, referring to FIG. 12, an inner side surface 165_ISW of the passivation layer 165 may overlap the second side surface SW2. The inner side surface 165_ISW of the passivation layer 165 may extend from the second side surface SW2 of the storage contact 160. That is, the passivation layer 165 may extend between the first side surface SW1 and the second side surface SW2.

A thickness of the passivation layer 165 may be the same as a distance between the first side surface SW1 and the second side surface SW2. The contact layer 163 may have a uniform width.

In another example, referring to FIG. 13, the inner side surface 165_ISW of the passivation layer 165 may be disposed between the first side surface SW1 and the second side surface SW2 in the third direction D3. The inner side surface 165_ISW of the passivation layer 165 may not overlap the second side surface SW2 of the storage contact 160. The inner side surface 165_ISW of the passivation layer 165 may intersect with the inclined surface SW3 of the storage contact 160. The passivation layer 165 may be disposed closer to the bit line BL than the second side surface SW2. That is, the thickness TH165 of the passivation layer 165 may be smaller than the distance D160 between the first side surface SW1 and the second side surface SW2. The contact layer 163 may have a non-uniform width. A width of the contact layer 163 between the second side surfaces SW2 may be less than a width of the contact layer 163 between the inner side surfaces 165_ISW of the passivation layer 165.

Figure 14:
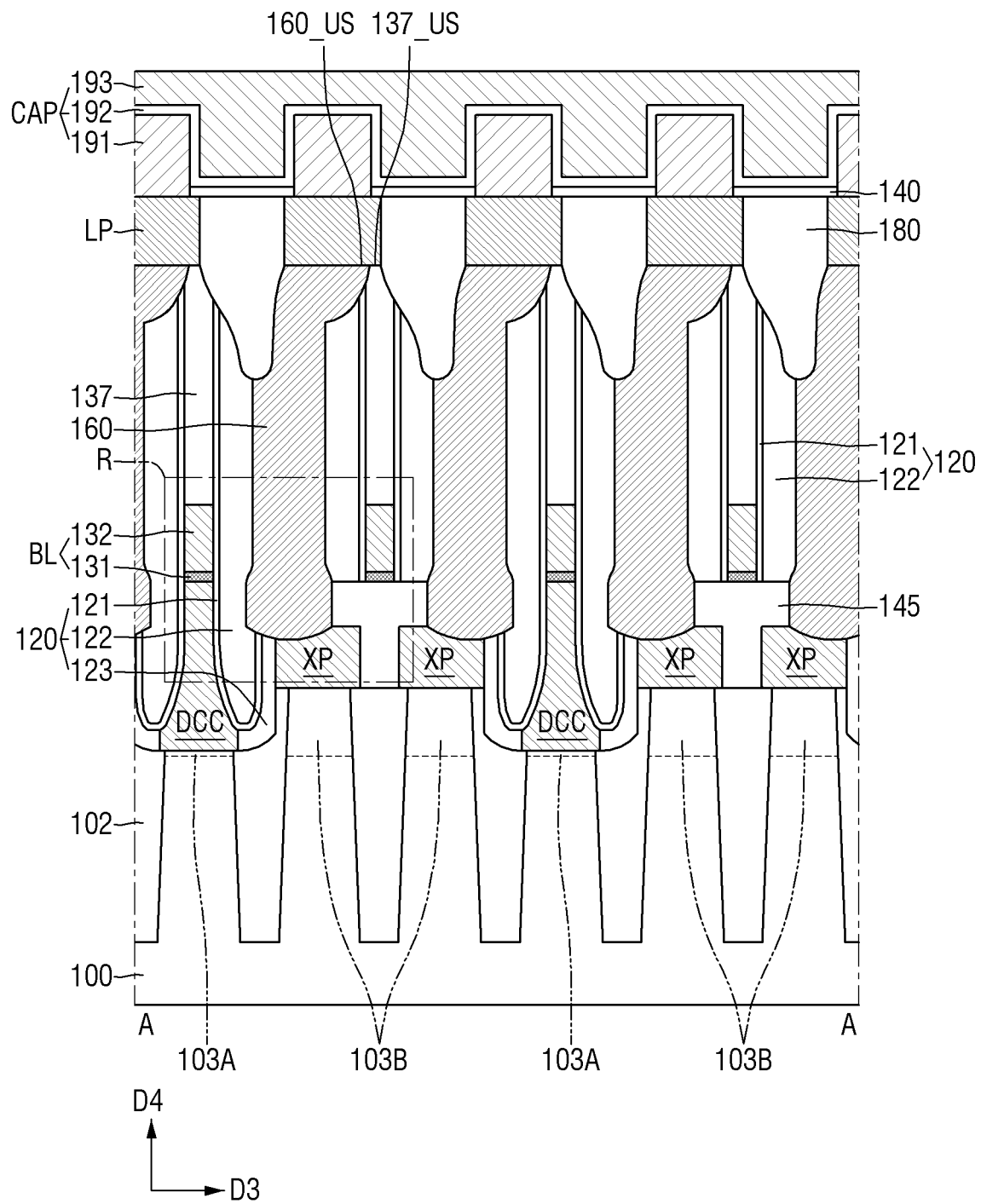
FIG. 14 is a cross-sectional view of a semiconductor memory device according to some embodiments.
Figure 15:
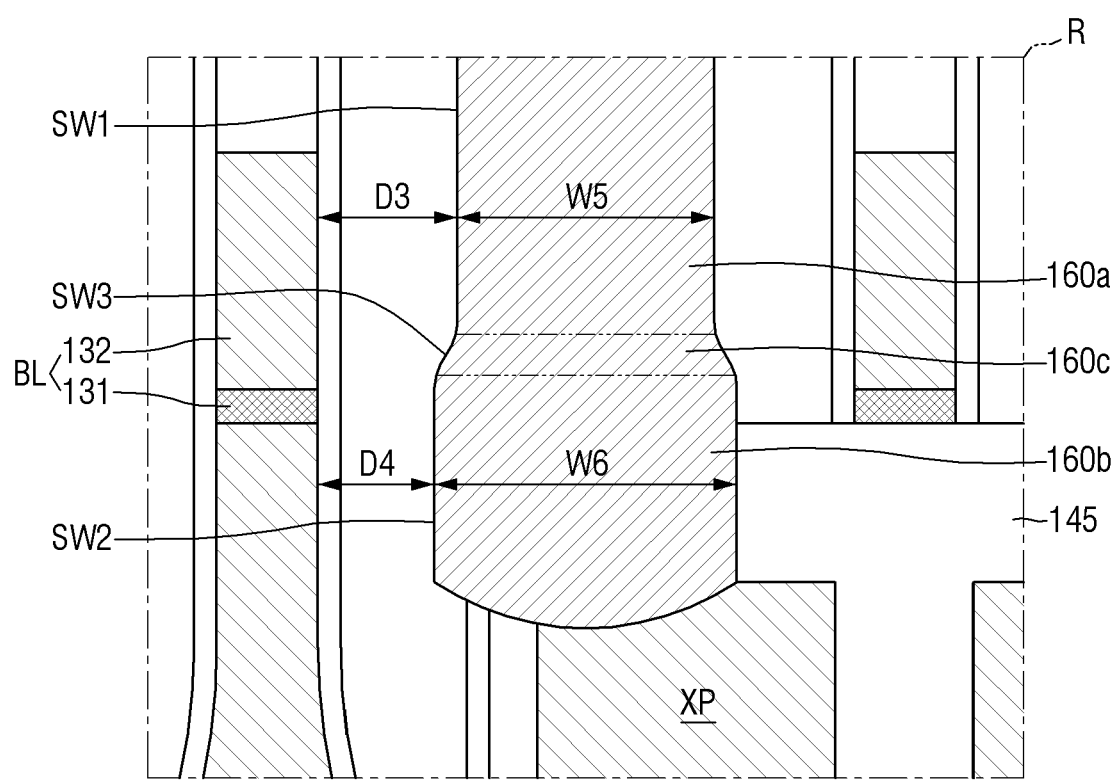
FIG. 15 is an enlarged view of portion R of FIG. 14.

FIG. 14 is a view for describing a semiconductor memory device according to some embodiments. FIG. 15 is an enlarged view of portion R of FIG. 14. For ease of description, differences from the embodiments of FIGS. 1 to 7 will be mainly described.

Referring to FIGS. 14 and 15, a fifth width W5 of a first part 160a of a storage contact 160 may be less than a sixth width W6 of a second part 160b of the storage contact 160 in the third direction D3. That is, the width of the storage contact 160 may be relatively large at the lower portion in contact with a node pad XP and may be relatively small at the upper portion that extends in the fourth direction D4 away from the node pad XP.

The inclined part 160c of the storage contact 160 may connect the first part 160a to the second part 160b that has a width different from that of the first part 160a. The inclined part 160c may decrease in width in the third direction D3 toward the first part 160a. The inclined part 160c may increase in width in the third direction D3 toward the second part 160b. That is, the inclined part 160c may be of a trapezoidal shape.

The first side surface SW1 may be spaced farther apart from the bit line BL than is the second side surface SW2. The first side surface SW1 may be bent or curved from the inclined surface SW3 in a manner to be away from a facing bit line BL.

The second side surface SW2 may be closer to the bit line BL than is the first side surface SW1. The second side surface SW2 may be bent or curved from the inclined surface SW3 in a manner to be closer to a facing bit line BL.

A distance between the bit line BL and the first side surface SW1 may be a third distance D3. A distance between the bit line BL and the second side surface SW2 may be a fourth distance D4. Here, the third distance D3 may be greater than the fourth distance D4. That is, since the first side surface SW1 may be spaced farther apart from the bit line BL than may be the second side surface SW2, the third distance D3 may be greater than the fourth distance D4.

Figure 16:
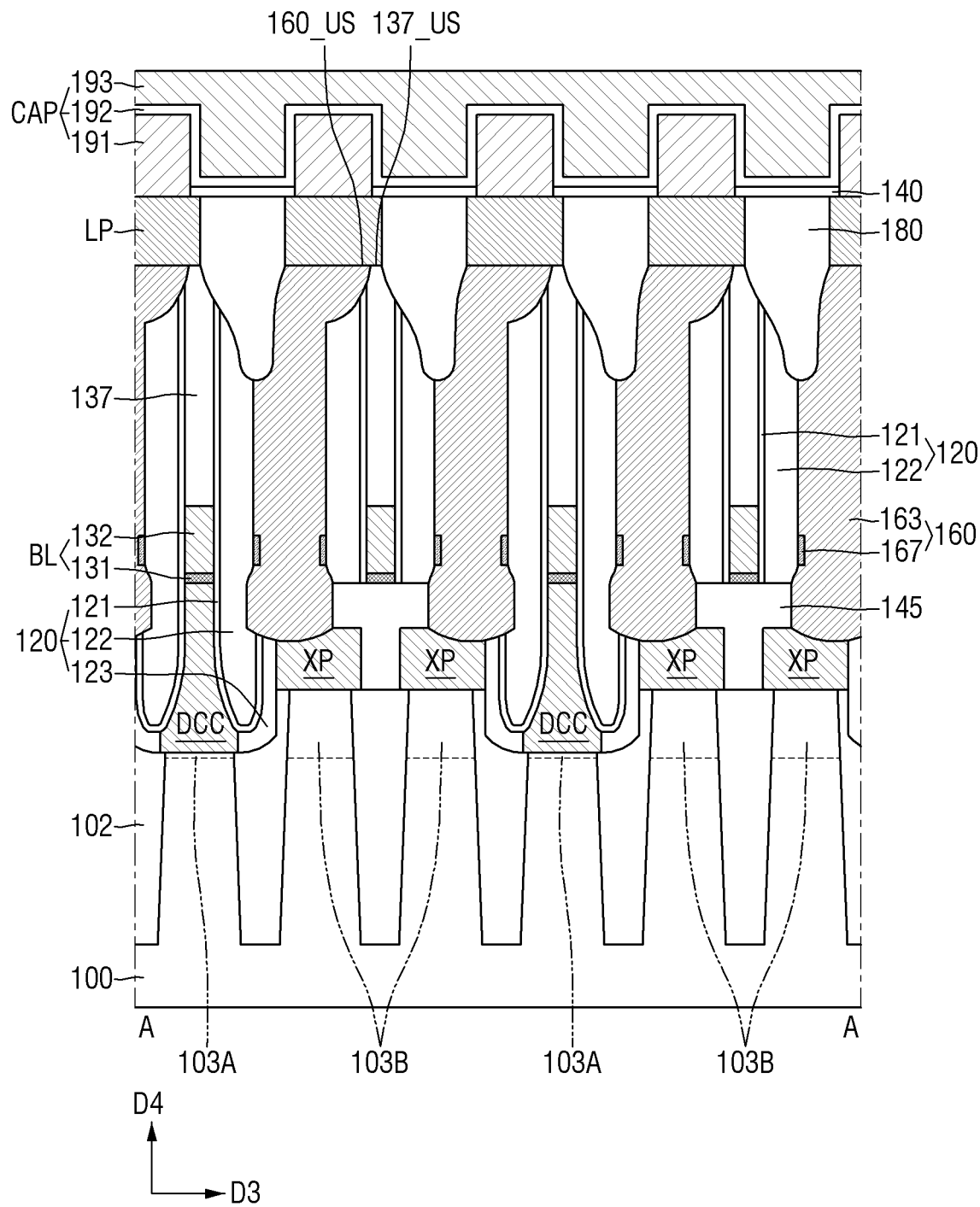
FIG. 16 is a cross-sectional view of a semiconductor memory device according to some embodiments.

FIG. 16 is a view for describing a semiconductor memory device according to some embodiments. For ease of description, differences from the embodiments of FIGS. 14 and 15 will be mainly described.

Referring to FIG. 16, a semiconductor memory device according to some embodiments may include lower passivation layers 167.

A storage contact 160 may include a contact layer 163 and the lower passivation layers 167. The lower passivation layers 167 may be in (covered by) the contact layer 163.

The lower passivation layers 167 may each be disposed at an inner side of a first side surface SW1 of the storage contact 160. The lower passivation layers 167 may be disposed on a lower portion of a first part 160a that meets an inclined part 160c. The lower passivation layers 167 may be disposed to face each other at the inner side of the first side surface SW1.

Figure 17:
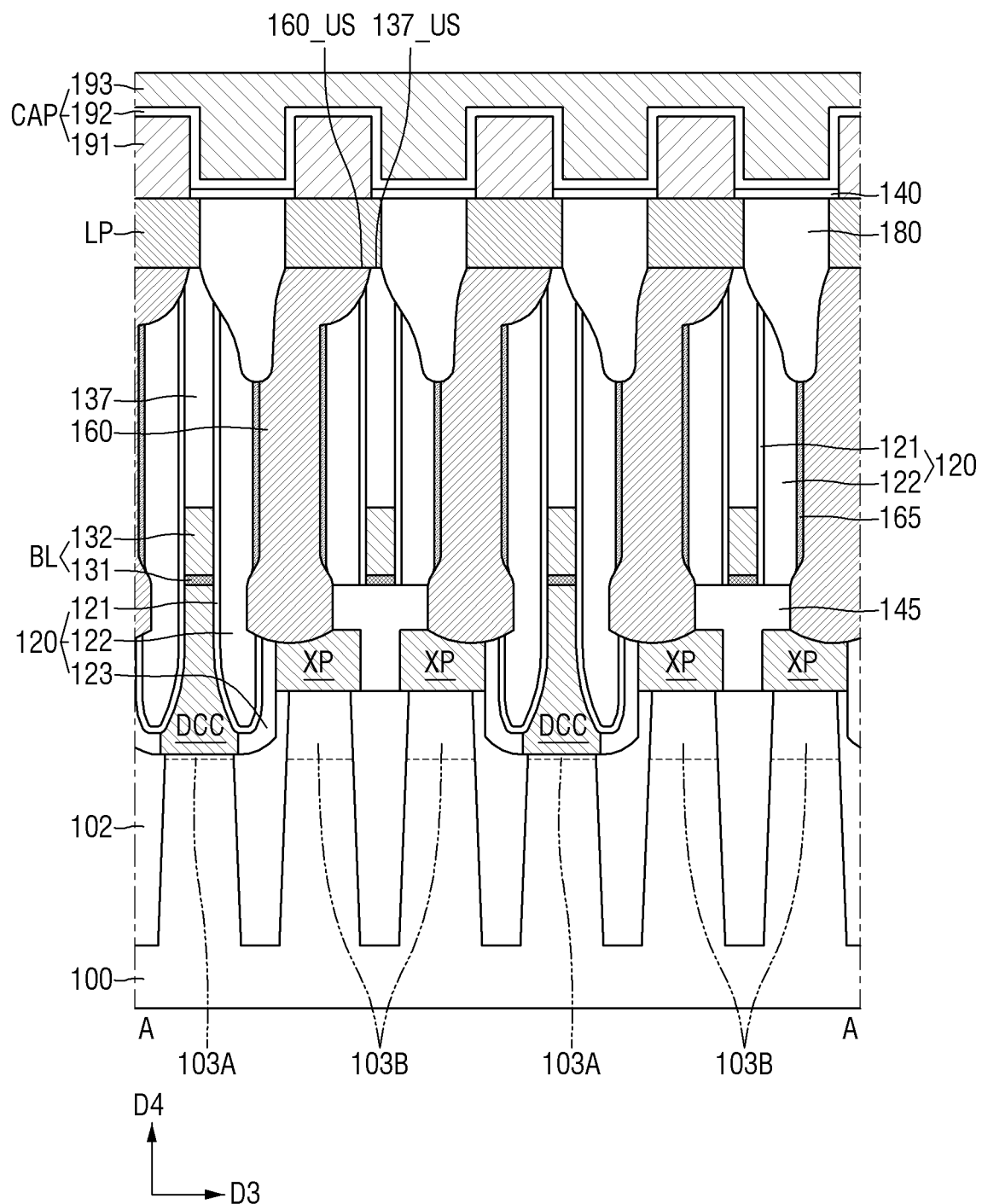
FIG. 17 is a cross-sectional view of a semiconductor memory device according to some embodiments.

FIG. 17 is a view for describing a semiconductor memory device according to some embodiments. For ease of description, differences from the embodiments of FIGS. 14 and 15 will be mainly described.

Referring to FIG. 17, a semiconductor memory device according to some embodiments may include a passivation layer 165.

A storage contact 160 may include a contact layer 163 and the passivation layer 165. The passivation layer 165 may extend along a first side surface SW1 (see FIG. 15) of the storage contact 160. The passivation layer 165 may not extend along a second side surface SW2 (see FIG. 15) of the storage contact 160. The passivation layer 165 may extend from an upper portion of the second surface SW2 (see FIG. 15).

FIGS. 18 to 35 are views illustrating intermediate stages of fabrication, provided to explain a method of fabricating a semiconductor memory device according to some embodiments. For reference, FIGS. 18 to 35 are views for describing a method of fabricating the semiconductor memory device shown in FIG. 3.

Figure 18:
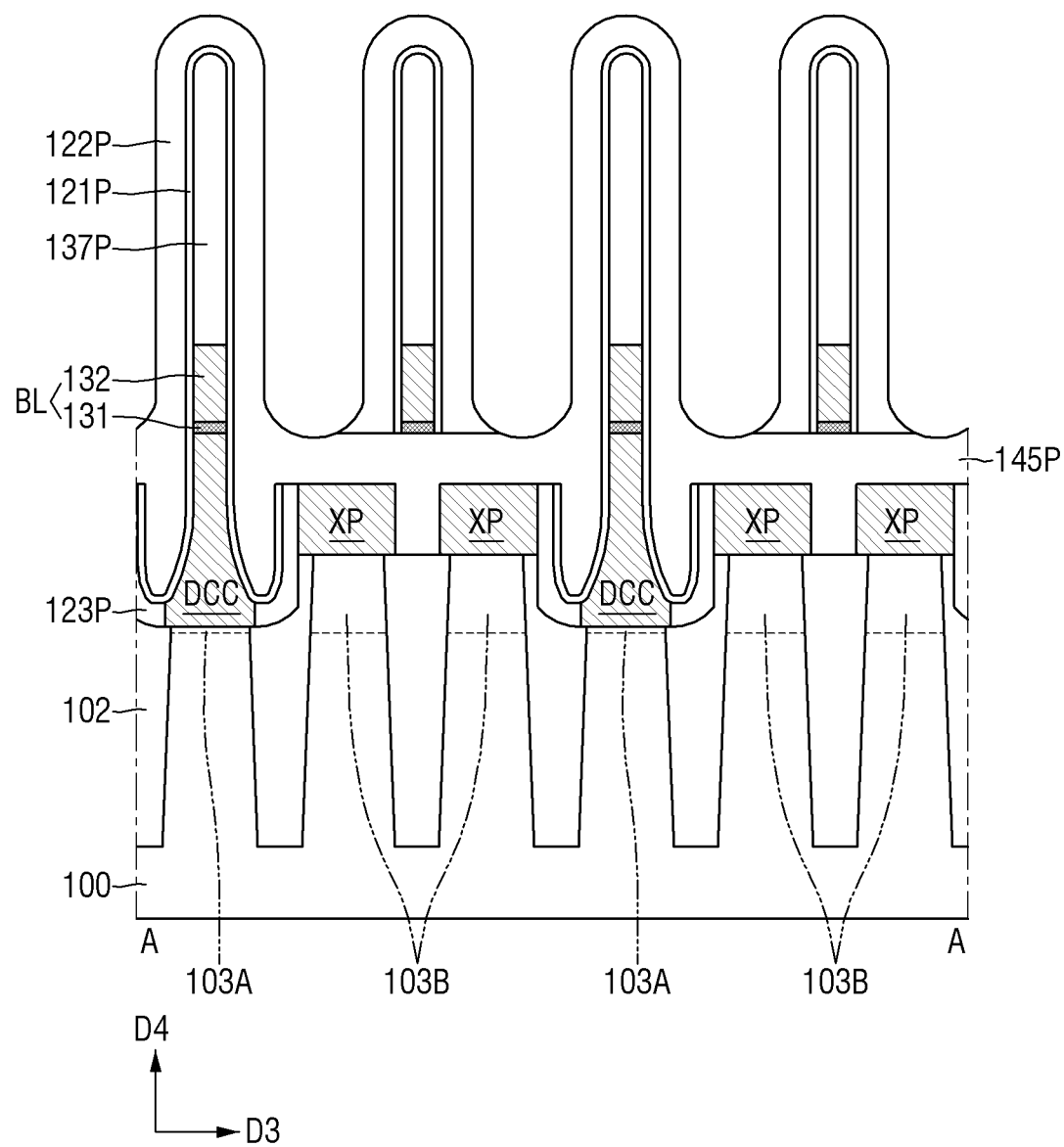
FIGS. 18 to 35 are cross-sectional views illustrating intermediate stages of fabrication method of a semiconductor memory device according to some embodiments.

Referring to FIG. 18, a cell isolation layer 102 may be formed in a substrate 100. Bit lines BL, pre-bit line capping layers 137P, bit line contacts DCC, and node pads XP may be formed on the substrate 100.

A pre-pad separation pattern 145P, second pre-spacers 123P, pre-spacer liners 121P, and first pre-spacers 122P may be sequentially formed on the bit lines BL, the bit line contacts DCC, and the node pads XP. The pre-spacer liners 121P and the first pre-spacers 122P may each extend along the bit line BL. The second pre-spacers 123P may each be formed between the bit line contact DCC and the node pad XP.

Figure 19:
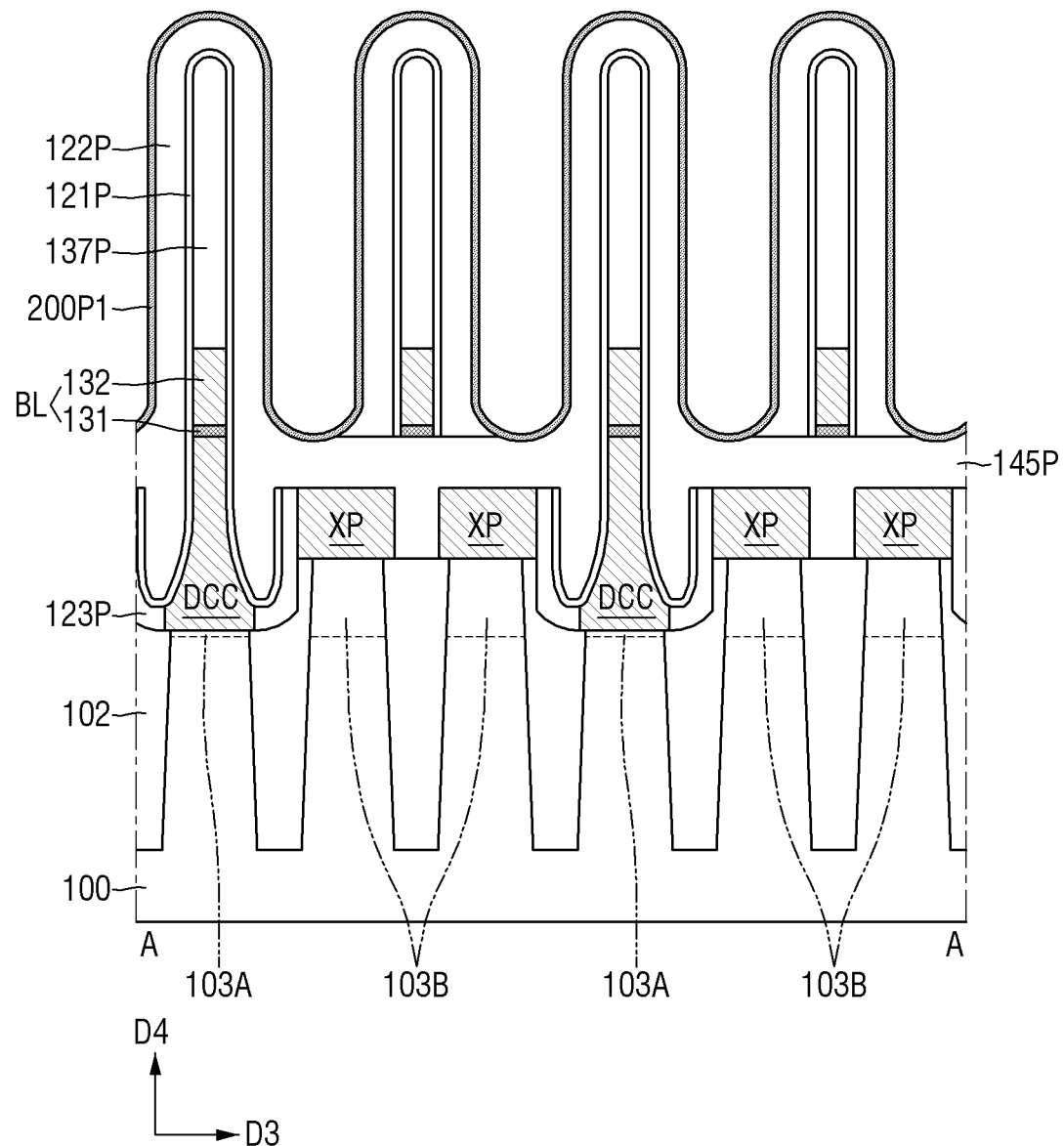
Figure 20:
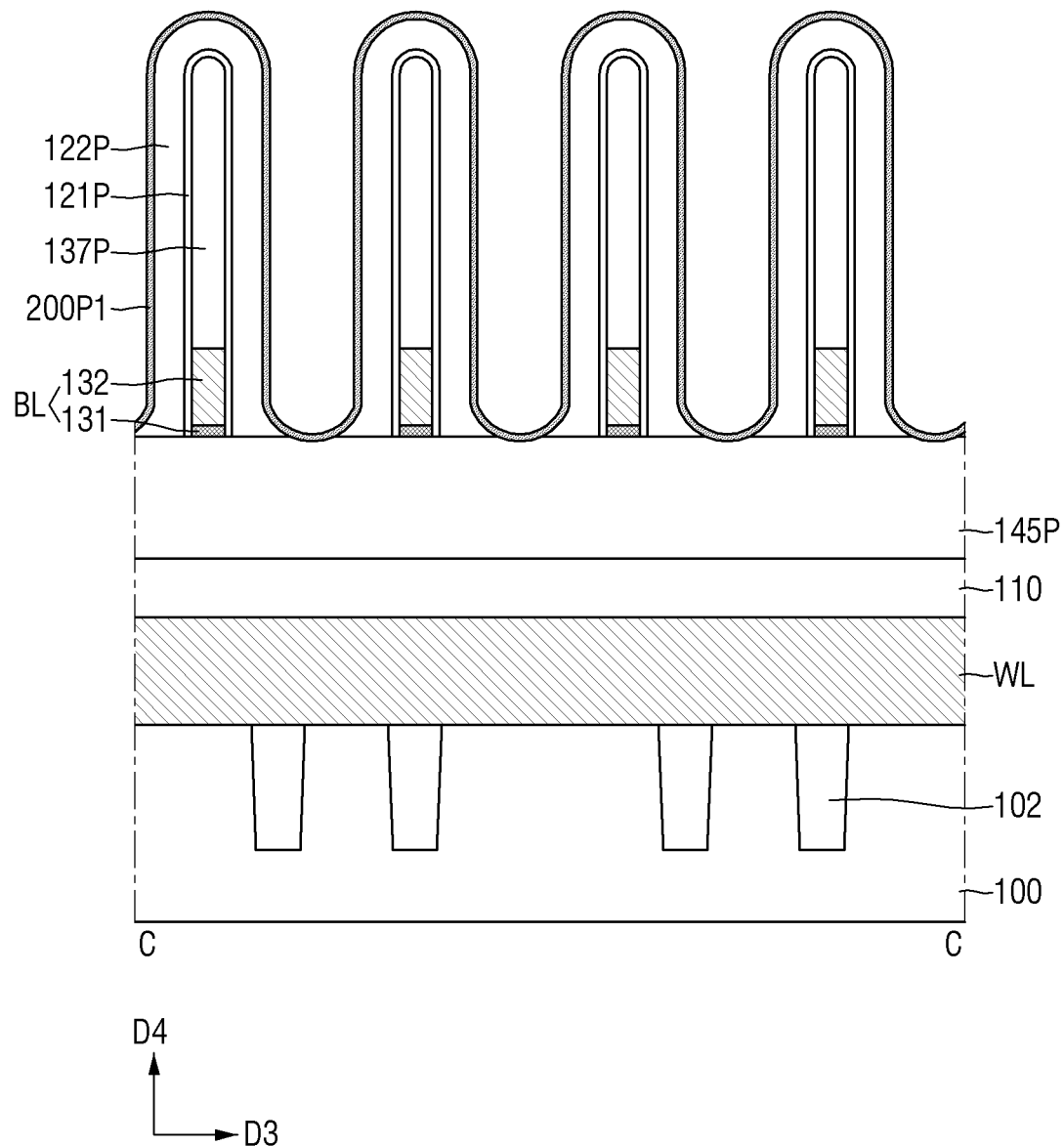

Referring to FIGS. 19 and 20, a first pre-passivation layer 200P1 may be formed on the first pre-spacers 122P and the pre-pad separation pattern 145P.

The first pre-passivation layer 200P1 may include, for example, titanium nitride and/or aluminum oxide. However, embodiments are not limited thereto.

Figure 21:
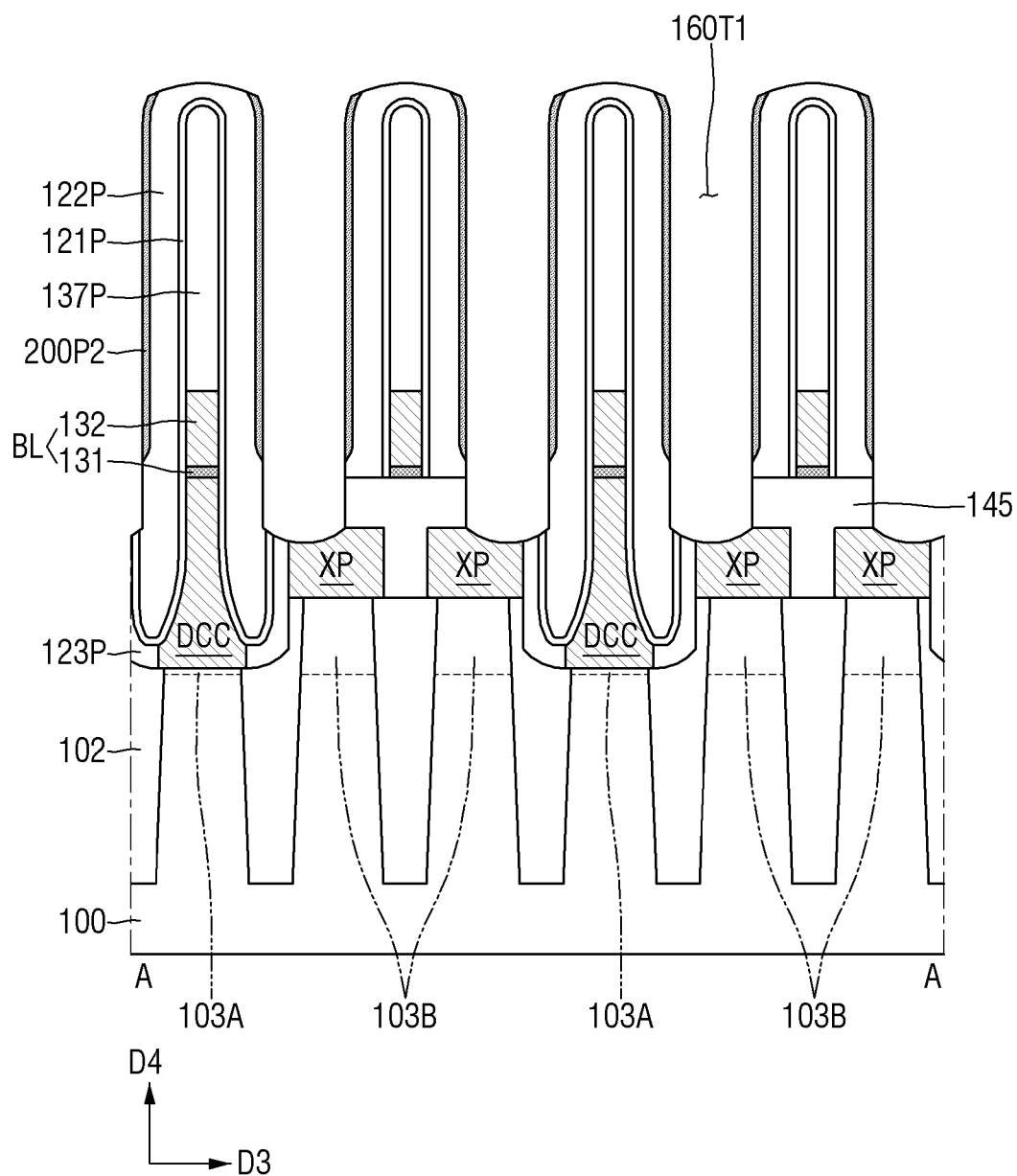
Figure 22:
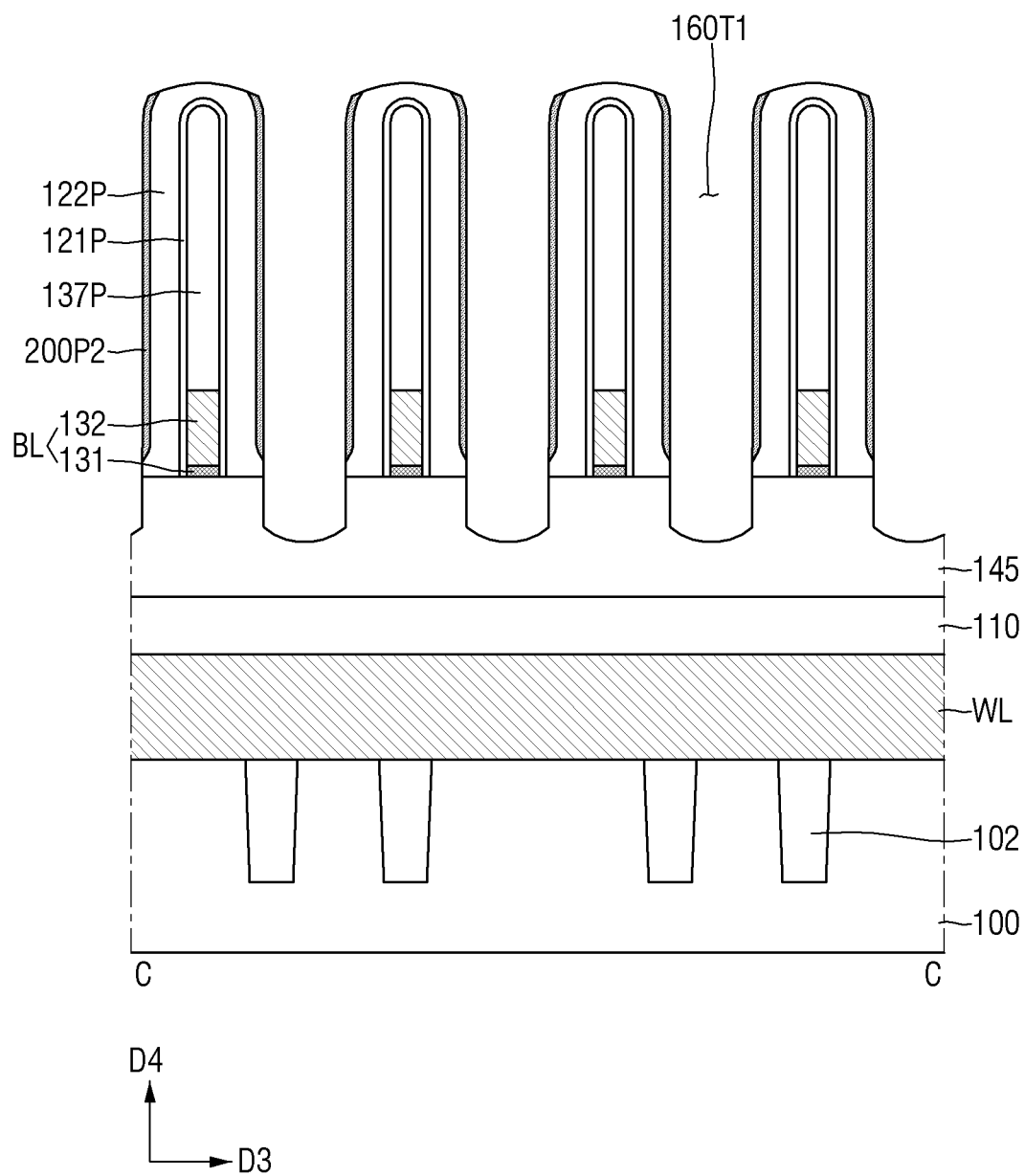

Referring to FIGS. 21 and 22, first storage contact trenches 160T1 may be formed.

Each of the first storage contact trenches 160T1 may expose the node pad XP and the pre-pad separation pattern 145P. The first pre-passivation layer 200P1 and each first pre-spacer 122P may be partially removed.

When the first storage contact trenches 160T 1 are formed, the bit lines BL and the pre-bit line capping layers 137P may be preserved by the first pre-passivation layer 200P1. For example, when an etching process is performed to form the first storage contact trenches 160T1, the first pre-passivation layer 200P1 may prevent the bit lines BL and the pre-bit line capping layers 137P from being etched together and lost.

Second pre-passivation layers 200P2 may be formed as the first pre-passivation layer 200P1 on the pre-pad separation pattern 145P is removed. As the first pre-passivation layer 200P1 on the pre-pad separation pattern 145P is removed, the node pads XP may be exposed. As the first pre-passivation layer 200P1 on the pre-pad separation pattern 145P is removed, pad separation patterns 145 may be formed.

First storage contact trenches 160T1 may each be formed to extend in the second direction D2 between the bit lines BL and the first pre-spacers 122P.

Figure 23:
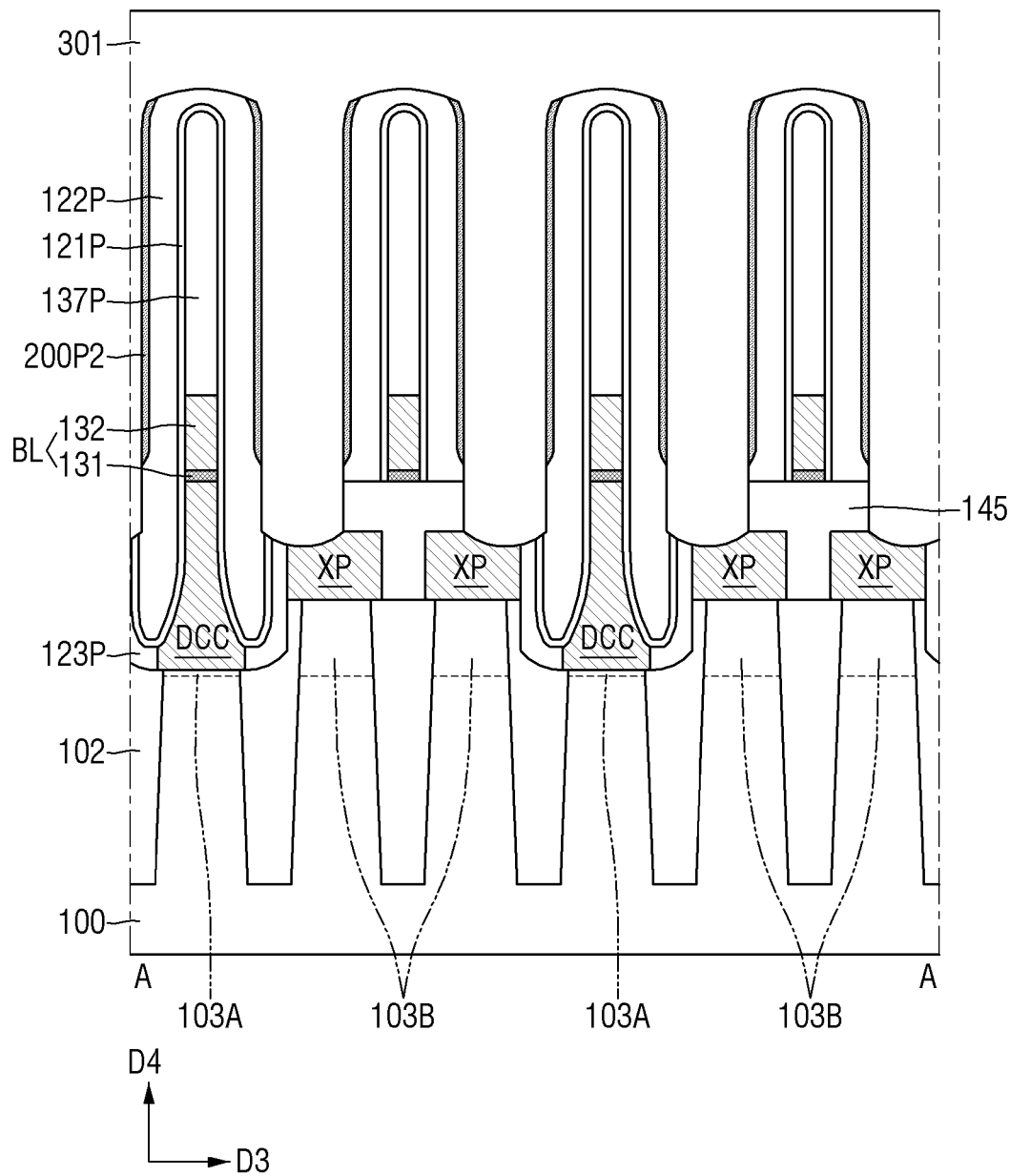
Figure 24:
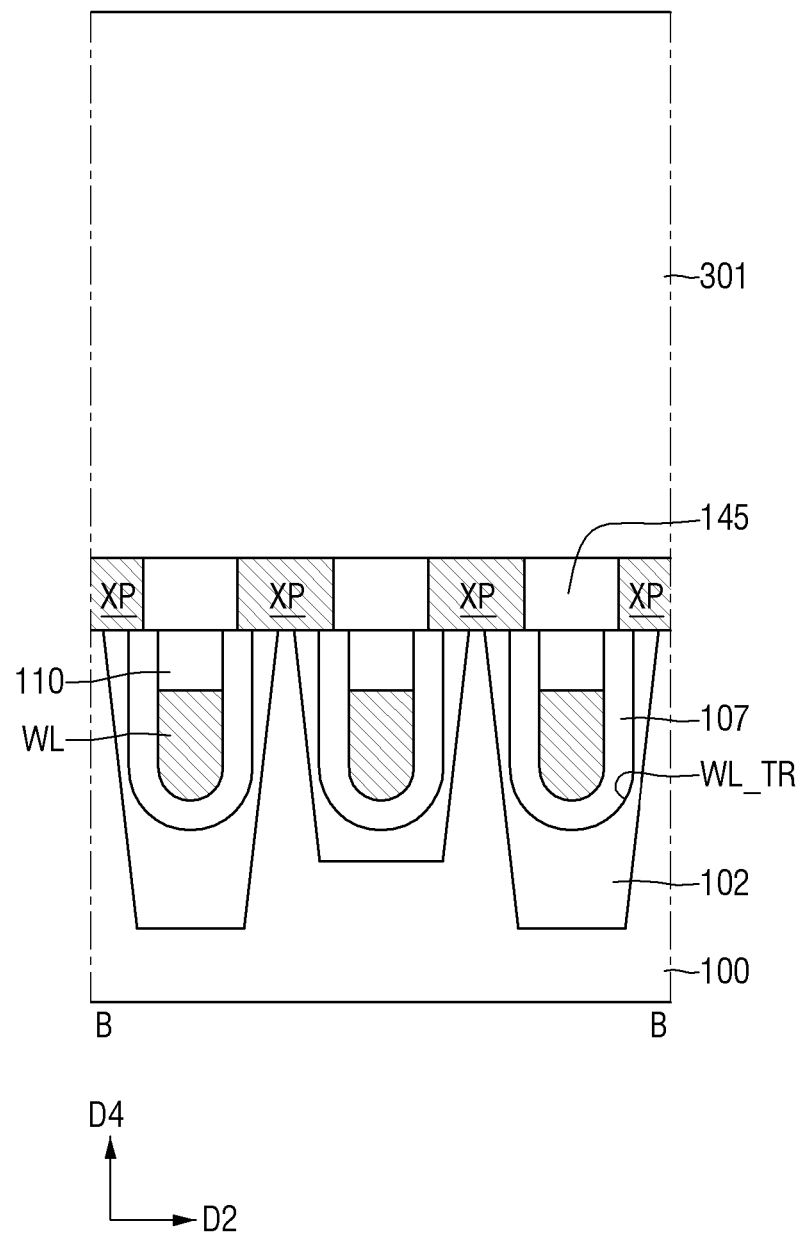
Figure 25:
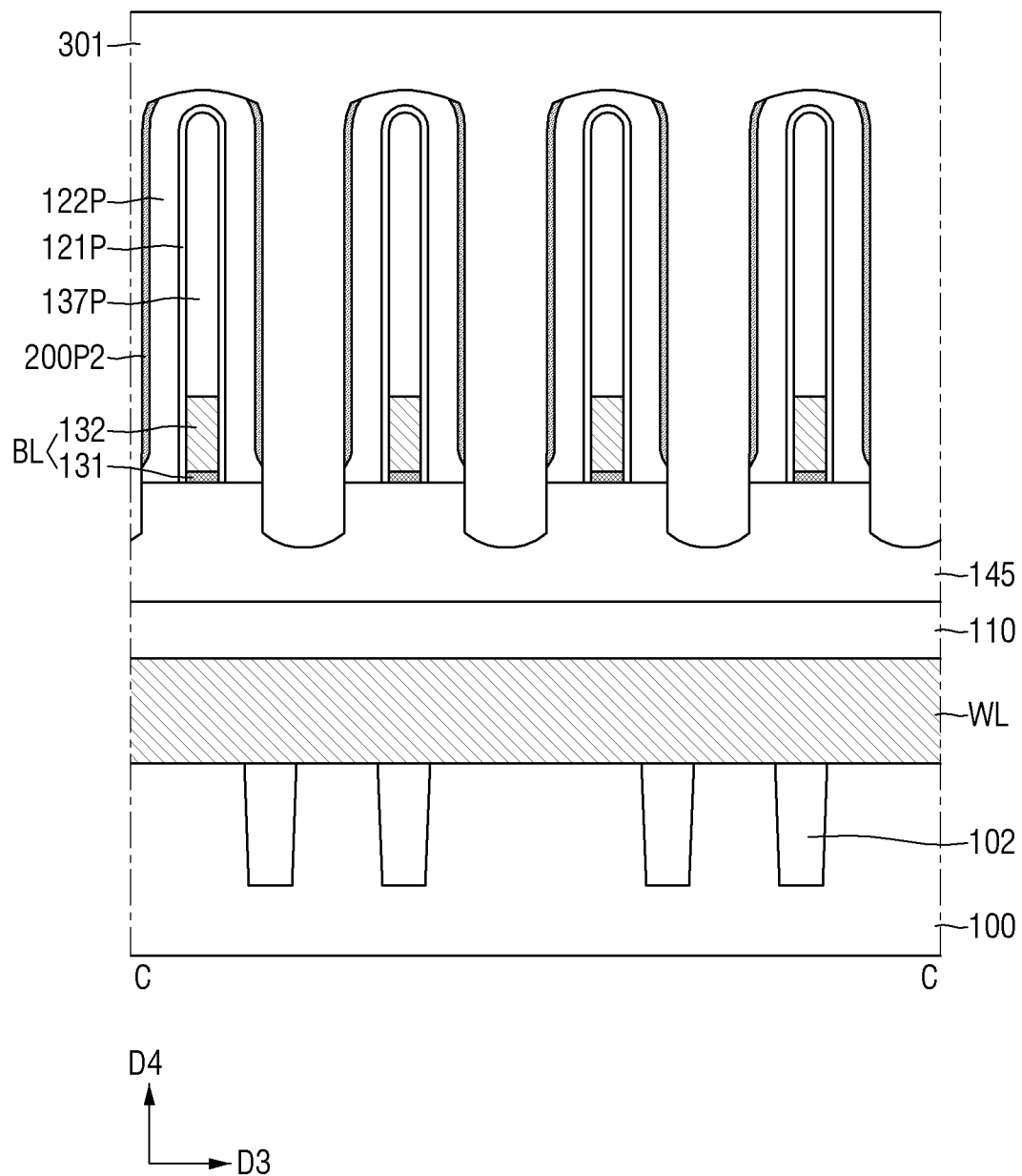

Referring to FIGS. 23 to 25, a first insulating layer 301 may be formed on the second pre-passivation layer 200P2, the pre-spacer liners 121P, the first pre-spacers 122P, and the pad separation patterns 145.

The first insulating layer 301 may fill the first storage contact trenches 160T1. For example, the first insulating layer 301 may include silicon oxide, but embodiments are not limited to this case.

Figure 26:
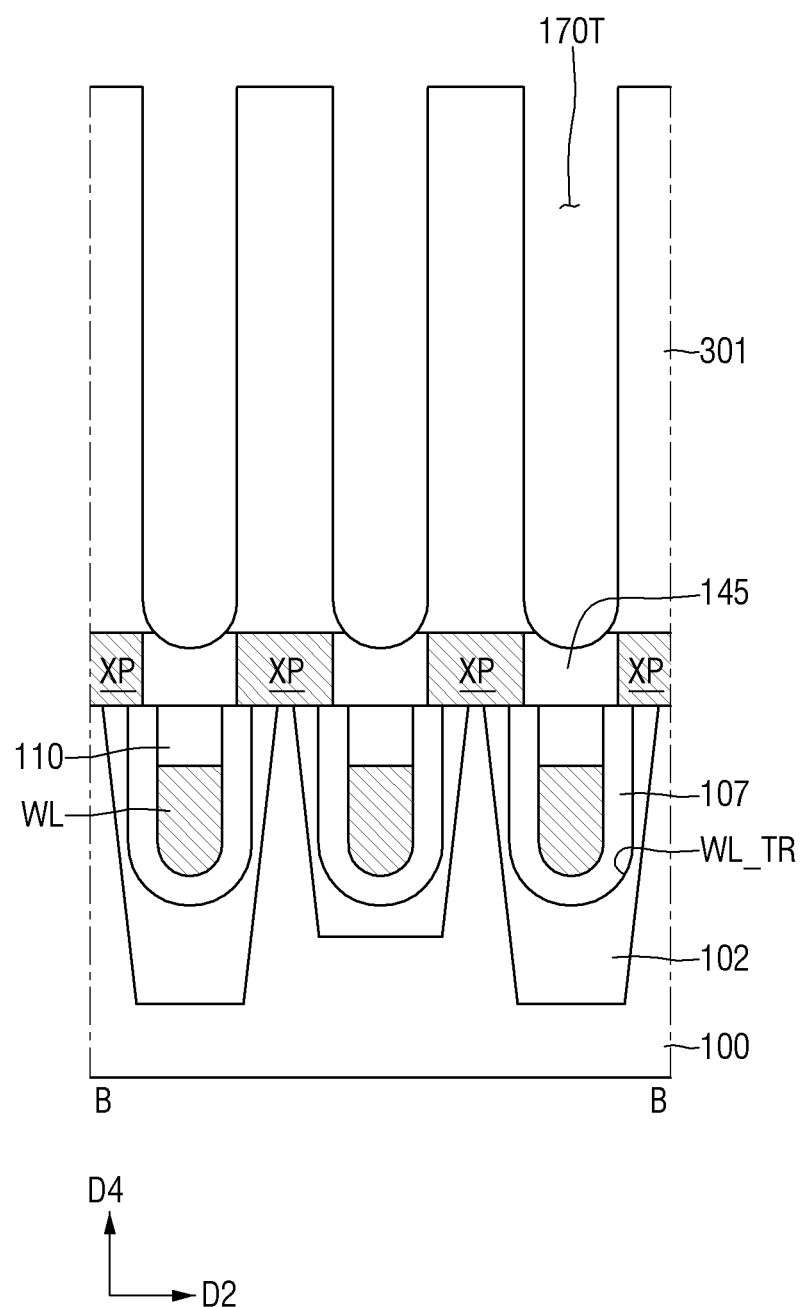
Figure 27:
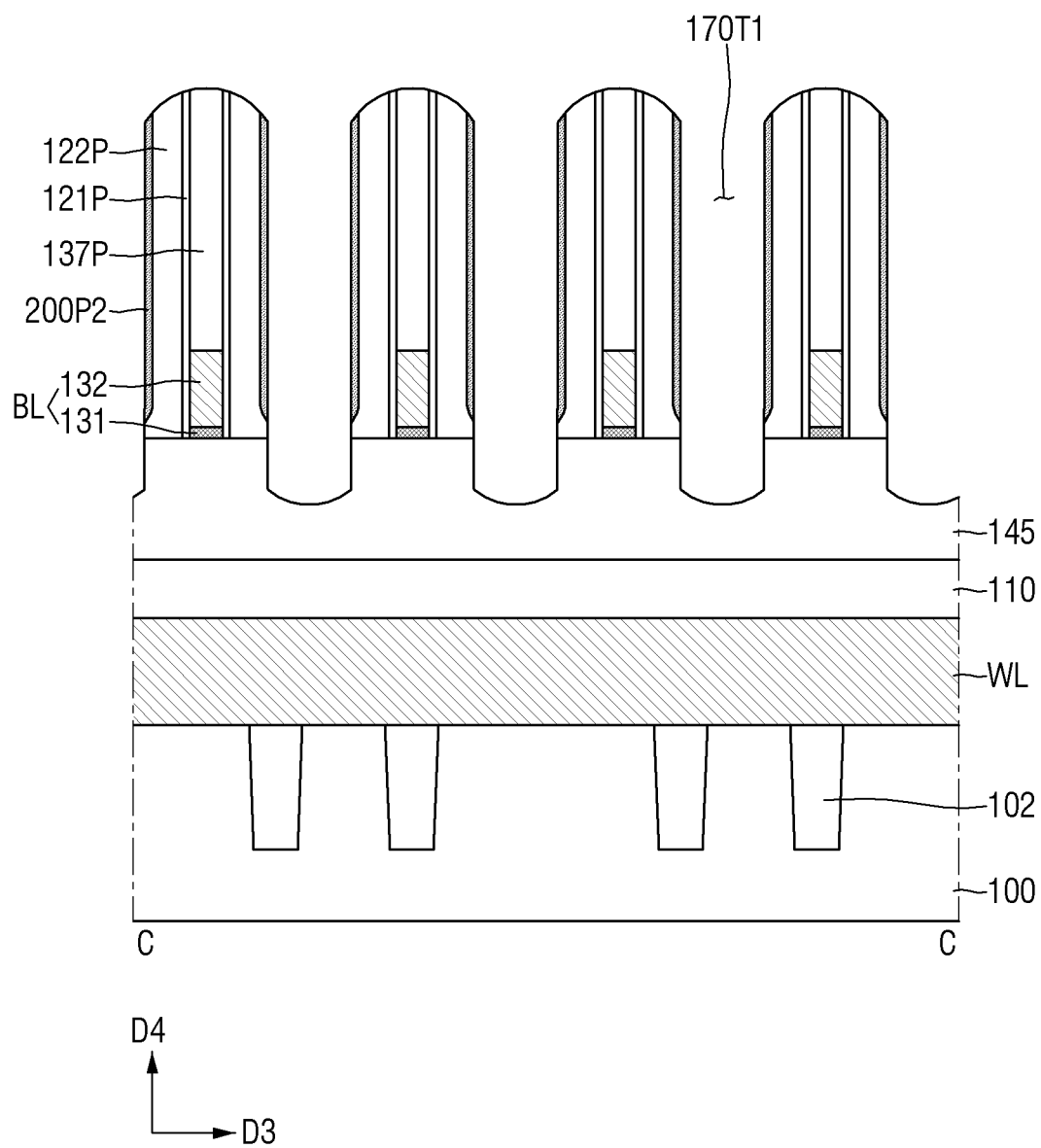

Referring to FIGS. 26 and 27, first fence pattern trenches 170T1 may be formed.

The first fence pattern trenches 170T1 may be formed on the pad separation patterns 145. The first fence pattern trenches 170T1 may expose the pad separation patterns 145.

For example, referring to FIGS. 25 and 27, the first fence pattern trenches 170T1 may be formed by partially etching the first insulating layer 301. In a cross-sectional view taken along the third direction D3, the first fence pattern trenches 170T1 may be formed by removing the first insulating layer 301 between the second pre-passivation layers 200P2.

The first fence pattern trenches 170T1 may be defined by the first insulating layer 301 and the pad separation patterns 145 in the second direction D2. The first fence pattern trenches 170T1 may be defined by the second pre-passivation layers 200P2, the first pre-spacers 122P, and the pad separation patterns 145 in the third direction D3.

Figure 28:
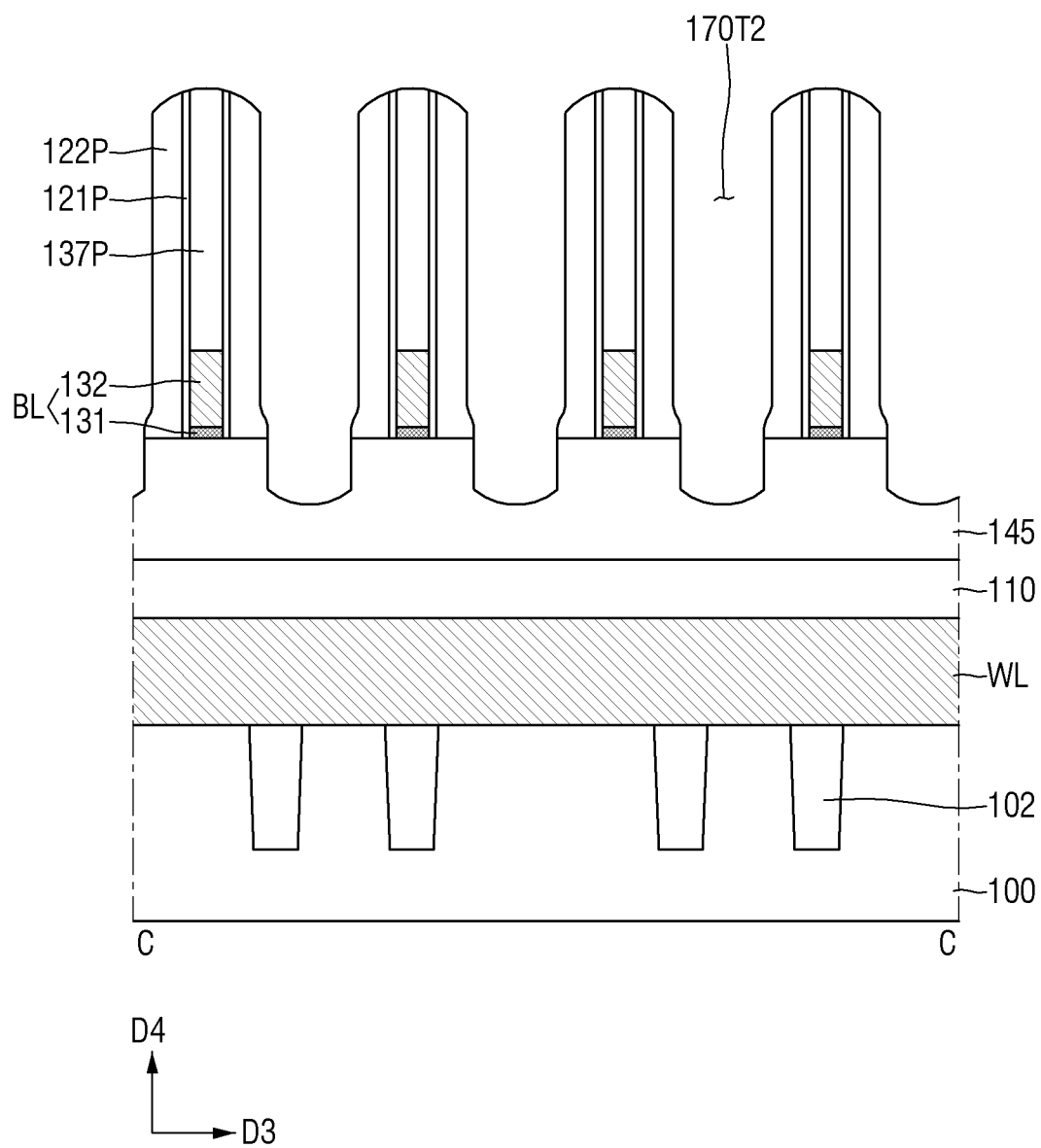

Referring to FIG. 28, the second pre-passivation layers 200P2 exposed by the first fence pattern trenches 170T1 may be removed.

As the second pre-passivation layers 200P2 are removed, second fence pattern trenches 170T2 may be formed.

As the second pre-passivation layers 200P2 are removed, each of the first pre-spacers 122P may be partially removed. A surface of each of the first pre-spacers 122P on which the second pre-passivation layer 200P2 is disposed may be partially removed. As the second pre-passivation layers 200P2 are removed, the second fence pattern trenches 170T2 may each have a bent or curved shape.

Figure 29:
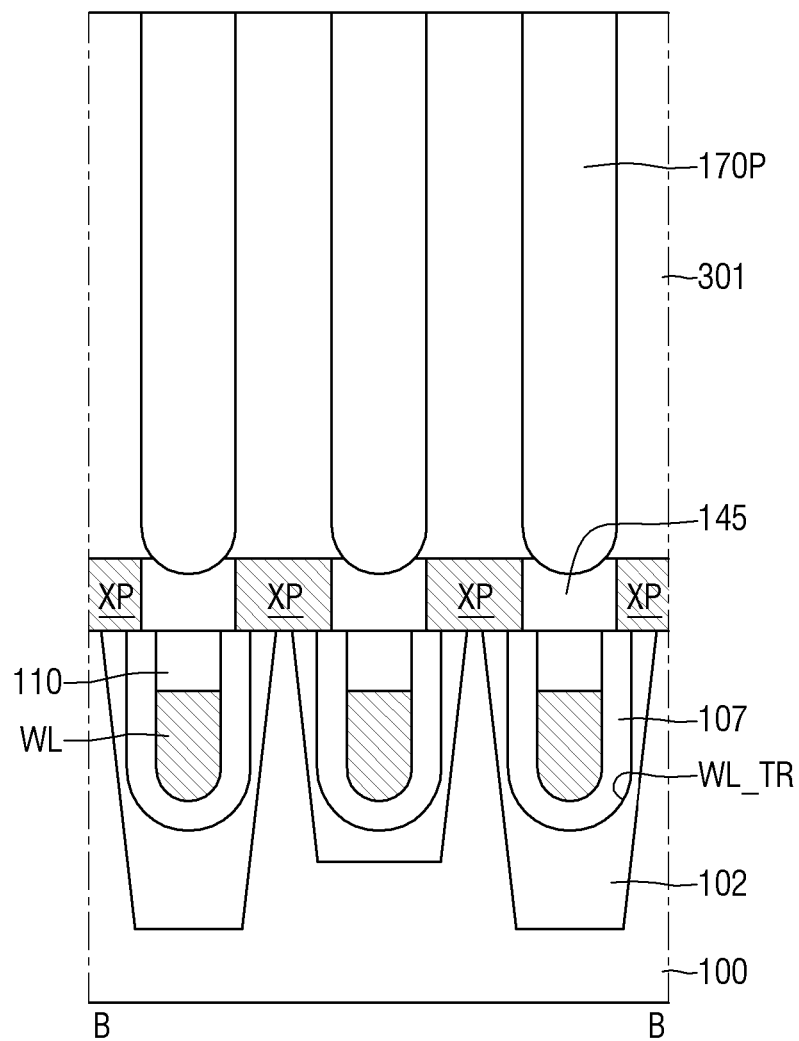
Figure 29:
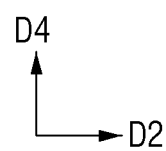
Figure 30:
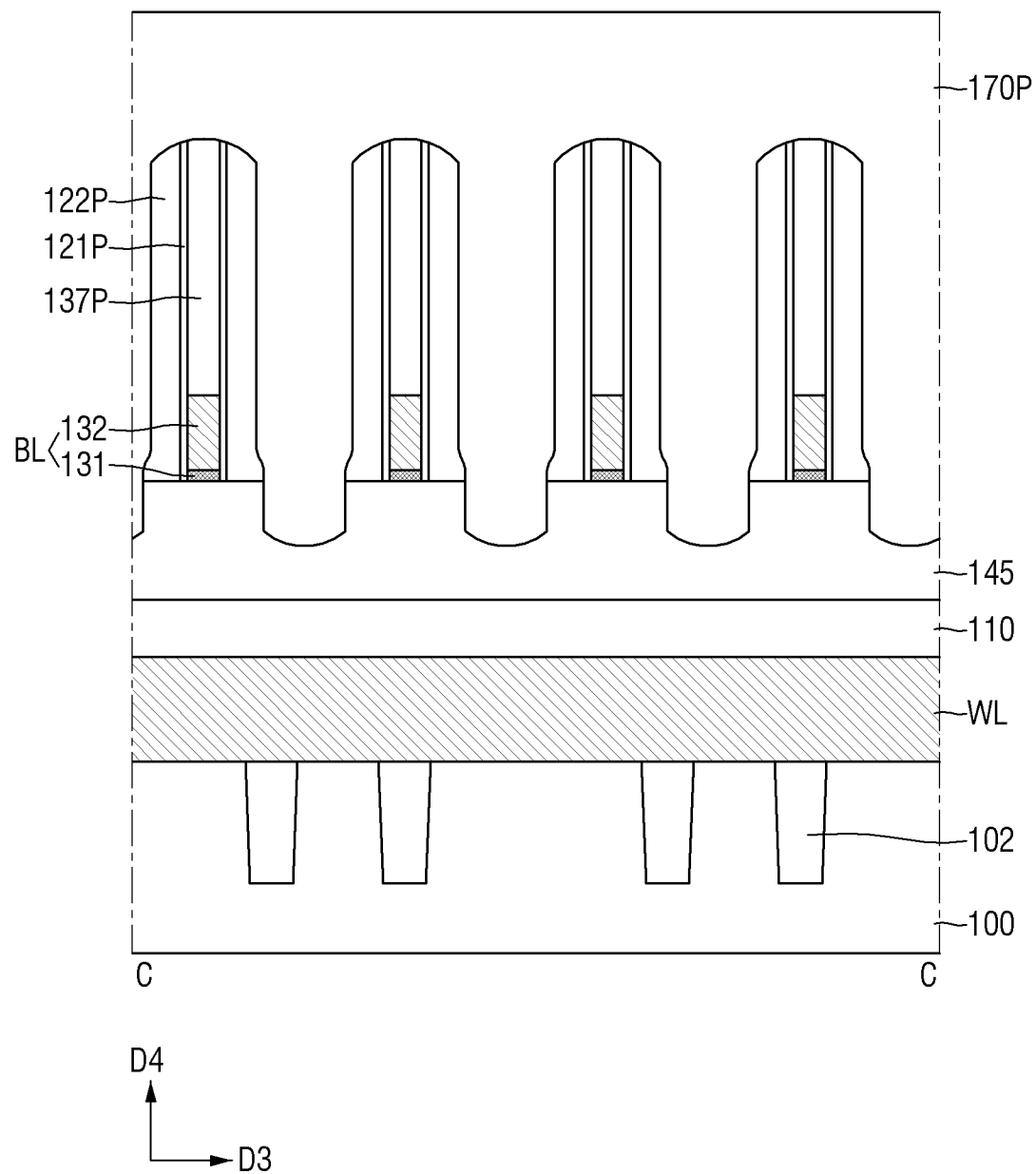

Referring to FIGS. 29 and 30, pre-fence patterns 170P may be formed.

The pre-fence patterns 170P may be filled in the second fence pattern trenches 170T2.

Specifically, referring to FIGS. 26 and 29, the pre-fence patterns 170P may be filled in the first fence patterns 170T1 formed in the first insulating layer 301. Referring to FIGS. 28 and 30, the pre-fence patterns 170P may be filled in the second fence pattern trenches 170T2 formed between the first pre-spacers 122P on the pad separation patterns 145 in the third direction D3.

Figure 31:
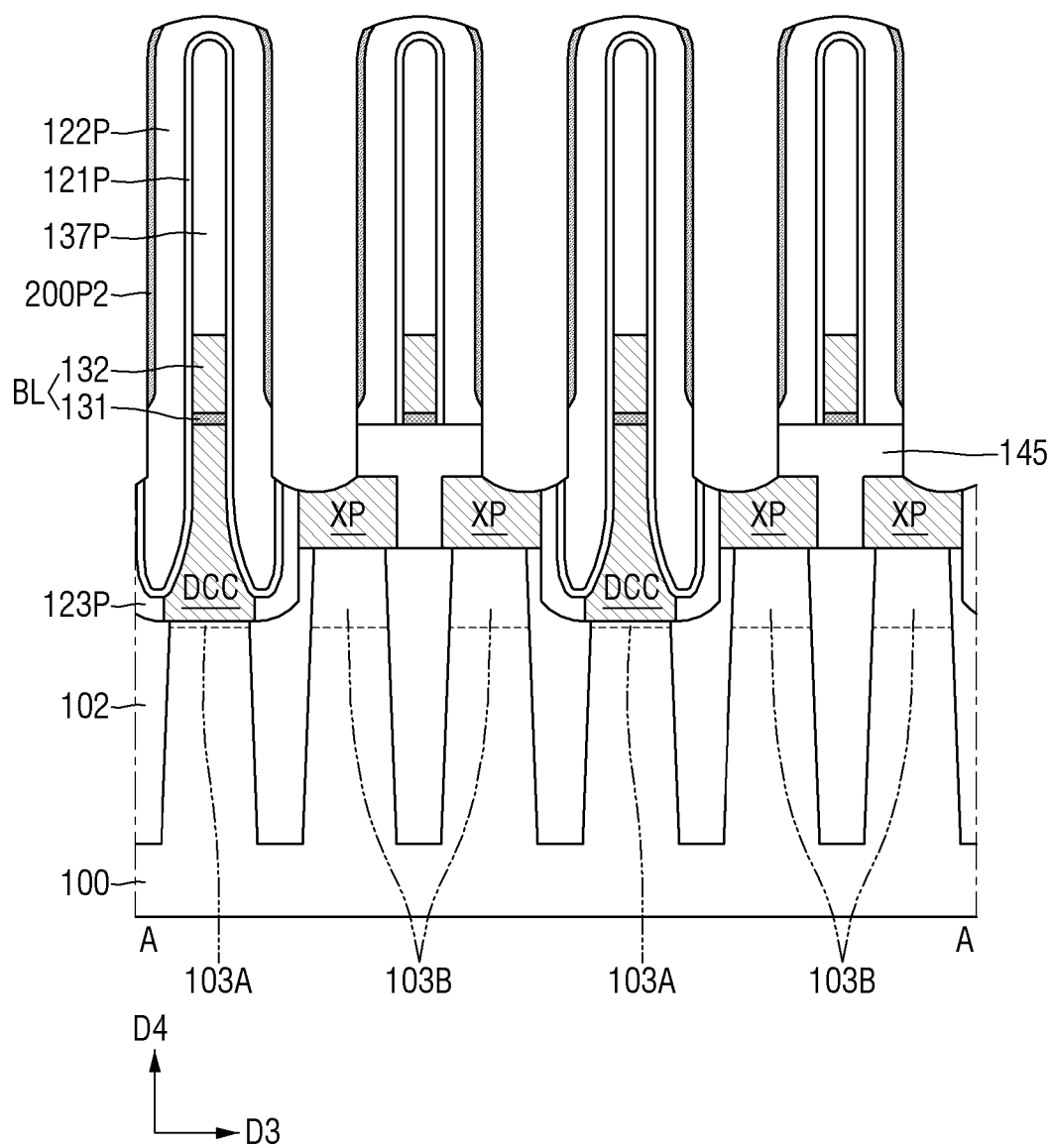
Figure 32:
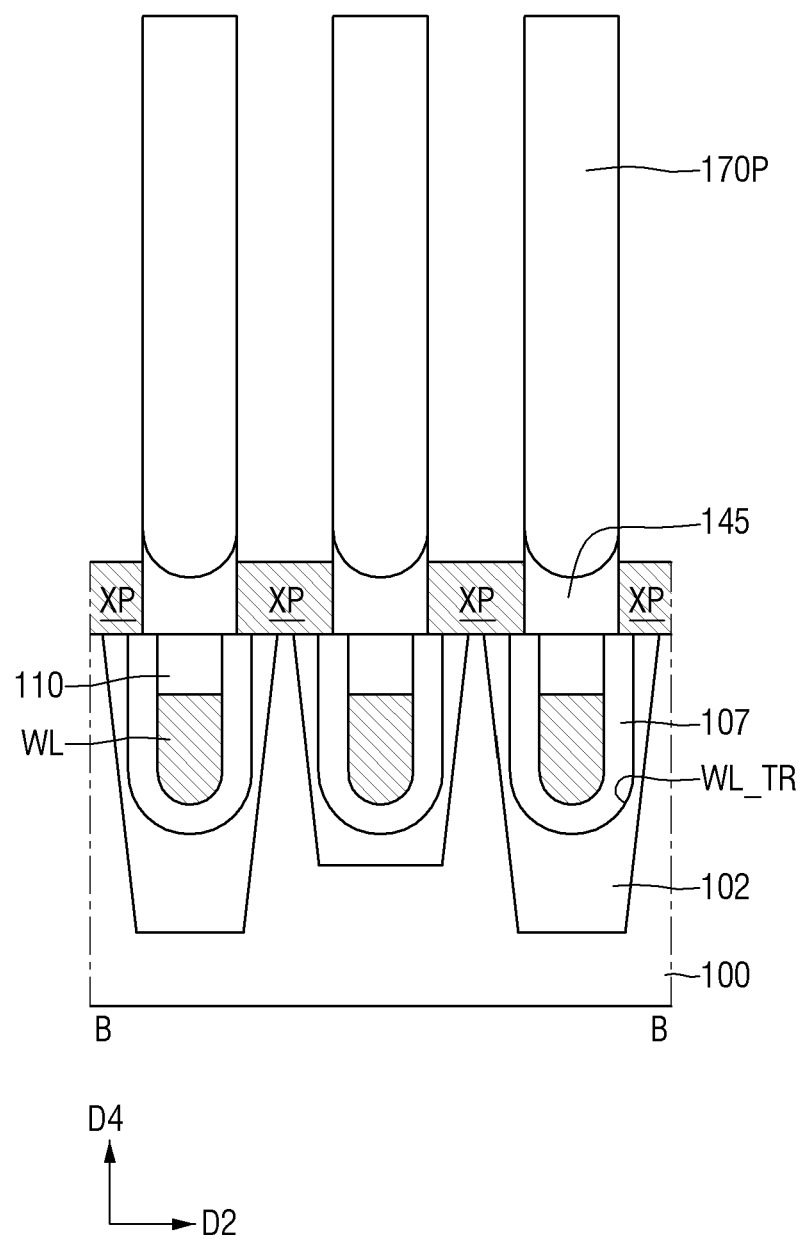

Referring to FIGS. 31 and 32, the first insulating layer 301 may be removed.

Specifically, referring to FIGS. 23 and 31, the first insulating layer 301 on the second pre-passivation layers 200P2 may be removed. Referring to FIGS. 29 and 32, the first insulating layer 301 between the pre-fence patterns 170P may be removed.

Referring to FIG. 33, the second pre-passivation layers 200P2 may be completely removed.

Specifically, referring to FIGS. 31 and 33, the second pre-passivation layers 200P2 on the first pre-spacers 122P may be removed. As the second pre-passivation layers 200P2 are removed, second storage contact trenches 160T2 may be formed. The second storage contact trenches 160T2 may each have a bent or curved profile.

Figure 34:
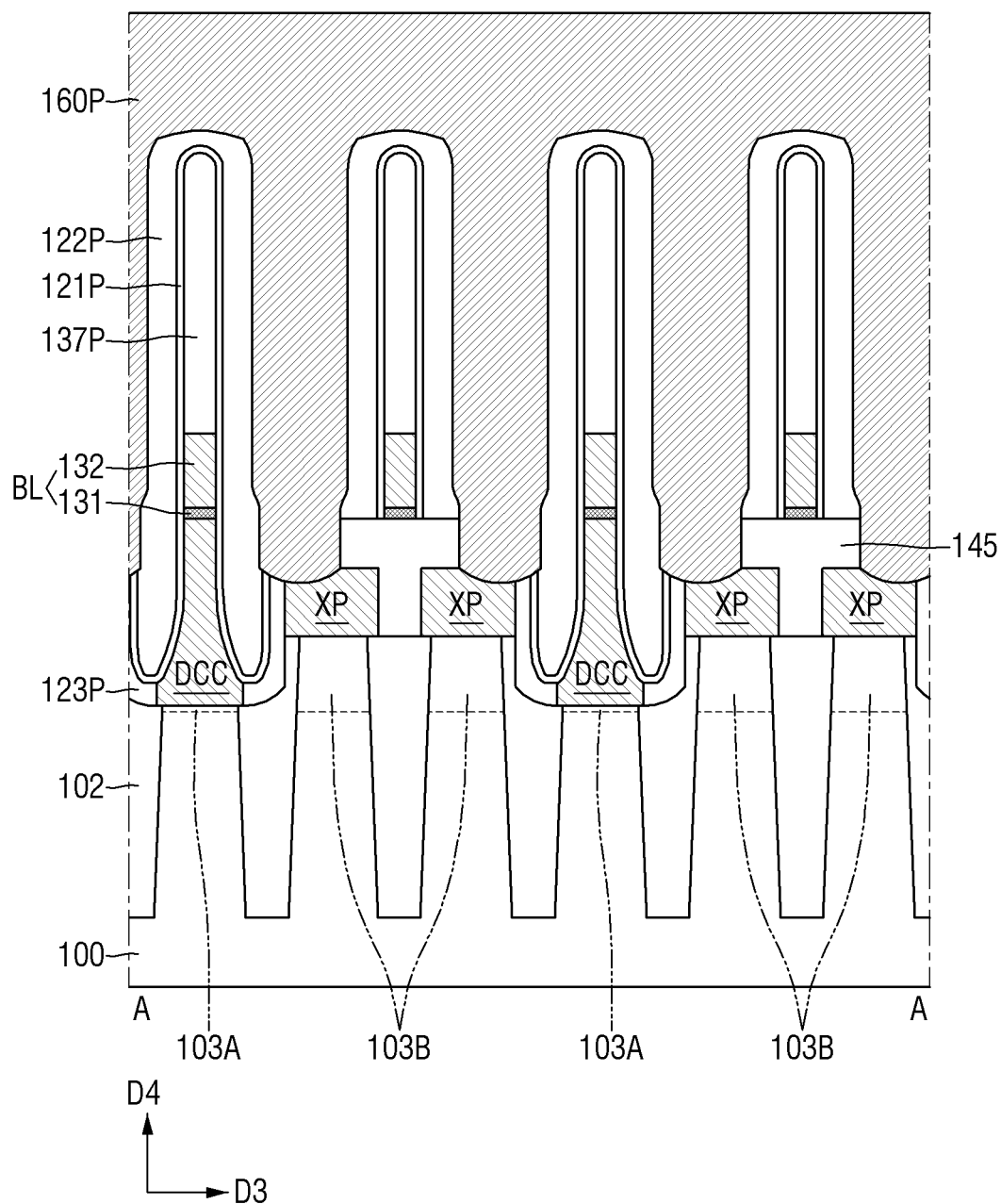
Figure 35:
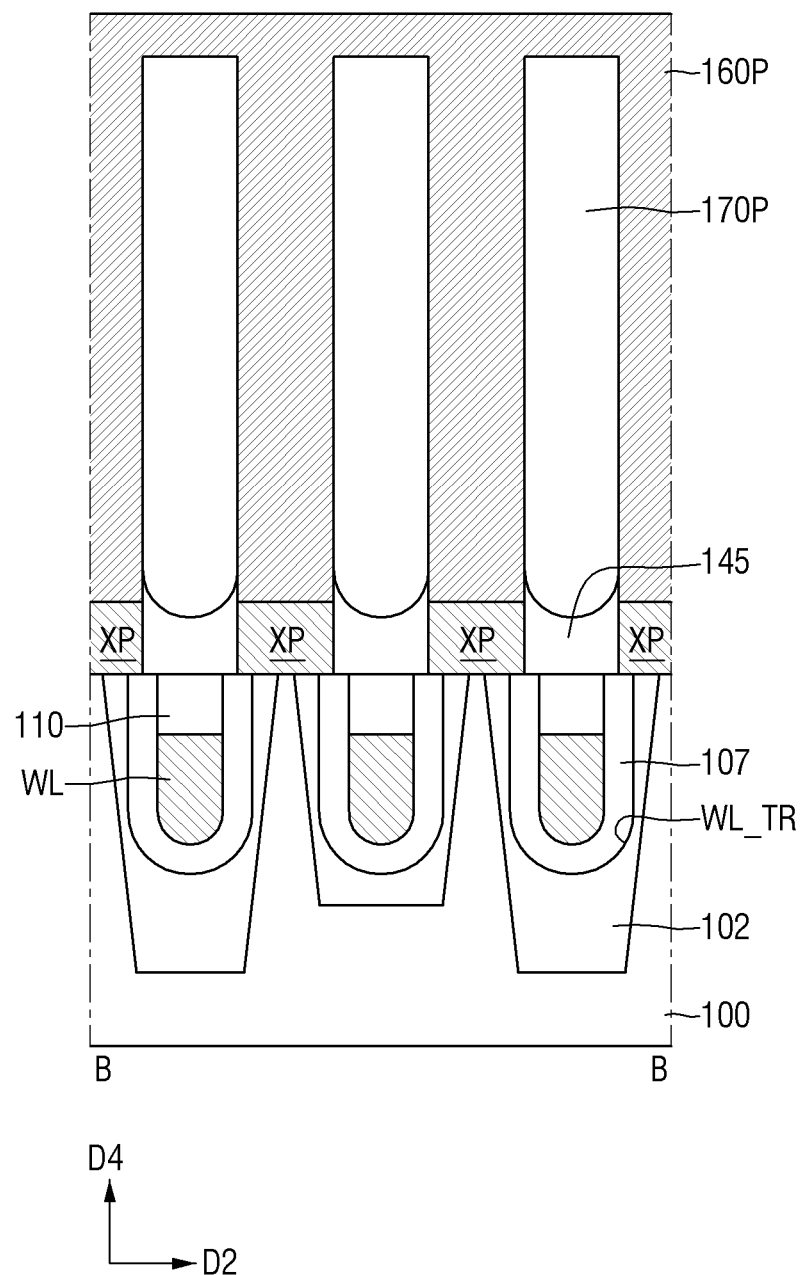

Referring to FIGS. 34 and 35, a pre-storage contact 160P may be formed.

The pre-storage contact 160P may be filled in the second storage contact trenches 160T2. The pre-storage contact 160P may be formed along the bent or curved profiles of the second storage contact trenches 160T2. Accordingly, the pre-storage contact 160P may have bent or curved side surfaces.

The pre-storage contact 160P may be disposed between the pre-fence patterns 170P in the second direction D2. The pre-storage contact 160P may be disposed between the bit lines BL, between the bit line contacts DCC, and between the first pre-spacers 122P in the third direction D3.

Then, referring to FIG. 3, the landing pads LP, the landing pad separation patterns 180, the etch stop layers 140, and the capacitors CAP may be sequentially formed.

FIGS. 36 to 39 are views illustrating intermediate stages of fabrication, provided to explain a method of fabricating a semiconductor memory device according to some embodiments. For reference, FIGS. 36 to 39 are views for describing a method of fabricating the semiconductor memory device shown in FIG. 14. Also, FIGS. 36 to 39 are views illustrating stages following the intermediate stage shown in FIG. 31. For ease of description, differences from the embodiments of FIGS. 18 to 35 will be mainly described.

Figure 36:
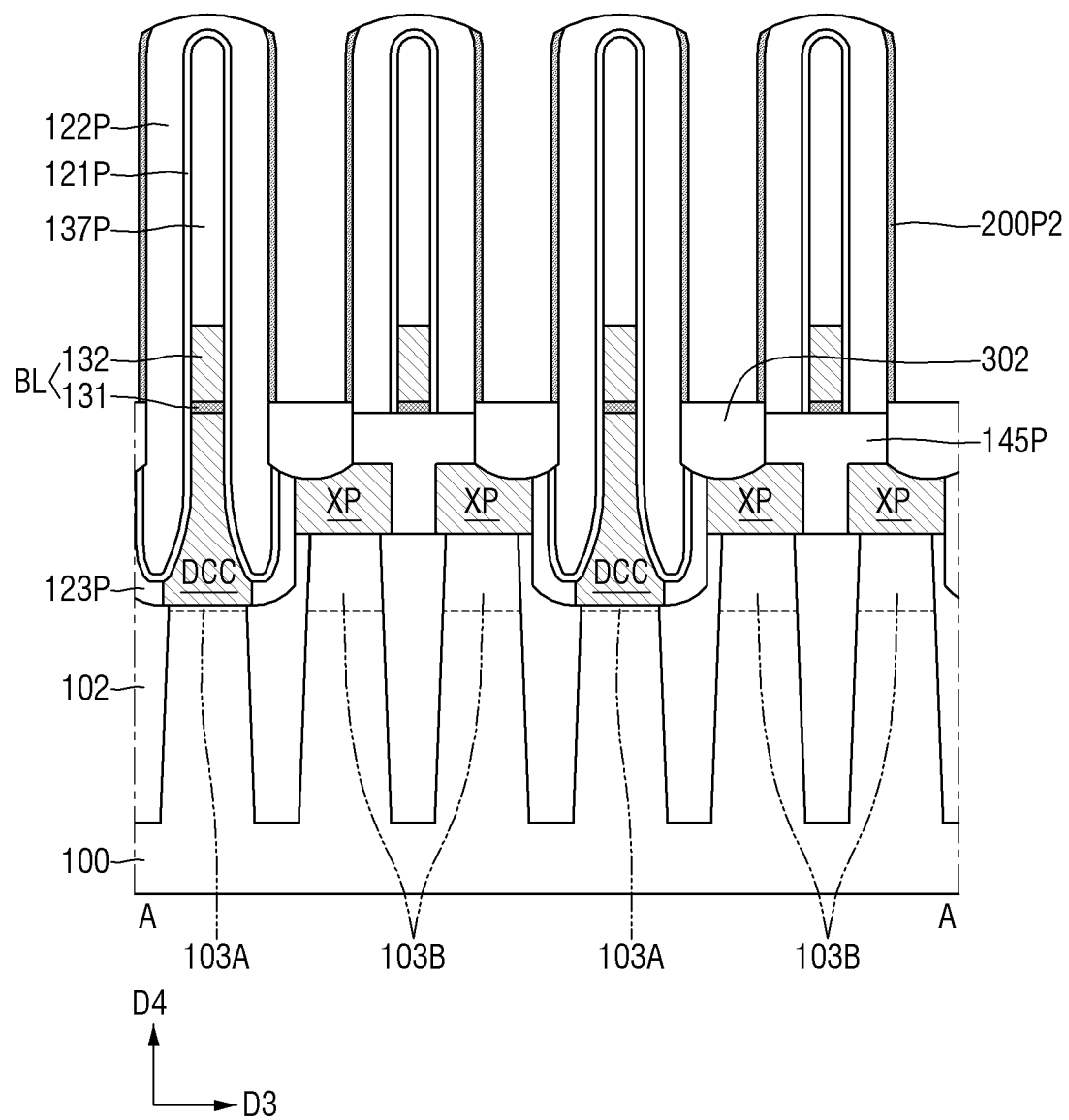
FIGS. 36 to 39 are cross-sectional views illustrating intermediate stages of fabrication method of a semiconductor memory device according to some embodiments.

Referring to FIGS. 31 and 36, second insulating layers 302 may be formed on the node pads XP.

The second insulating layers 302 may be formed on the node pads XP that are exposed by partially removing a lower portion of the first pre-passivation layer 200P1 (see FIG. 19). The second insulating layers 302 may be formed below the second pre-passivation layers 200P2.

Figure 37:
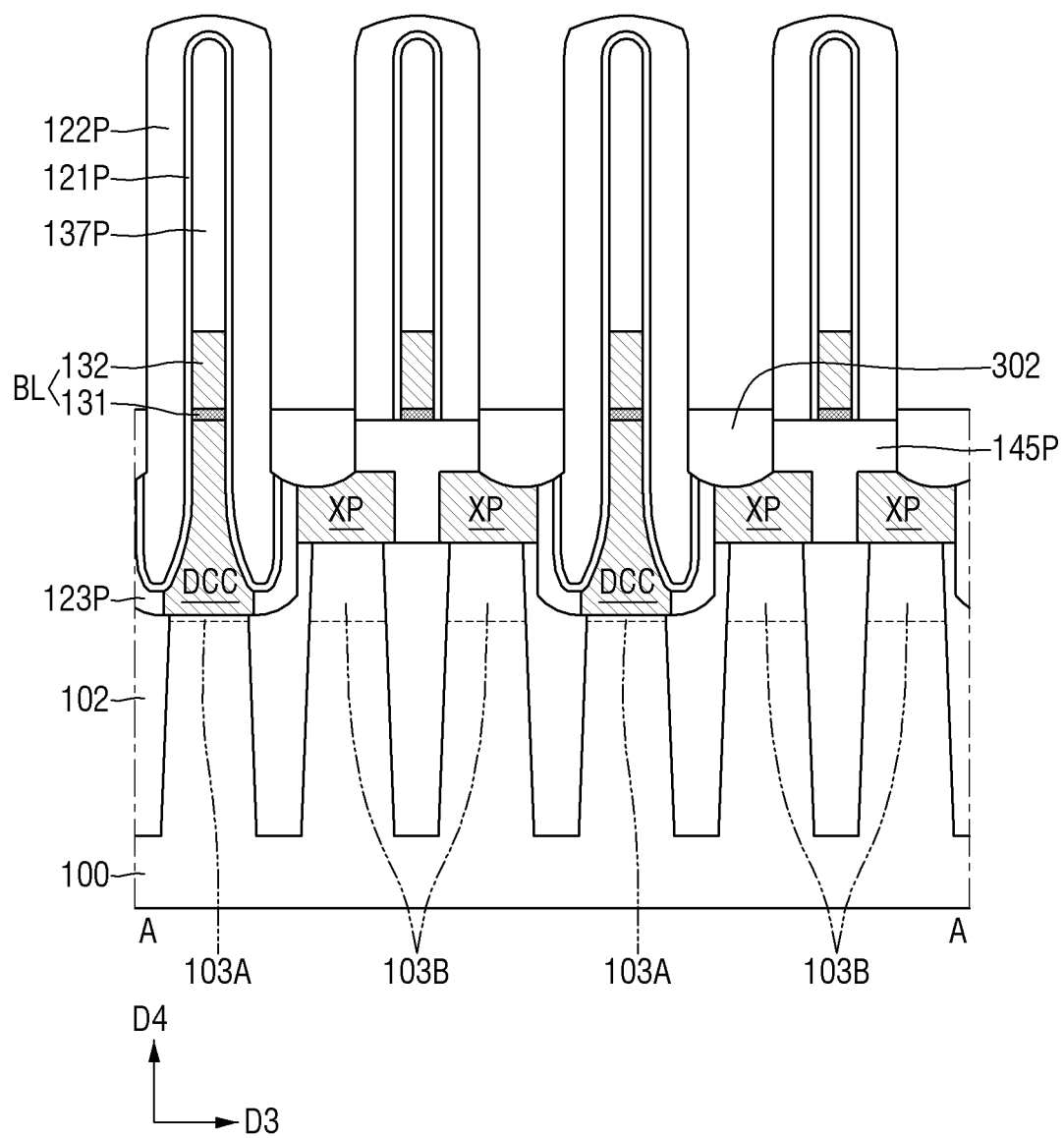

Referring to FIG. 37, the second pre-passivation layers 200P2 may be removed.

The second pre-passivation layers 200P2 on the second insulating layers 302 may be removed. The second insulating layers 302 may prevent the node pads XP from being removed together when the second pre-passivation layers 200P2 are removed.

Figure 38:
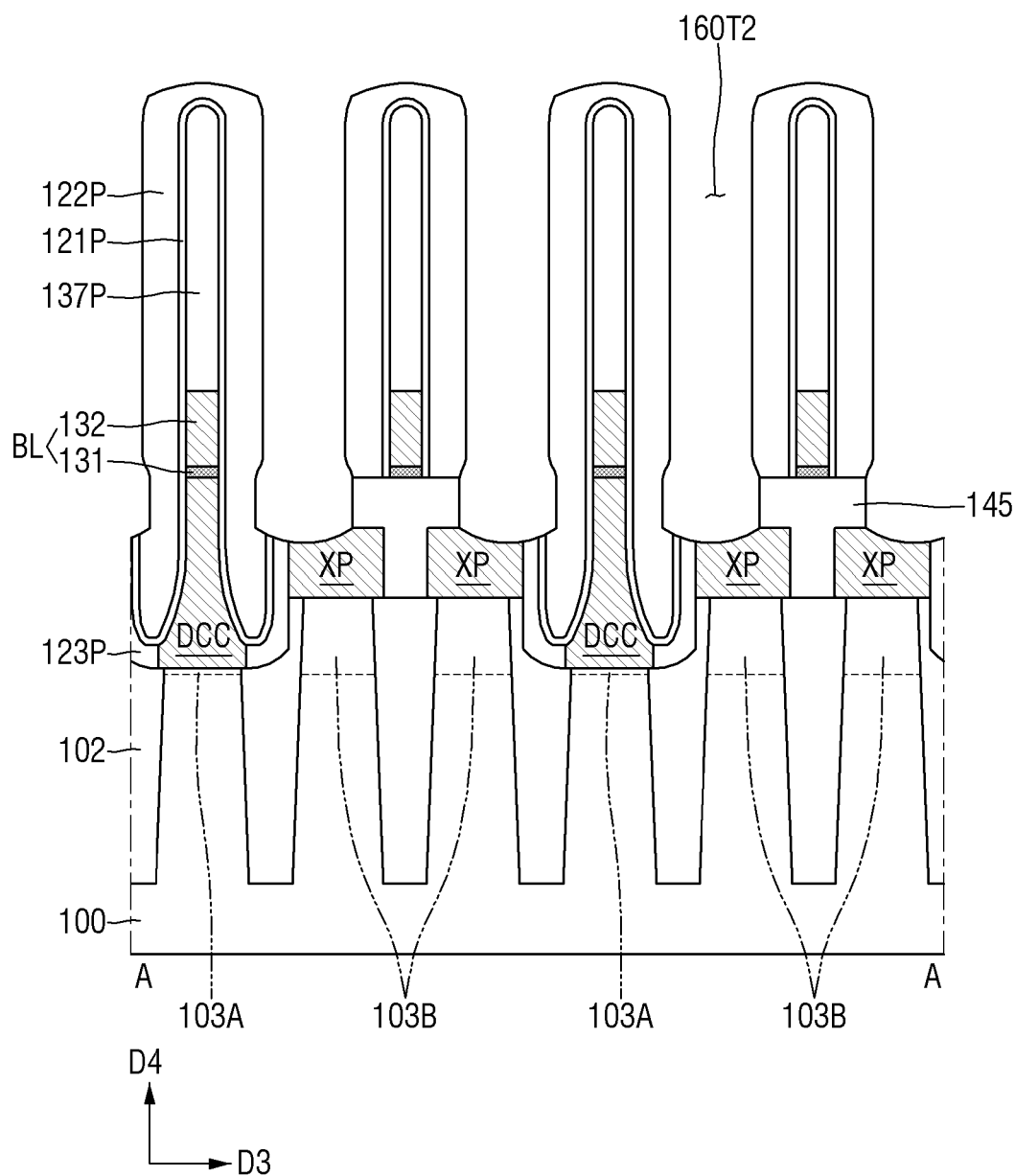

Referring to FIG. 38, the second insulating layers 302 may be removed.

As the second insulating layers 302 are removed, second storage contact trenches 160T2 may be formed. As the second insulating layers 302 are removed, each of the first pre-spacers 122P may be partially removed. Accordingly, the second storage contact trenches 160T2 may each have a bent or curved profile. Specifically, the surface of the pre-first spacer 122P that is covered by the second insulating layer 302 may be further removed than the surface of the pre-first spacer 122P that is covered by the second pre-passivation layer 200P2. The second storage contact trenches 160T2 may each have a shape in which a lower portion is more recessed toward the bit line BL than an upper portion.

Figure 39:
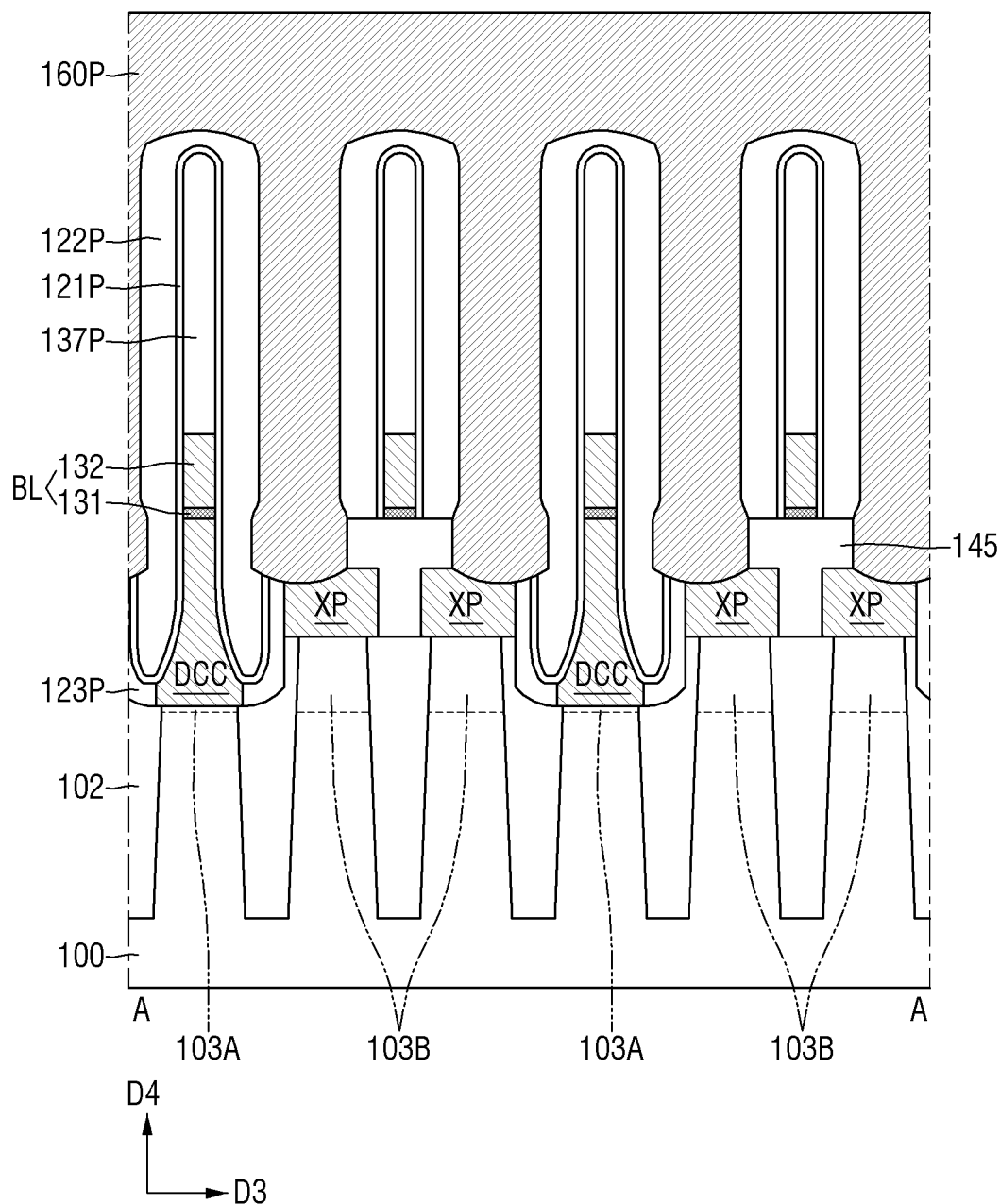

Referring to FIG. 39, a pre-storage contact 160P may be formed.

The pre-storage contact 160P may be filled in the second storage contact trenches 160T2. The pre-storage contact 160P filled in each of the second storage contact trenches 160T2 may have a lower portion wider than the other portion. That is, the pre-storage contact 160P may have a bent or curved side surface on each of the pre-first spacers 122P.

Then, referring to FIG. 3, the landing pads LP, the landing pad separation patterns 180, the etch stop layers 140, and the capacitors CAP may be sequentially formed.

FIGS. 40 to 43 are views illustrating intermediate stages of fabrication, provided to explain a method of fabricating a semiconductor memory device according to some embodiments. For reference, FIGS. 40 to 43 are views for describing a method of fabricating the semiconductor memory device shown in FIG. 16. Also, FIGS. 40 to 43 are views illustrating stages following the intermediate stage shown in FIG. 31. For ease of description, differences from the embodiments of FIGS. 36 to 39 will be mainly described.

Figure 40:
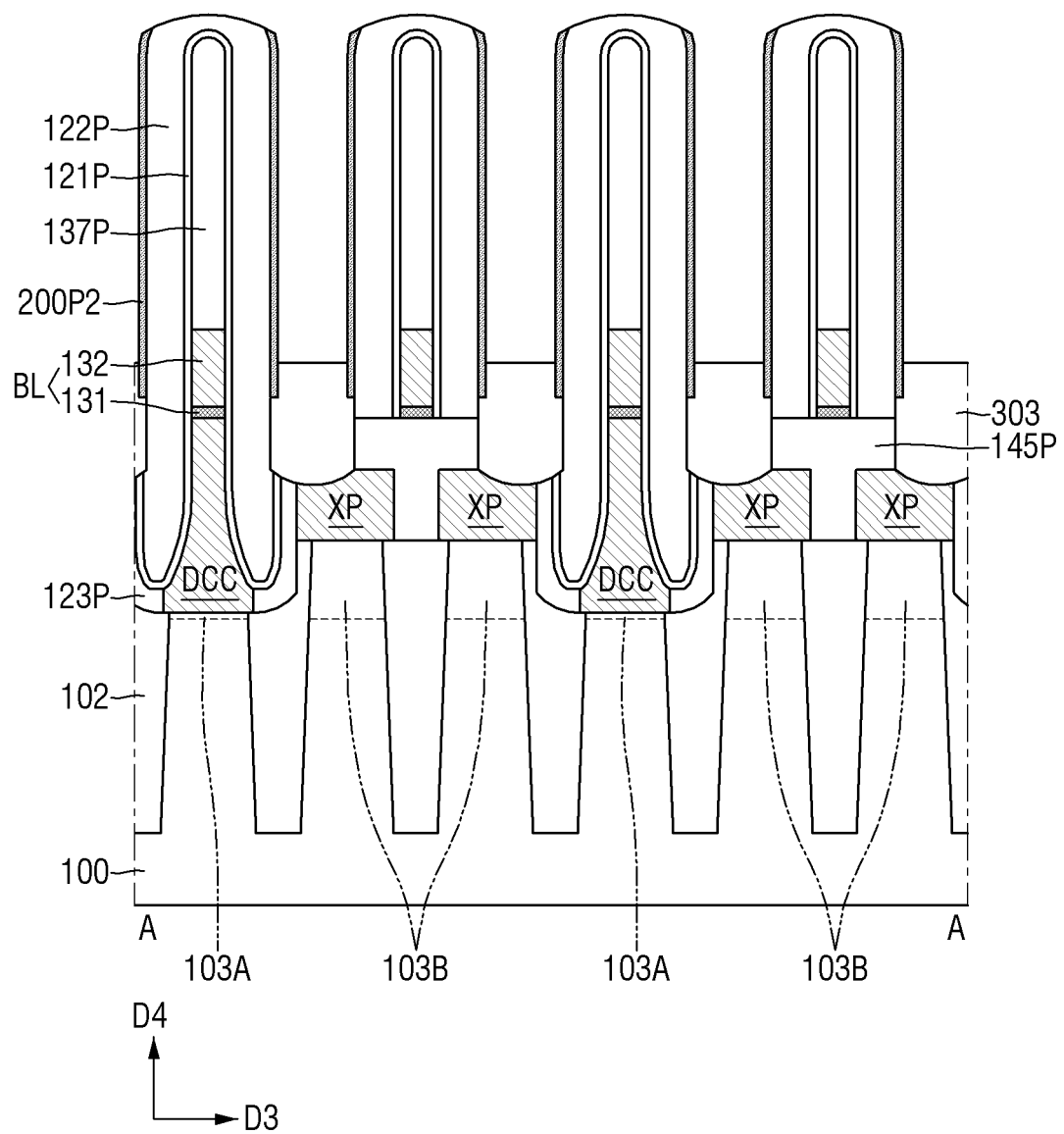
FIGS. 40 to 43 are cross-sectional views illustrating intermediate stages of fabrication method of a semiconductor memory device according to some embodiments

Referring to FIGS. 31 and 40, third insulating layers 303 may be formed on the node pads XP.

The third insulating layers 303 may be formed on the node pads XP that are exposed by partially removing a lower portion of the first pre-passivation layer 200P1 (see FIG. 19). The third insulating layers 303 may overlap parts of the second pre-passivation layers 200P2. The third insulating layers 303 may cover lower sides of the second pre-passivation layers 200P2. That is, an upper surface of each of the third insulating layers 303 may be formed higher than the lower side of each of the second pre-passivation layers 200P2.

Figure 41:
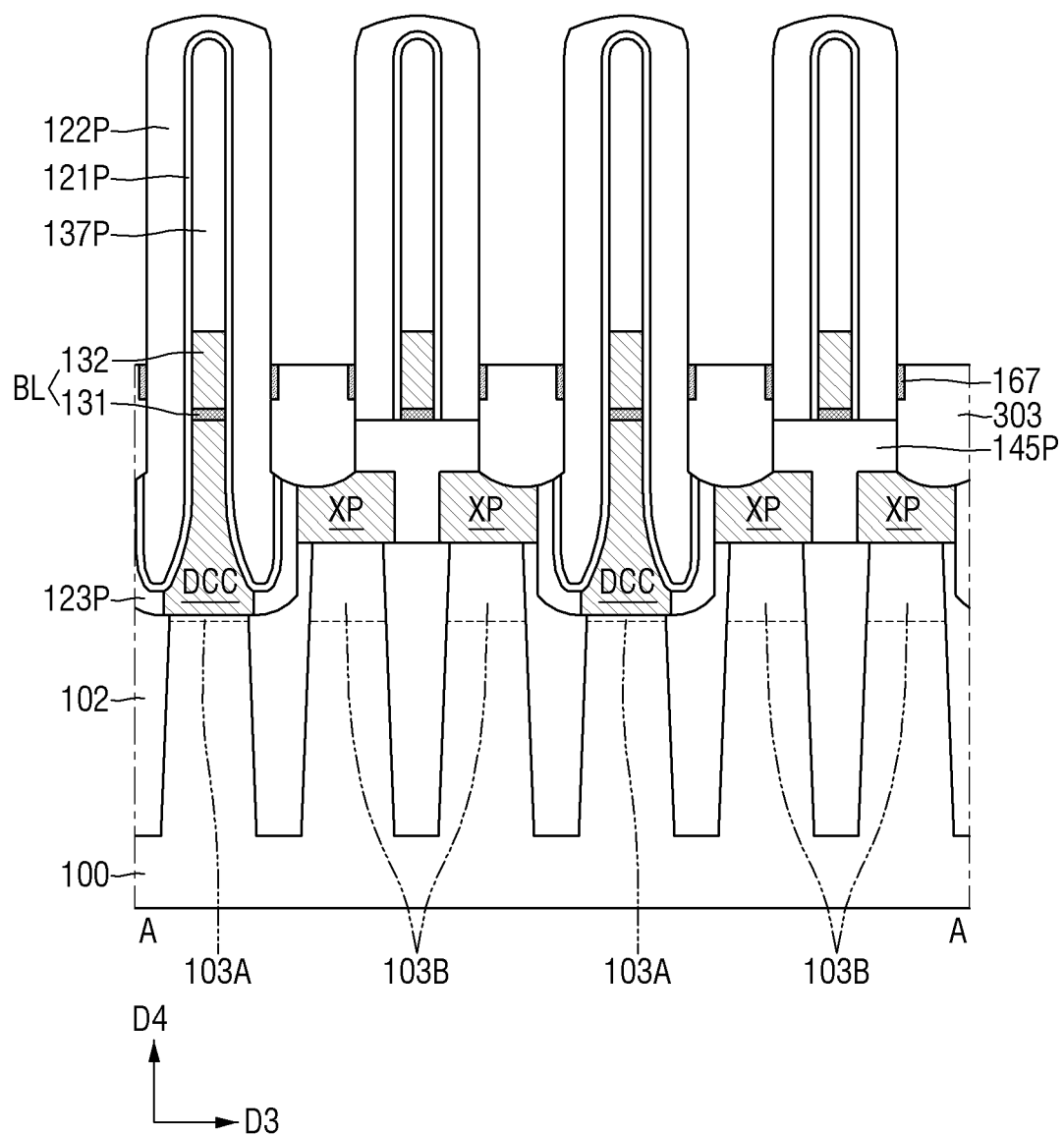

Referring to FIG. 41, the second pre-passivation layers 200P2 may each be partially removed.

Specifically, the second pre-passivation layers 200P2 disposed above the third insulating layers 303 may be removed.

Figure 42:
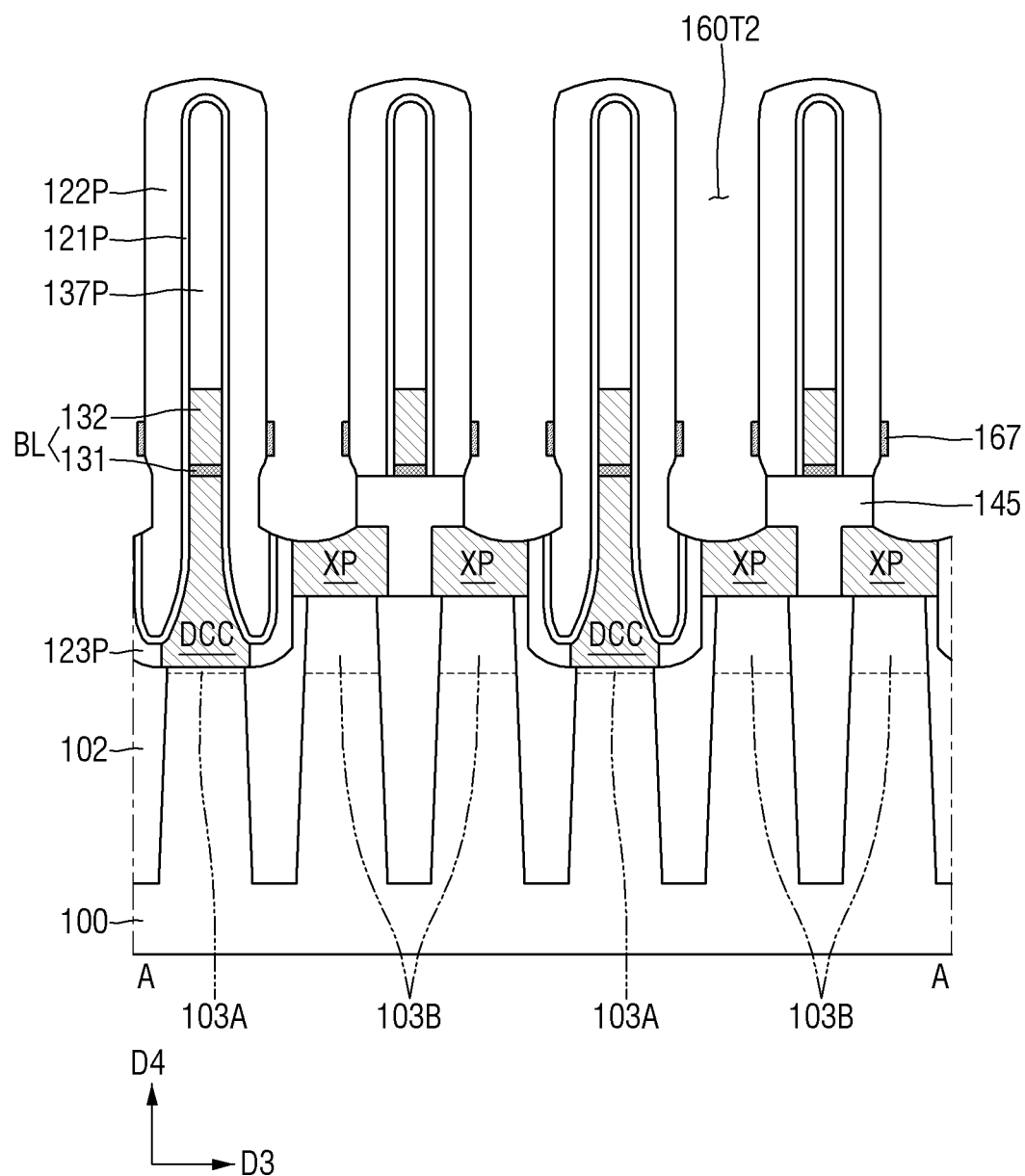

Referring to FIG. 42, the third insulating layers 303 may be removed.

As the third insulating layers 303 are removed, second storage contact trenches 160T2 may be formed. Lower passivation layers 167 may be formed within the second storage contact trenches 160T2. The lower passivation layers 167 covered by the third insulating layers 303 may be exposed by the second storage contact trenches 160T2.

Figure 43:
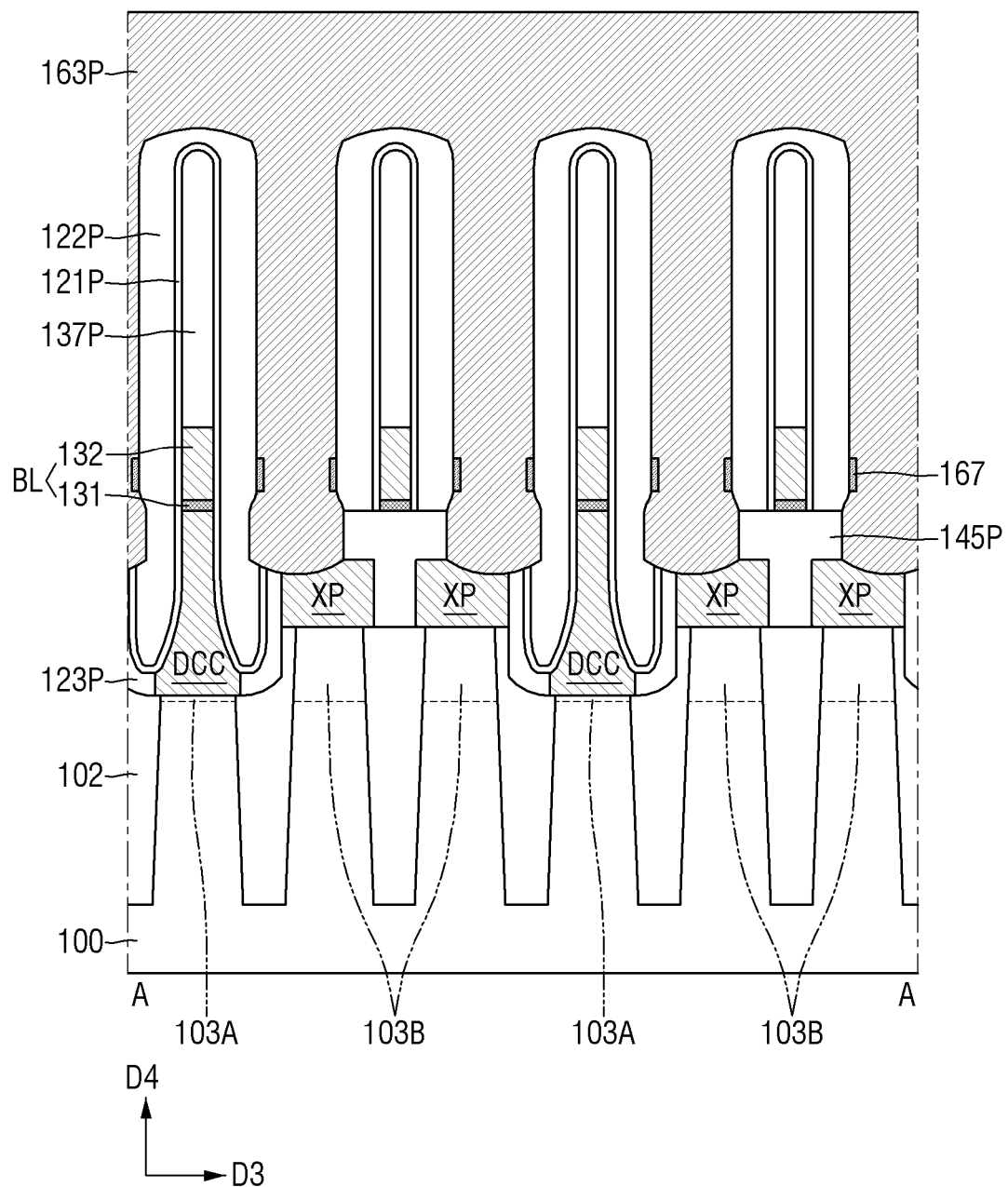

Referring to FIG. 43, a pre-contact layer 163P may be formed.

The pre-contact layer 163P may be formed to be filled in the second storage contact trenches 160T2. The pre-contact layer 163P may cover the lower passivation layers 167.

Then, referring to FIG. 3, the landing pads LP, the landing pad separation patterns 180, the etch stop layers 140, and the capacitors CAP may be sequentially formed.

Herein, a lower side, a lower portion, a lower surface, and the like, are used to refer to a direction toward a substrate in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an intermediate layer as well as a direct connection between two components with or without intervening layers or components. In addition, "electrically connected" conceptually includes a physical connection and a physical disconnection. It can be understood that when an element is referred to with terms such as "first" and "second", the element is not limited thereby. They may be used only for a purpose of distinguishing an element from the other elements, and may not limit the sequence or importance of the elements. In some cases, a first element may be referred to as a second element without departing from the scope of the claims set forth herein. Similarly, a second element may also be referred to as a first element.

The term "an example embodiment" used herein does not refer to the same example embodiment, and is provided to emphasize a particular feature or characteristic different from that of another example embodiment. However, example embodiments provided herein are considered to be able to be implemented by being combined in whole or in part one with one another. For example, one element described in a particular example embodiment, even if it is not described in another example embodiment, may be understood as a description related to another example embodiment, unless an opposite or contradictory description is provided therein.

In concluding the detailed description, those skilled in the art will appreciate that many variations and modifications may be made to the disclosed embodiments without substantially departing from the principles of the present invention. Therefore, the disclosed embodiments of the invention are used in a generic and descriptive sense only and not for purposes of limitation.

What is claimed is:

1. A semiconductor memory device comprising:
a substrate;
a cell isolation layer in the substrate;

an active region extending in the cell isolation layer in a first direction, wherein the active region includes a first region and a second region at opposite sides of the first region;

a bit line that extends on the substrate in a second direction that intersects with the first direction, wherein the bit line intersects the active region;

a bit line contact between the substrate and the bit line, wherein the bit line contact is electrically connected to the first region;

bit line spacers comprising a bit line spacer that is on a side surface of the bit line and on a side surface of the bit line contact;

a node pad on a lateral side of the bit line spacer on the substrate, wherein the node pad is electrically connected to the second region; and storage contacts comprising a storage contact that is on the node pad and on a side surface of the bit line spacer, wherein the storage contact includes a first part having a first width in a third direction that intersects with the first direction and the second direction and a second part below the first part, relative to a bottom surface of the substrate, and wherein the second part is electrically connected to the node pad and has a second width that is different from the first width in the third direction.

2. The semiconductor memory device of claim 1, wherein the first width is greater than the second width.

3. The semiconductor memory device of claim 1, wherein a first distance between the side surface of the bit line and a side surface of the first part in the third direction is greater than a second distance between the side surface of the bit line and a side surface of the second part in the third direction.

4. The semiconductor memory device of claim 1, wherein each of the storage contact and the node pad does not include silicide.

5. The semiconductor memory device of claim 1, wherein each of the storage contact and the node pad includes a metal material.

6. The semiconductor memory device of claim 1, wherein a bottom surface of the bit line contact is lower than a bottom surface of the node pad, relative to the bottom surface of the substrate.

7. The semiconductor memory device of claim 1, further comprising a fence pattern between the storage contacts in the second direction and between the bit line spacers in the third direction, wherein a side surface of the fence pattern extends linearly in a cross-sectional view taken along the second direction, and wherein the side surface of the fence pattern is bent or curved in a cross-sectional view taken along the third direction.

8. The semiconductor memory device of claim 1, wherein a bottom surface of the storage contact is linear in a cross-sectional view taken along the second direction.

9. The semiconductor memory device of claim 1, wherein the storage contact includes an inclined part, between the first part and the second part, defined by the first part and the second part, and having an inclined side surface.

10. The semiconductor memory device of claim 1, wherein the bit line contact has a third width at a first height from the bottom surface of the substrate and has a fourth width at a second height that is lower than the first height, relative to the bottom surface of the substrate, and wherein the fourth width is greater than the third width.

11. The semiconductor memory device of claim 1, further comprising:

a pad separation pattern between the bit line and the substrate, wherein the pad separation pattern partially overlaps an upper surface of the node pad.

12. The semiconductor memory device of claim 1, wherein the bit line spacer extends downward further than a bottom surface of the node pad, relative to a bottom surface of the substrate.

13. A semiconductor memory device comprising:

a substrate;

a plurality of active regions in a cell isolation layer, wherein the plurality of active regions extends in a first direction, and wherein the plurality of active regions each includes a first region and a second region at opposite sides of the first region;

a bit line that extends on the substrate in a second direction that intersects with the first direction, wherein the bit line intersects the plurality of active regions;

a node pad spaced apart from the bit line in a third direction on the substrate and electrically connected to the second region of the active region, wherein the third direction intersects with the first direction and the second direction; and a storage contact on the node pad and spaced apart from the bit line in the third direction, wherein the storage contact comprises:

a first side surface extending in a fourth direction that intersects with the first direction, the second direction, and the third direction, wherein the second direction, the third direction, and the fourth direction perpendicularly intersect each other, and wherein the first direction intersects the third direction at an angle less than 90 degrees, an inclined surface below the first side surface, relative to a bottom surface of the substrate, wherein the inclined surface is bent or curved from the first side surface, and a second side surface below the inclined surface, relative to the bottom surface of the substrate, wherein the second side surface is bent or curved from the inclined surface, and wherein the first side surface and the second side surface do not overlap each other.

14. The semiconductor memory device of claim 13, further comprising:

a bit line contact between the substrate and the bit line, wherein the bit line contact is electrically connected to the first region; and a bit line spacer between a side surface of the bit line and the storage contact, and between a side surface of the bit line contact and the storage contact, wherein the bit line spacer extends along the first side surface, the inclined surface, and the second side surface.

15. The semiconductor memory device of claim 13, wherein a first distance in the third direction between the first side surface and a side surface of the bit line is less than a second distance in the third direction between the second side surface and the side surface of the bit line.

16. The semiconductor memory device of claim 13, wherein the storage contact includes a first part having the first side surface, wherein the first part has a first width in a third direction,
wherein the storage contact includes a second part having the second side surface below the first part, and wherein the second part has a second width that is greater than the first width.

17. The semiconductor memory device of claim 16, wherein the storage contact includes a passivation layer that extends along the first side surface and does not extend along the second side surface.

18. The semiconductor memory device of claim 13, wherein each of the storage contact and the node pad includes a metal material.

19. The semiconductor memory device of claim 13, wherein a bottom surface of the storage contact is linear in a cross-sectional view taken along the second direction.

20. A semiconductor memory device comprising:
a substrate which includes a plurality of active regions in a cell isolation layer and extending in a first direction, wherein the plurality of active regions each includes a first region and a second region at opposite sides of the first region;
a bit line that extends on the substrate in a second direction that intersects with the first direction, wherein the bit line intersects the plurality of active regions;
a bit line contact between the substrate and the bit line, wherein the bit line contact is electrically connected to the first region of the active regions;
bit line spacers comprising a bit line spacer that is on a side surface of the bit line and a side surface of the bit line contact;
a node pad on a lateral side of the bit line spacer on the substrate, wherein the node pad is electrically connected to the second region of the active region;
storage contacts comprising a storage contact, wherein the storage contact is on the node pad and on a side surface of the bit line spacer, electrically connected to the node pad; and
a fence pattern between the storage contacts in the second direction and between the bit line spacers in a third direction that intersects with the first direction and the second direction,
wherein the storage contact comprises:
a first side surface that extends in a fourth direction that intersects with the first direction, the second direction, and the third direction, wherein the second direction, the third direction, and the fourth direction perpendicularly intersect each other, and wherein the first direction intersects the third direction at an angle less than 90 degrees,
an inclined surface below the first side surface, relative to a bottom surface of the substrate, wherein the inclined surface is bent or curved from the first side surface, and
a second side surface below the inclined surface, relative to the bottom surface of the substrate, wherein the second side surface is bent or curved from the inclined surface,
wherein the first side surface and the second side surface do not overlap each other,
wherein each of the storage contact and the node pad includes a metal material, and
wherein a bottom surface of the storage contact is linear and a bottom surface of the fence pattern is rounded in a cross-sectional view taken along the second direction.

* * * * *